United States Patent [19]

Suma

[11] Patent Number: 5,793,685
[45] Date of Patent: Aug. 11, 1998

[54] SEMICONDUCTOR MEMORY DEVICE CAPABLE OF SIMULTANEOUSLY DESIGNATING MULTIBIT TEST MODE AND SPECIAL TEST MODE

[75] Inventor: Katsuhiro Suma, Hyogo, Japan

[73] Assignee: Mitsubishi Denki Kabushiki Kaisha, Tokyo, Japan

[21] Appl. No.: 594,541

[22] Filed: Jan. 31, 1996

[30] Foreign Application Priority Data

Apr. 26, 1995 [JP] Japan ................................. 7-102118

[51] Int. Cl.$^6$ ...................................................... G11C 7/00
[52] U.S. Cl. ...................................... 365/201; 365/193
[58] Field of Search ................................. 365/201, 191, 365/193

[56] References Cited

U.S. PATENT DOCUMENTS

| | | | |
|---|---|---|---|
| 4,975,641 | 12/1990 | Tanaka et al. | 324/158 |
| 5,228,000 | 7/1993 | Yamagata | 365/201 |
| 5,267,206 | 11/1993 | Koyabu | 365/201 |
| 5,293,341 | 3/1994 | Tsujimoto | 365/201 |
| 5,519,659 | 5/1996 | Tanida et al. | 365/201 |
| 5,528,162 | 6/1996 | Sato | 324/765 |
| 5,537,351 | 7/1996 | Suwa et al. | 365/189.02 |

FOREIGN PATENT DOCUMENTS

| | | |
|---|---|---|
| 5-242698 | 9/1993 | Japan . |
| 6-194424 | 7/1994 | Japan . |
| 6-222948 | 8/1994 | Japan . |

OTHER PUBLICATIONS

Masaki Kumanoya et al, A 90ns 1Mb DRAM with Multi–Bit Test Mode, IEEE International Solid–State Circuits Conference, Feb. 15, 1985, pp. 240–241.

Dieter Kantz et al, A 256K DRAM with Descrambled Redundancy Test Capability, IEEE International Solid–State Circuits Conference, Feb 24, 1984, pp. 272–273.

Joseph Neal et al, A 1Mb CMOS DRAM with Design–for–Test Functions, IEEE International Solid–State Circuits Conference, Feb. 21, 1986, pp. 264–265.

German Office Action dated Apr. 18, 1997 and English translation thereof.

Primary Examiner—David C. Nelms
Assistant Examiner—Michael T. Tran
Attorney, Agent, or Firm—McDermott, Will & Emery

[57] ABSTRACT

The semiconductor device includes a state detection circuit receiving control signals address signals and row address signals for outputting timing detection signals and test group detection signals, and a test mode setting signal generating circuit receiving row address signals, timing detection signals and test group detection signals for outputting multibit test mode setting signal and test mode setting signals accordingly. The semiconductor device allows setting of standardized multibit test mode singly, and also allows simultaneous setting of the multibit test mode and a special test mode not standardized by the Joint Electron Device Engineering Council, so that the standard is satisfied and the time for special tests not standardized can be reduced.

20 Claims, 28 Drawing Sheets

FIG.7

| A0 | A1 | A2 | A3 | A4 | A5 | A6 | TEST MODE |
|---|---|---|---|---|---|---|---|
| * | * | * | * | * | * | * | TE (JEDEC STANDARD) |
| S | H | L | L | L | L | H | TE |
| (/TGA=L) (/TGB=H) | | | | L | H | L | TEST5 |
| | | | | | | H | TEST5,TE |
| | | | | H | L | L | TEST7 |
| | | | | | | H | TEST7,TE |
| | | | | H | H | H | TE |
| | | L | H | L | L | L | TEST4 |
| | | | | | | H | TEST4,TE |
| | | | | L | H | L | TEST4,TEST5 |
| | | | | | | H | TEST4,TEST5,TE |
| | | | | H | L | L | TEST4,TEST7 |
| | | | | | | H | TEST4,TEST7,TE |
| | | | | H | H | L | TEST4 |
| | | | | | | H | TEST4,TE |
| | | H | L | L | L | L | TEST3 |
| | | | | | | H | TEST3,TE |
| | | | | L | H | L | TEST3,TEST5 |
| | | | | | | H | TEST3,TEST5,TE |
| | | | | H | L | L | TEST3,TEST7 |
| | | | | | | H | TEST3,TEST7,TE |
| | | | | H | H | L | TEST3 |
| | | | | | | H | TEST3,TE |
| | | H | H | L | L | L | TEST6N,TEST6S |
| | | | | | | H | TEST6N,TEST6S,TE |
| | | | | L | H | L | TEST6N,TEST6S,TEST5 |
| | | | | | | H | TEST6N,TEST6S,TEST5,TE |
| | | | | H | L | L | TEST6N,TEST6S,TEST7 |
| | | | | | | H | TEST6N,TEST6S,TEST7,TE |
| | | | | H | H | L | TEST6N,TEST6S |
| | | | | | | H | TEST6N,TEST6S,TE |
| H | S | L | L | * | * | H | TE |
| | | L | H | * | * | L | TEST2 |
| | | | | | | H | TEST2,TE |
| (/TGA=H) (/TGB=L) | | H | L | * | * | L | TEST1 |
| | | | | | | H | TEST1,TE |
| | | H | H | * | * | L | TEST1,TEST2 |
| | | | | | | H | TEST1,TEST2,TE |

FIG.24

| AKD1 | AKD2 | AKD3 | AKD4 | AKD6 | AKD7 | TEN0 | TEN1 | TEN2 | TEST MODE |
|------|------|------|------|------|------|------|------|------|-----------|
| L | L | L | L | L | L | L | L | L | —— |
| H | H | L | L | L | L | L | L | H | TEST1,TEST2 |
| L | H | L | L | L | L | L | H | L | TEST2 |
| L | L | L | H | L | L | L | H | H | TEST4 |
| H | L | L | L | L | L | H | L | L | TEST1 |
| L | L | H | L | L | L | H | L | H | TEST3 |
| L | L | L | L | L | H | H | H | L | TEST7 |
| L | L | L | L | H | L | H | H | H | TEST6N,TEST6S |

SEMICONDUCTOR MEMORY DEVICE CAPABLE OF SIMULTANEOUSLY DESIGNATING MULTIBIT TEST MODE AND SPECIAL TEST MODE

BACKGROUND OF THE INVENTION

1. Field of the Invention

The present invention relates to a semiconductor device and, more specifically, to a semiconductor device having a test mode for performing a prescribed test.

2. Description of the Background Art

Currently, various semiconductor devices such as microcomputers, memories and gate arrays are incorporated in various electric products such as personal computers and work stations. Most of the semiconductor devices are formed by using MOS (Metal Oxide Silicon) transistor, which is suitable for higher degree of integration and lower power consumption. A DRAM (Dynamic Random Access Memory) is one of such memories that include the MOS transistors and are recently developed to have large storage capacity, which is used as a main memory of a personal computer or a work station. Lower cost and higher performance are required for the DRAM. However, various performance tests necessary for providing high performance and highly reliable products have come to be so complicated that the time necessary for testing becomes too long, resulting in increase in product cost.

In order to solve this problem, a testability function has long been incorporated in the step of designing so as to facilitate testing in microcomputers and logic devices such as a gate array. The testability design becomes necessary also in the field of semiconductor memories to solve the problem. As one approach for reducing test time in the DRAM, JEDEC (Joint Electron Device Engineering Council) standardized a mode in which data is compressed to reduce the number of times of accesses and to reduce test time. More specifically, to a plurality of memory cells which must be accessed over plural times in a normal mode, same data is written by only one access in the test mode. The data written to the plurality of memory cells are read within the chip memory device, and a signal indicating whether the data match with each other is output by one access. This test mode is referred to as a multibit test mode, which is standardized by JEDEC. DRAMs having special modes not standardized by the JEDEC have also been proposed, including the special test mode disclosed in Japanese Patent Laying-Open No. 6-194424 in which internal potential is monitored, the test mode disclosed in Japanese Patent Laying-Open No. 5-242698 in which number of inverters in a delay chain including a plurality of inverters is reduced and a certain access path is short-circuited to realize, at a room temperature, a state experienced at a high temperature, and a test mode in which defects are accelerated by changing substrate bias.

FIG. 29 is a schematic diagram showing a conventional test mode setting circuit supported in the DRAM disclosed in Japanese Patent Laying-Open No. 5-242698. In the test mode setting circuit, by a combination of a WCBR (/WE, /CAS before /RAS) timing in which write enable signal /WE and column address strobe signal /CAS fall to an L level first and row address strobe signal /RAS falls to an L level thereafter and a super voltage input which is a potential still higher than the power supply potential to a specific input pin, the output at a gate NAND attains an L level. Based on address signals A1 and A2 (and outputs from inverters IV1 and IV2), one of NOR gates NO10, NO11, NO12, and NO13 provides an H level output. Flipflop circuits 5, 6, 7 and 8 are formed by NOR gates NO2 to NO9, receive outputs B-E from NOR gates NO10, NO11, NO12 and NO13, respectively. Except when the reset signal RST is at the H level and the super voltage is not applied to the specific input pin, that is, when the output of NOR 1 is at the L level, a flipflop circuit receiving one of the outputs from NOR gates NO10, NO11, NO12 and NO13 which is at the H level sets the corresponding test mode setting signal OPT1, OPT2, OPT3 and OPT4 to the H level and holds the same (even when the output from the corresponding one of NOR gate NO10, NO11, NO12 and NO13 attains to the L level thereafter, it continuously outputs H level). When the reset signal RST is at the H level and the supervoltage is not applied to the specific input pin, that is, when the output from NOR gate NO1 is at the H level, test mode setting signals OPT1, OPT2, OPT3 and OPT4 are reset to the L level.

As described above, in the conventional test mode setting circuit, when the signals OPT1, OPT2, OPT3 and OPT4 once attain to the H level, the H level is kept and not reset to the L level until the reset signal RST is set to the H level and application of the supervoltage to the specific input pin is stopped. Therefore, a plurality of test modes can be activated simultaneously by setting a plurality of test mode setting signals OPT1, OPT2, OPT3 and OPT4 by changing the address signals A1 and A2.

Further, a semiconductor integrated circuit intending sure setting of special test mode is disclosed in Japanese Patent Laying-Open No. 6-222948.

The conventional test mode setting circuit shown in FIG. 29 is not adapted to perform multibit test only by the WCBR timing which is standardized by JEDEC. It is not adapted to simultaneously activate the multibit test mode and a special test mode, either. Therefore, the time for testing cannot be reduced by utilizing the multibit test mode.

Further, it is necessary to extend lines to various internal circuits, not shown, which are set to the test mode upon reception of the test mode setting signals OPT1, OPT2, OPT3 and OPT4, in order to transmit the test mode setting signals OPT1, OPT2, OPT3 and OPT4 thereto. Therefore, the number of test modes is limited by the area in which the lines are extended, and for example, only four test modes can be realized when the area can accommodate only four lines.

Further, in a region in which a power supply line to which power supply potential is applied and a ground potential line to which the ground potential is applied are provided as shield lines adjacent to a signal line to prevent noise to the signal line, considerably wide area is occupied by these lines, and it is difficult to extend lines for transmitting the test mode setting signals.

SUMMARY OF THE INVENTION

An object of the present invention is to provide a semiconductor device in which multibit test mode can be set while a special test mode is being set.

Another object of the present invention is to reduce the number of lines for transmitting test mode setting signals to be smaller than the number of test modes.

A further object of the present invention is to realize shielding of signal lines even if power supply lines are not provided as shield lines.

The semiconductor device in accordance with the present invention relates to a state detecting circuit receiving a first input signal and outputting a state detection signal corresponding to the state of the first input signal; and a test mode setting signal generating circuit receiving the state detection signal for outputting a first test mode setting signal, which is activated when the state detection signal indicates that the first input signal is at a first state, for setting the multibit test mode, and a second test mode setting signal which is activated in response to a second input signal when the state detection signal indicates that the first input signal is at a second state different from the first state, and for setting the first and the second test mode setting signals both to an active level when the state detection signal indicates that the first input signal is at the second state and the second input signal is at a third state.

Preferably, the test mode setting signal is encoded, transmitted in a form in which a plurality of test mode designating information are compressed, and then decoded.

The test mode setting signal transmitting line is arranged extending parallel to and adjacent to a signal line to be shielded.

In accordance with the state of the first input signal, a plurality of test modes can be simultaneously designated, and tests can be performed at high speed.

Further, since the test mode setting signal is transmitted as an encoded signal, designation of a plurality of test modes can be performed by smaller number of signals, and hence the area occupied by the signal lines can be reduced.

Further, when a certain operation mode is designated, voltage level of the test signal transmitting line is fixed (no matter whether it is a test mode or a normal mode), and hence it functions as shield line, similar to the power supply line (including ground line). Therefore, a desired signal line can be shielded even at a region where the power supply line is not provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows relation between test mode and an address key of the DRAM in accordance with the first embodiment of the present invention.

FIG. 24 shows a relation between a test mode and a test mode encoded signal of the DRAM in accordance with the second embodiment of the present invention.

DESCRIPTION OF THE PREFERRED EMBODIMENTS

First Embodiment

Figure 1:
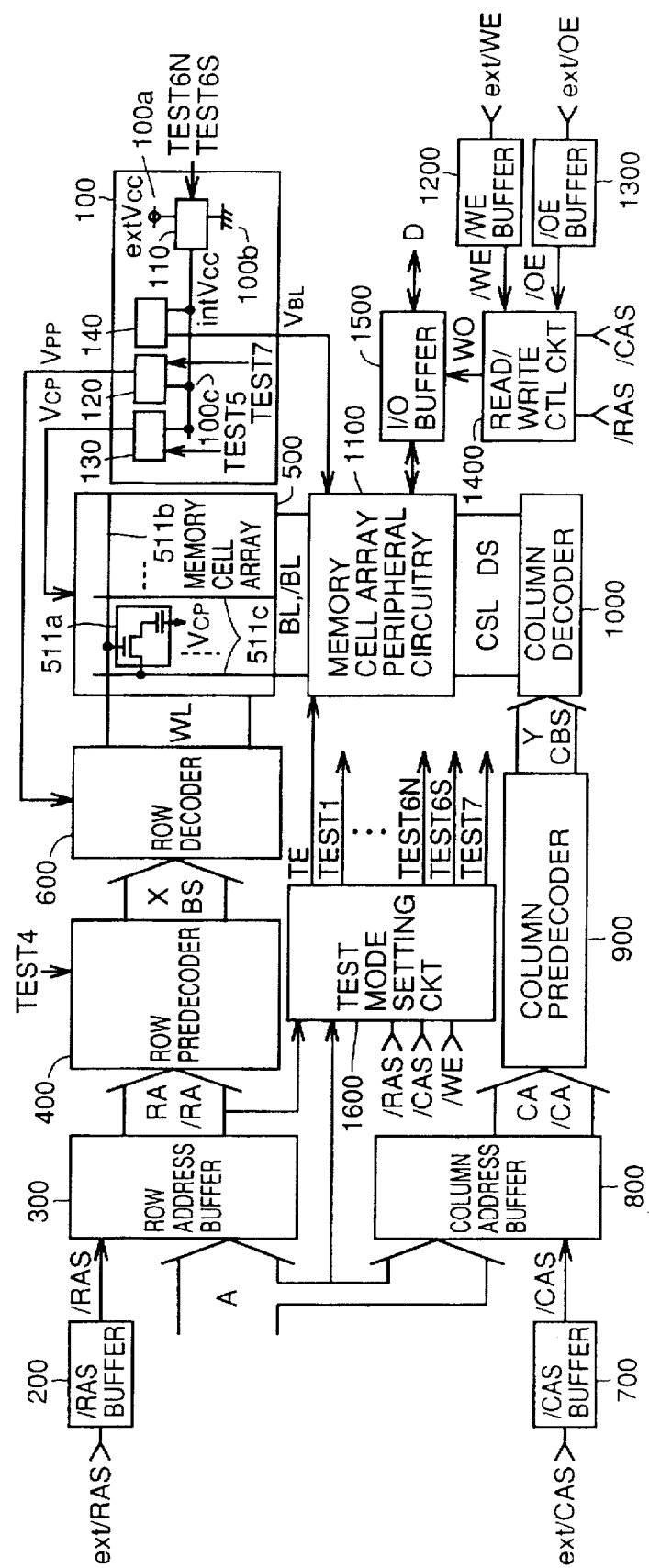
FIG. 1 is a block diagram of a DRAM in accordance with a first embodiment of the present invention.

A DRAM in accordance with a first embodiment of the present invention will be described with reference to FIGS. 1 to 13. FIG. 1 is a schematic block diagram showing the DRAM. In the FIG. 1, internal power supply potential generating circuitry 100 includes an internal power supply potential generating circuit 110 receiving an external power supply potential extVcc from a power supply potential node 100a to which the external power supply potential extVcc is applied, for supplying an internal power supply potential intVcc lower than the external power supply potential extVcc at a power supply potential node 200c; a boosted potential generating circuit 120 operating upon reception of internal power supply potential intVcc and outputting a boosted potential Vpp which is higher than the internal power supply potential intVcc; a cell plate potential generating circuit 130 receiving the internal power supply potential intVcc for outputting a cell plate potential Vcp which is at (½)intVcc; and a bit line precharging potential generating circuit 140 receiving the internal power supply potential intVcc for outputting a bit line precharge potential $V_{BL}$ which is at (½)intVcc.

An /RAS buffer 200 receives an externally applied external row address strobe signal ext/RAS and outputs a row address strobe signal /RAS for internal circuitry. Row address buffer 300 receives an address signal Ai (i=0,1, . . . ,10) and the row address strobe signal /RAS from /RAS buffer 200, latches the address signal Ai as a row address signal when the row address strobe signal /RAS changes from the H level to the L level, and outputs a row address signal RAi (having the same logic as address signal Ai) and /RAi (having an opposite logic to address signal Ai) for the internal circuitry. A row predecoder 400 receives row address signals RAi, /RAi from row address buffer 300, and outputs row predecoded signals $X_0$ to $X_3$ one of which attains to the H level in accordance with address signals $RA_0$, /$RA_0$, $RA_1$, /$RA_1$, row predecoded signals $X_4$ to $X_7$, one of which attains to the H level in accordance with address signals $RA_2$, /$RA_2$, $RA_3$, /$RA_3$, row predecoded signals $X_8$ to $X_{11}$ one of which attains to the H level in accordance with address signals $RA_4$, /$RA_4$, $RA_5$, /$RA_5$, row predecoded signals $X_{12}$ to $X_{15}$ one of which attains to the H level in accordance with address signals $RA_6$, /$RA_6$, $RA_7$, /$RA_7$, and sixty four block selection signals BSj (j=0,1, . . . 63) among which selected eight signals attain to the H level based on address signals $RA_8$, /$RA_8$ to $RA_{10}$, /$RA_{10}$.

A memory cell array 500 includes four memory mats each having 4×2²⁰ memory cells 511a arranged in rows and columns. Each memory mat is divided into sixteen memory blocks each having 256×10¹⁰ memory cells 511a. Each memory cell block includes 256 word lines 511b arranged in a plurality of rows each connected to 2¹⁰ memory cells arranged in the corresponding row, and 2¹⁰ bit line pairs 511c arranged in a plurality of columns each connected to 256 memory cells arranged in the corresponding column.

Each memory cell block is divided into eight column blocks each having 128 bit line pairs.

A row decoder 600 for selecting a row of memory cells is divided into 64 row decoder blocks corresponding to 64 memory cell blocks. Each row decoder block receives row predecoded signals $X_0$ to $X_{15}$ from row predecoder 400 and the block selection signal BSj corresponding to the row decoder block, and sets one word line corresponding to row predecode signals $X_0$ to $X_{15}$ out of 256 word lines included in the selected row decoder block to the boosted potential level Vpp.

A /CAS buffer 700 receives an externally applied external column address strobe signal ext/CAS and outputs a column address strobe signal /CAS for the internal circuitry. A column address buffer 800 receives an address signal Ai (i=0,1 . . . ,10) and column address strobe signal /CAS from /CAS buffer 700, latches the address signal Ai as a column address signal when the column address strobe signal /CAS changes from the H level to the L level, and outputs column address signals CAi (having the same logic as address signal Ai) and /CAi (having opposite logic to address signal Ai) for the internal circuitry.

A column predecoder 900 receives column address signals CAi, /CAi from column address buffer 800, and outputs column predecoded signals $Y_0$ to $Y_3$ one of which attains to the H level in response to $CA_0$, /$CA_0$, $CA_1$, /$CA_1$, column predecoded signals $Y_4$ to $Y_7$ one of which attains to the H level in accordance with $CA_2$, /$CA_2$, $CA_3$, /$CA_3$, column predecoded signals $Y_8$ to $Y_{11}$ one of which attains to the H level in accordance with $CA_4$, /$CA_4$, $CA_5$, /$CA_5$ and column block selection signals CBSk (k=0,1, . . . ,31) selected one of which attains to the H level based on $CA_6$, /$CA_6$ to $CA_{10}$, /$CA_{10}$.

A column decoder 1000 has 32 column decoder blocks provided each common to sixteen memory blocks included in the common memory mat and divided corresponding to column blocks each having 128 bit line pairs, receives column predecoded signals $Y_0$ to $Y_{11}$ and the column block selection signal CBSk from column predecoder 900, and outputs a column selection signal CSL and a data selection signal DS. One of 64 column selection signals CSLm (m=0–63) attains to the H level in accordance with the column predecode signals $Y_0$ to $Y_{11}$. Based on the column selection signal CSLm, two pairs of bit lines are selected in each memory cell block. In eight memory cell blocks selected by the block selection signal BSj, a column block is selected in accordance with a column block selection signal CBSk. In the selected column block, two pairs of bit lines are selected in accordance with the column selection signal CSLn, a total of 128 pairs of bit lines are selected, and of 128 bits of data read from the selected bit line pairs, four bits are selected in accordance with a data selection signal DSn (n=0,1 . . . 127).

Memory cell array peripheral circuitry 1100 includes sense amplifiers divided into 68 sense amplifier blocks each including 512 sense amplifiers and corresponding to the memory cell blocks. Of 68 sense amplifier blocks, 60 sense amplifier blocks are provided between two memory cell blocks and shared by adjacent two memory cell blocks. One memory cell block provided between two sense amplifier blocks correspond to these two sense amplifier blocks. The peripheral circuitry 1100 further includes circuits such as I/O circuit including local I/O lines and global I/O lines for outputting data transmitted on the bit lines from the memory cell and for transmitting data to be written to the memory cells to the bit lines.

A /WE buffer 1200 receives an externally applied external write enable signal ext/WE and outputs a write enable signal /WE for the internal circuitry. An /OE buffer 1300 receives an externally applied external output enable signal ext/OE, and outputs an output enable signal /OE for the internal circuitry. A write/read control circuit 1400 receives row address strobe signal /RAS, column address strobe signal /CAS, write enable signal /WE and output enable signal /OE, and outputs a write/read control signal WO indicating writing or reading of data. An input/output buffer 1500 receives the write/read control signal WO from read/write control circuit 1400, applies data in accordance with four bits of externally applied data Dr (r=0,1,2,3) to the I/O circuit in the memory cell array peripheral circuitry 1100 when the signal WO indicates data writing, and externally outputs data Dr in accordance with the data output from I/O circuit of memory cell array peripheral circuitry 1100 when the signal WO indicates data reading.

A test mode setting circuit 1600 receives row address strobe signal /RAS, column address strobe signal /CAS, write enable signal /WE, address signals $A_0$, $A_1$ and row address signals /RA$_0$, . . . , /RA$_6$, and outputs test mode setting signals TE, TEST1, TEST2, TEST3, TEST4, TEST5, TEST6N, TEST6S and TEST7 in accordance with the received signals.

Normal reading operation of the DRAM shown in FIG. 1 will be described with reference to FIG. 2. First, in reading operation, external write enable signal ext/WE is set to the H level and the external output enable signal ext/OE is set to the L level. Therefore, the write enable signal /WE and the output enable signal /OE output from /WE buffer 1200 and /OE buffer 1300 are also set to the H level and the L level, respectively. Before the time point $t_0$ when row address strobe signals /RAS falls to the L level as shown in FIG. 2(a), the potential WLp of all the word lines 511b are set to the L level as shown in (d) of FIG. 2, the potentials BLq, /BLq of all the bit line pairs 511c are precharged to the bit line precharge potential $V_{BL}$ as shown in (e) of FIG. 2, all the column selection signals CSLm are set to the L level as shown in (f) of FIG. 2, and the output data Dr is at a high impedance (Hi-Z) state, as shown in (g) of FIG. 2.

Figure 2:
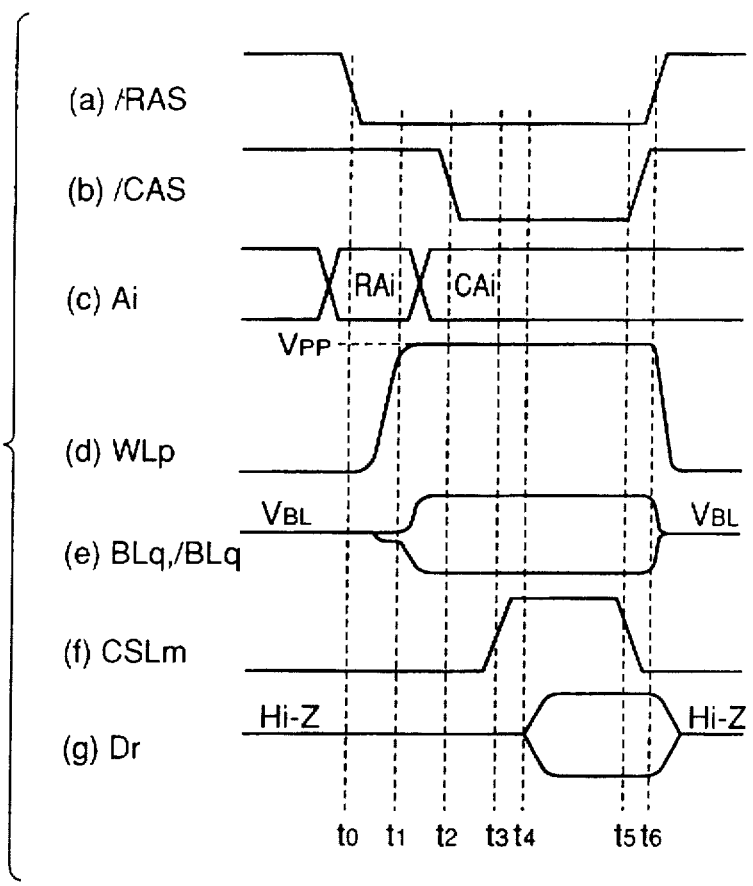
FIG. 2 is a timing chart showing the operation of the DRAM in accordance with the first embodiment of the present invention.

When the address signal Ai is set to the row address as shown in (c) of FIG. 2 and the row address strobe signal /RAS falls to the L level at time to as shown in (a) of FIG. 2, row address buffer 300 responsively latches the address signal Ai as row address signal RAi and applies, together with a row address signal /RAi having inverted logic, to row predecoder 400. Row predecoder 400 applies row predecoded signals $X_0$, . . . , $X_{15}$ and block selection signal BSj in accordance with the row address signals RAi and /RAi to row decoder 600. Row decoder 600 raises one corresponding to the row predecoded signal $X_0$, . . . , $X_{15}$ of the word lines included in the row decoder block selected by block selection signal BSj to the level of the boosted potential Vpp at time $t_1$, as shown in (d) of FIG. 2.

Charges are transported between a capacitor of a memory cell 511a connected to the selected word line and a corresponding bit line. When data of the L level has been stored in the memory cell capacitor, the potential of the bit line slightly lowers from the bit line precharge potential $V_{BL}$ as shown in (e) of FIG. 2. Though not shown, when the data of the H level has been stored, the potential of the bit line slightly increases from the bit line precharge potential $V_{BL}$. By this transportation of charges, a small potential difference is generated between the corresponding bit line and the other bit line which is maintained at the bit line precharge potential $V_{BL}$, that is, between the pair of bit lines. A sense amplifier in the memory cell array peripheral circuitry 1100 senses and amplifies the small potential difference generated in the bit line pair, and sets the potential level of the bit line which is lower to the L level and the potential of the bit line which is higher to the H level, as shown in (e) of FIG. 2.

When the address signal Ai is set to the column address as shown in (c) of FIG. 2 and column address strobe signal /CAS falls to the L level at time $t_2$ as shown in FIG. 2(b), column address buffer 800 latches the address signal Ai as column address signal CAi and applies it as well as a column address signal /CAi having the inverted logic to column predecoder 900. Column predecoder 900 applies column predecoded signals $Y_0$, . . . , $Y_{11}$ and a column block selection signal CBSk in accordance with the column address signals CAi, /CAi to column decoder 1000. Column decoder 1000 raises one of the corresponding column selection signals CSLn corresponding to the column predecoded signals $Y_0$, . . . , $Y_{11}$ to the H level at time $t_3$, as shown in (f) of FIG. 2.

In each column block of eight memory cell blocks (2 blocks per one mat) selected by the block selection signal BSj, two pairs of bit lines are selected in accordance with the column selection signal CSLm, and 128 bits of data read from a total of 128 pairs of bit lines are output to the I/O circuit, not shown, in the memory cell array peripheral circuitry 1100. The I/O circuit applies four bits corresponding to the data selection signal DSn of 128 bits of data to input/output buffer 1500, and input/output buffer 1500 outputs data Dr corresponding to the four bits of data at time $t_4$, as shown in (j) of FIG. 2.

Figure 3A:
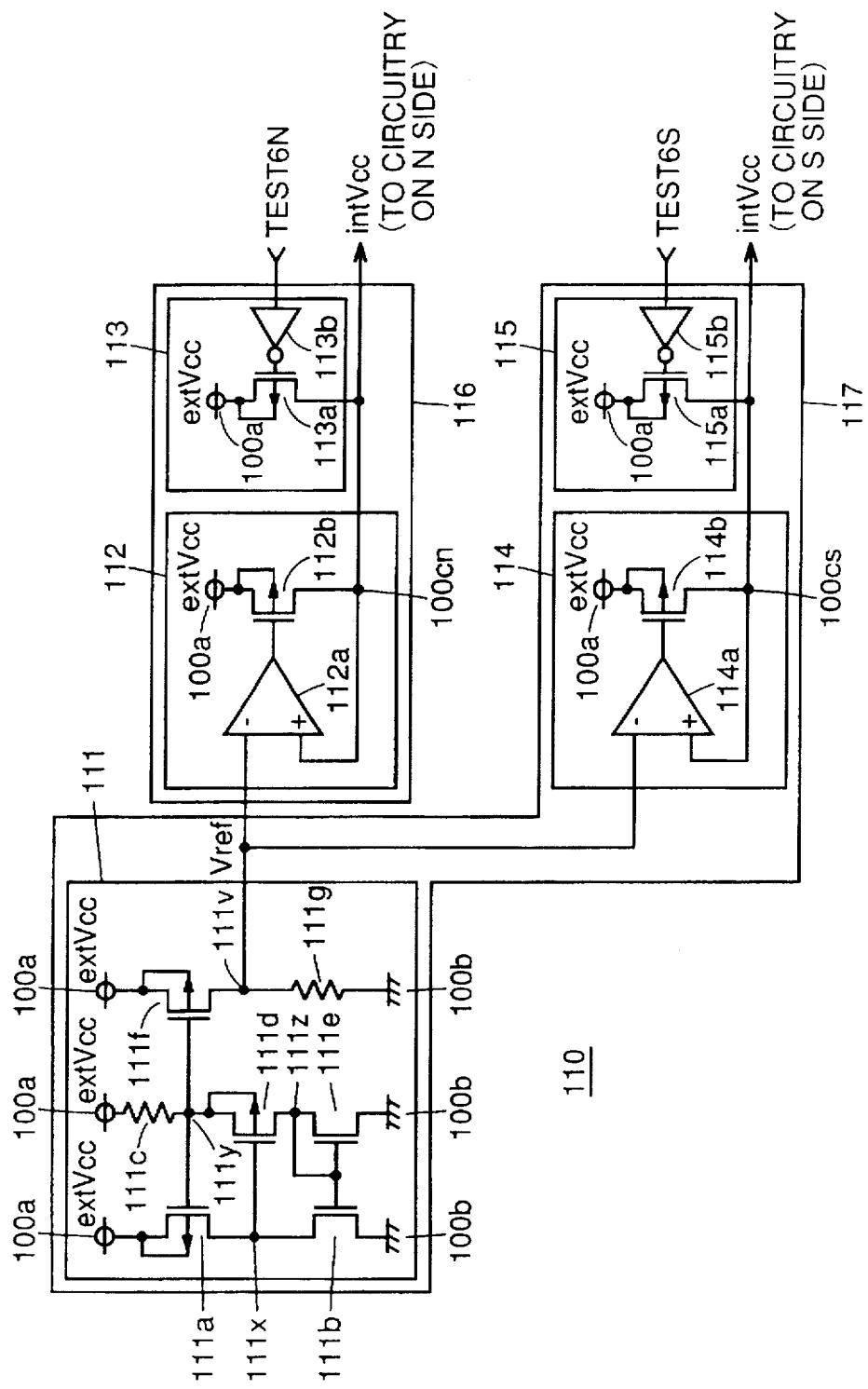
FIG. 3A is a schematic diagram of an internal power supply potential generating circuit of the DRAM in accordance with the first embodiment of the present invention.

FIG. 3A is a schematic diagram showing the internal power supply potential generating circuit 110. Referring to FIG. 3A, a reference potential generating circuit 111 receives an external power supply potential extVcc, and outputs a reference potential Vref which is not dependent on the external power supply potential extVcc. The reference potential generating circuit 111 includes a p channel MOS transistor 111a, an n channel MOS transistor 111b, a resistance element 111c, a p channel MOS transistor 111d, an n channel MOS transistor 111e, a p channel MOS transistor 111f and a resistance element 111g.

The MOS transistor 111a has its source connected to an external power supply terminal 100a, a drain connected to an internal node 111x and a gate connected to an internal node 111y, and has a relatively large current drivability. MOS transistor 111b has a drain connected to internal node 111x, a source connected to a ground node 110b and a gate connected to an internal node 111z. Resistance element 111c is connected between external power supply node 100a and internal node 111y. MOS transistor 111d has a source connected to internal node 111y, a gate connected to internal node 111x and a drain connected to internal node 111z. MOS transistor 111e has gate and drain connected to internal node 111z and a source connected to ground node 1100b. MOS transistor 111f has a source connected to external power supply node 110a, a gate connected to internal node 111y, and a drain connected to internal node 111b. Resistance element 111g is connected between internal node 111b and ground node 110b. The reference potential Vref is output from internal node 111b. MOS transistors 111b and 111e constitute a current mirror circuit. MOS transistor 111d adjusts the potential at internal node 111y, that is, the amount of current flowing through resistance element 111c, in accordance with the potential on internal node 111x.

When stabilized, the source-gate voltage of MOS transistor 111a becomes equal to the absolute value |Vthp| of the threshold voltage of MOS transistor 111a, and a current of R/|Vthp| flows through resistance element 111c. This current does not depend on the external power supply potential extVcc. A current Ic corresponding to this current flows through MOS transistor 111f, and a constant potential (relative to the ground potential) Vref=Ic·R(111g), which is not dependent on the external power supply voltage, is generated at internal node 111b.

A regulator 112 operates receiving extVcc. It receives the reference potential Vref from reference potential generating circuit 111, and supplies an internal power supply potential intVcc which is lower than the external power supply potential extVcc and is based on reference potential Vref to internal power supply potential node 100cn.

Regulator 112 is arranged at one side (hereinafter referred to as N (North) side) in the direction of the longer side of the semiconductor chip. It has a differential amplifying circuit 112a and a p channel MOS transistor 111b, and supplies the internal power supply potential intVcc to circuits positioned on the N side. A stress mode circuit 113 is connected between external power supply potential node 100a and internal power supply potential node 100cn, receives test mode setting signal TEST6N, short-circuits the external power supply potential node 100a and internal power supply potential node 100cn when the test mode setting signal TEST6N attains to the H level to increase the internal power supply potential intVcc, so as to apply stress to the circuit driven by the internal power supply potential intVcc. Stress mode circuit 113 includes an inverter 113b receiving the signal TEST6N, and a p channel MOS transistor 113a connected between external power supply terminal 100a and internal power supply line 113an and receiving an output signal from inverter 113b at its gate. Regulator 112 has a similar structure as a well known internal voltage lowering circuit (voltage down-converter).

Another regulator 114 operates receiving extVcc. It receives the reference potential Vref from reference potential generating circuit 111 and supplies an internal power supply potential intVcc which is lower than external power supply potential extVcc and corresponds to reference potential Vref to internal power supply potential node 100cs.

The regulator 114 is arranged on the other side (hereinafter referred to as S (South) side) in the direction of the longer side of the chip, has a differential amplifying circuit 114a and a p channel MOS transistor 114b, and supplies the internal power supply potential intVcc to the circuit positioned on the S side. A stress mode circuit 115 is connected between external power supply potential node 100a and internal power supply potential node 100cs, receives test mode setting signal TEST6S, and short-circuits the external power supply potential node 100a and internal power supply potential node 100c when the test mode setting signal TEST6S attains to the H level, so as to apply stress to the circuits driven by the internal power supply potential intVcc.

The stress mode circuit 115 includes a p channel MOS transistor 115a for short-circuiting, and an inverter 115b receiving the signal TEST6S to drive the MOS transistor 115a. Internal power supply voltage intVcc is maintained at the reference potential Vref in the normal operation, and is set to the level of the external power supply voltage extVcc level in the stress mode.

Figure 3B:
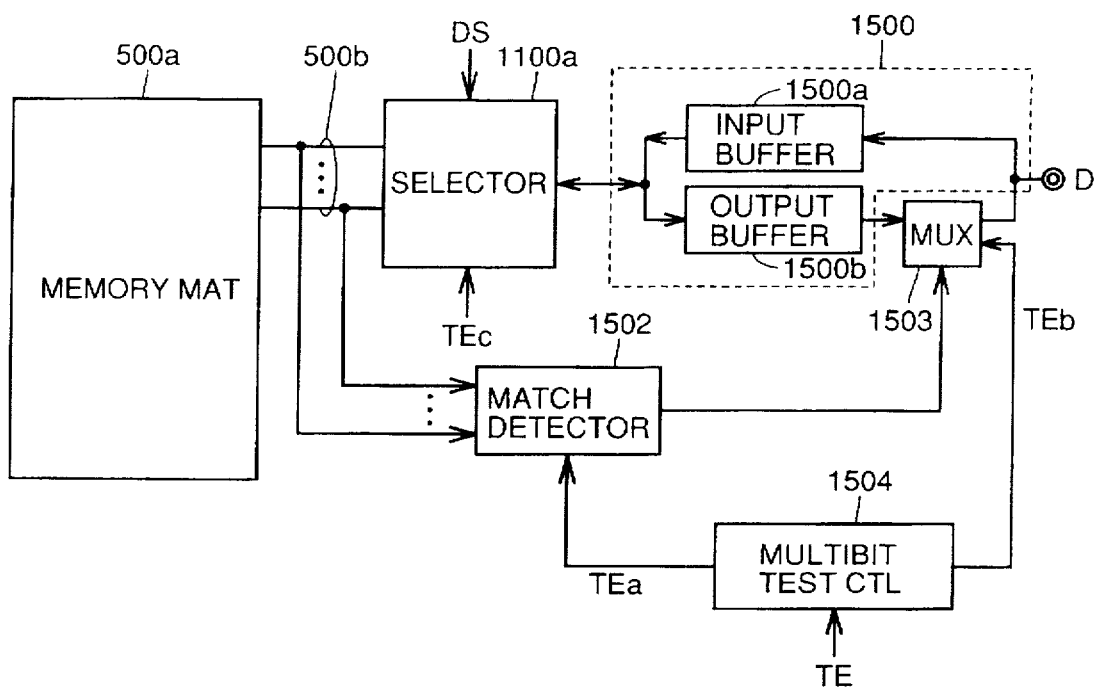
FIG. 3B schematically shows a structure of a portion performing multibit test of the DRAM in accordance with the first embodiment of the present invention.

FIG. 3B shows a circuit portion for performing the multi-bit test. Referring to FIG. 3B, a circuit structure for one memory mat 500a to and from which 1 bit of data is input/output in normal operation mode is shown. Memory mat 500a is connected to a selector 1100a through a 32 bit internal data bus (global I/O bus) 500b. In normal operation mode (except multibit test mode), selector 1100a selects 1 bit of bus line of 32 bit bus 500b in accordance with data selection signal DS from column decoder 1000 (see FIG. 1), and couples the selected bus line to input/output buffer 1500. Input/output buffer 1500 includes an input buffer 1500a which generates internal write data from external write data and applies the same to selector 1100a when activated (at the time of data writing) and an output buffer 1500b for generating external read data from internal read data applied through selector 1100a when activated (at the time of data reading).

The multibit test circuit includes a multibit test controller 1504 which is activated when test signal TE is activated for generating test designating signals TEa, TEb and TEc; a match detector 1502 which is activated in response to test designating signal TEa, for determining match/mismatch of logics of data on the internal data bus 500b; and a multiplexer 1503 responsive to activation of the test mode designating signal TEb for selecting an output from match detector 1502 and outputting the same to data input/output terminal. Multiplexer 1503 selects an output signal from output buffer 1500b when the test designating signal TESTb is inactive. Multiplexer 1503 may be provided between output buffer 1500b and selector 1100a. When test designating signal TEc is activated, selector 1100a neglects data selection signal DS and selects all the bus lines of internal data bus 500b.

In multibit test operation, test data applied from input buffer 1500a is transmitted to all the bus lines of internal data bus 500b by selector 1100a, and test data is written simultaneously to the selected memory cells of memory mat 500a. When data is written to all the memory cells, then memory cell data are read. The data of the simultaneously selected memory cells are applied to match detector 1502 through internal data bus 500b. If the memory cells are all normal, the data have the same logic. Meanwhile, if at least one memory cell is defective, the data have different logics. The result of determination is externally output through multiplexer 1503. Whether a memory cell is defective or not is determined based on the output of determination result. Any structure may be utilized for performing multibit test provided that it satisfies the JEDEC standard.

The output signal from match detector 1502 may be externally output through a dedicated pin terminal. The match detector 1502 may be so structured as to detect matching of all the data of four memory mats.

Figure 4:
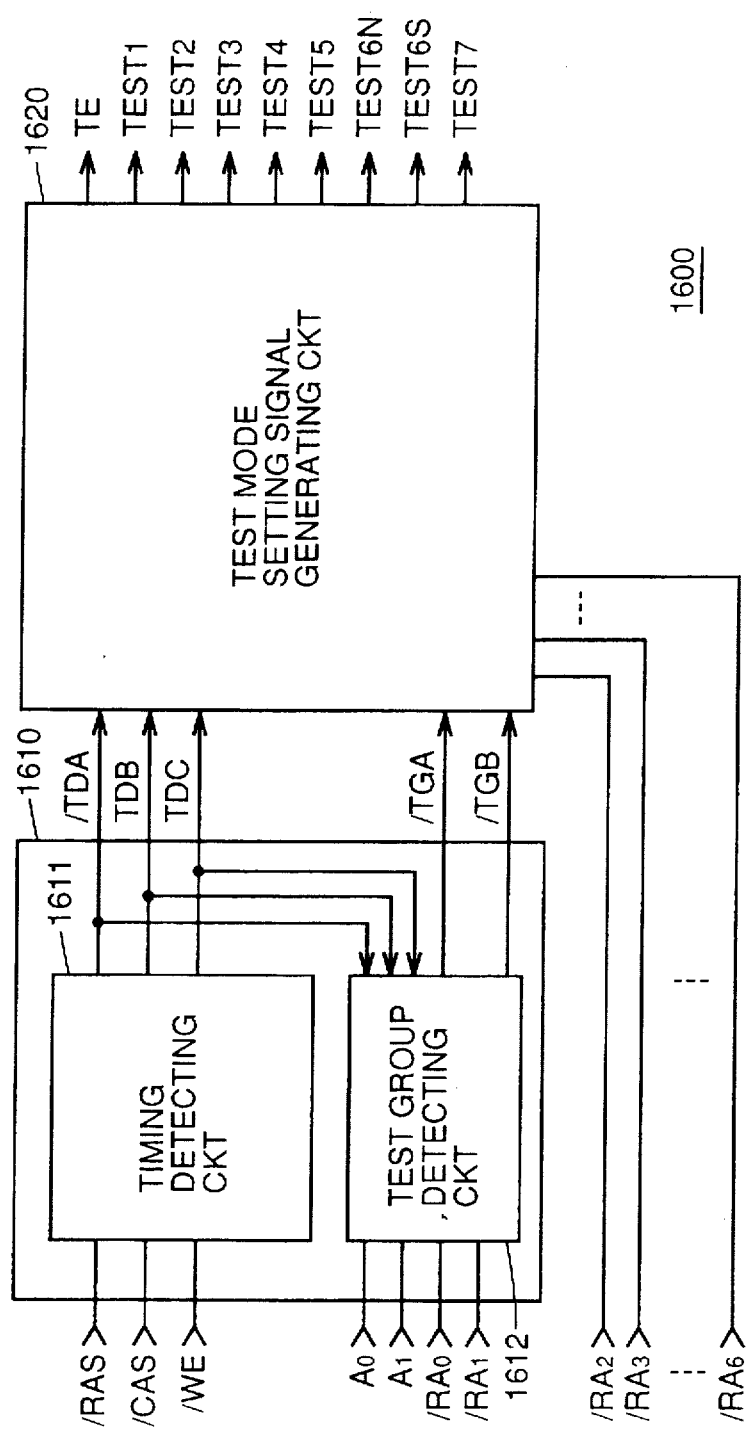
FIG. 4 is a schematic diagram of a test mode setting circuit of the DRAM in accordance with the first embodiment of the present invention.

FIG. 4 is a block diagram schematically showing the structure of the test mode setting circuit 1600. Referring to FIG. 4, a state detecting circuit 1610 receives row address strobe signal /RAS, column address strobe signal /CAS and write enable signal /WE, address signals $A_0$, $A_1$, and row address signals /$RA_0$, /$RA_1$, and outputs timing detection signals /TDA, TDB and TDC and test group detection signals /TGA and /TGD in accordance with combination of the states of the received signals.

The state detecting circuit 1610 includes a timing detection circuit 1611 for outputting state detection signals /TDA, TDB and TDC in accordance with the states of signals /RAS, /CAS and /WE, and a test group detecting circuit 1612 responsive to the signals $A_0$, $A_1$, /$RA_0$, and /$RA_1$ as well as to the state detection signals /TDA, TDB, and TDC for outputting test group detection signals /TGA and /TGB. State detection signals /TDA, TDB and TDC specify that a test mode is to be executed, and test group signals /TGA and /TGB specify a test group of tests to be executed.

Timing detecting signal TDA is set to the L level when the row address strobe signals /RAS, column address strobe signals /CAS and write enable signal /WE are input with the WCBR timing, and is reset to the H level at the rise of row address strobe signal /RAS to the H level after the CBR (/CAS before /RAS) refresh timing in which write enable signal /WE is kept at the H level, column address strobe signal /CAS is set to the L level and then the row address strobe signal /RAS is set to the L level is implemented or after the ROR (/RAS Only Refresh) timing in which the column address strobe signal /CAS and write enable signal /WE are both kept at the H level and the row address strobe signal /RAS is set to the L level is implemented.

Timing detection signal TDB attains to and kept at the H level for a prescribed time period after the lapse of a prescribed time period from the input of row address strobe signal /RAS, column address strobe signal /CAS and write enable signal /WE in the WCBR timing.

Timing detection signal TDC is set to the H level when row address strobe signal /RAS rises to the H level after the input of row address strobe signal /RAS, column address strobe signal /CAS and write enable signal /WE with the WCBR timing, and it is reset to the L level when the row address strobe signal /RAS rises to the H level after the input of row address strobe signal /RAS, column address strobe signal /CAS and write enable signal /WE in the CBR refresh timing or the ROR timing.

Test group detection signal /TGA is set to the L level in response to the rise of timing detection signal TDC to the H level, when row address strobe signal /RAS, column address strobe signal /CAS and write enable signal /WE are input at the WCBR timing, address signal $A_0$ is set to a super H level higher than the normal H level and the address signal $A_1$ is set to the normal H level. Test group detection signal /TGB is set to the L level in response to the rise of the timing detection signal TDC to the H level when the row address strobe signal /RAS, column address strobe signal /CAS and write enable signal /WE are input at the WCBR timing, address signal $A_1$ is set to the normal H level and the address signal $A_1$ is set to the super H level.

Test mode setting signal generating circuit 1620 receives timing detection signals /TDA, TDB, test group detection signal /TGA and /TGB from state detection circuit 1610 as well as row address signals /RA$_2$, . . . . , /RA$_6$ from row address buffer 300, and outputs test mode setting signals TE, TEST1–TEST5, TEST6S, TEST6N and TEST7. TEST mode setting signal TE is set to the H level in response to the rise of timing detection signal TDC when the row address strobe signal /RAS, column address strobe signal /CAS and write enable signal /WE are input with the WCBR timing and one of the address signals $A_0$ and $A_1$ is at the super H level and the other is not at the normal H level. Of special test mode setting signals TEST1–TEST5, TEST6S–TEST6N and TEST7, one which corresponds to the row address signal /RA$_2$, . . . , /RA$_6$ attains to the H level when the row address strobe signal /RAS, column address strobe signal /CAS and write enable signal /WE are input with the WCBR timing, one of the address signals $A_0$ and $A_1$ is at the super H level and the other is set to the normal H level. More specifically, when the row address strobe signal /RAS, column address strobe signal /CAS and write enable signal /WE are input with the WCBR timing, one of the address signals $A_0$ and $A_1$ is set to the super H level and the other to the normal H level and the row address signal /RA$_6$ is set to the L level, the multibit test mode setting signal TE is set to the H level, and one of the special test mode setting signals TEST1, TEST2, TEST3, TEST4, TEST5, TEST6N, TEST6S and TEST7 which is designated by row address signals /RA$_2$, . . . . , /RA$_5$ is set to the H level.

The test mode setting operation will be briefly described with reference to the diagrams of signal waveforms shown in FIGS. 5 and 6.

Figure 5:
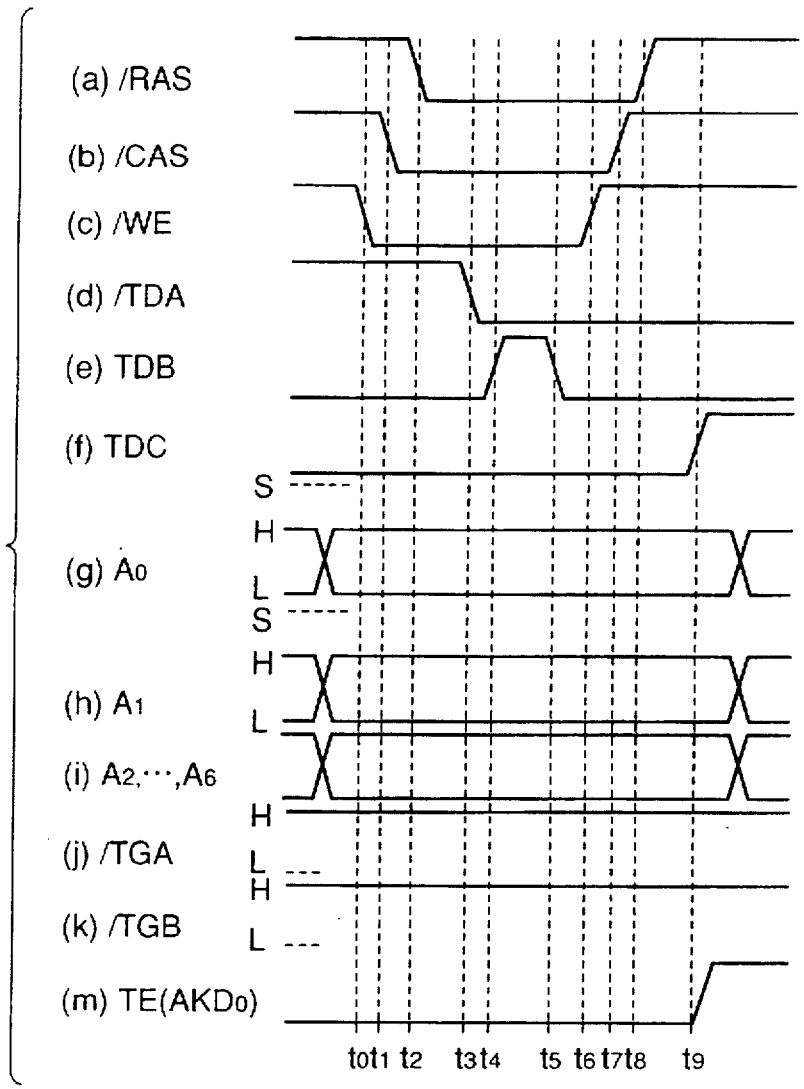
FIG. 5 is a timing chart representing the operation of the test mode setting circuit of the DRAM in accordance with the first embodiment of the present invention.

FIG. 5 is a timing chart representing the operation when the multibit test mode standardized by JEDEC is set. While address signals $A_0$ and $A_1$ are set at the normal H level or L level as shown in (j) and (h) of FIG. 5, row address strobe signal /RAS, column address strobe signal /CAS and write enable signal /WE are input with the WCBR timing as shown in (a) and (b) and (c) of FIG. 5, then timing detection signals /TDA, TDB and TDC change as shown in (d), (e) and (f) of FIG. 5, respectively. More specifically, at times $t_0$ and $t_1$, write enable signal /WE and column address strobe signal /CAS are set to the L level, respectively, and at time $t_2$, row address strobe signal /RAS is set to the L level. Timing detection signal /TDA attains to the L level at time $t_3$ in response to the fall of signal /RAS, and timing detection signal TDB is kept at the H level from $t_4$ to $t_5$. Timing detection signal TDC is at the L level. At time points $t_6$, $t_7$ and $t_8$, signals /WE, /CAS and /RAS rise to the H level. Though timing detection signals /TDA and TDB maintain the L level, timing detection signal TDC rises to the H level at time $t_9$ in response to the rise of signals /RAS.

Test group detecting signals /TGA and TGB output from test group detecting signal generating circuit 1612c in test group detecting circuit 1612 are both at the H level as shown in (j) and (k) of FIG. 5. When timing detection signal TDC attains to the H level at time $t_9$ as shown in (f) of FIG. 5, multibit test mode setting signal TE is activated to the H level as shown in (m) of FIG. 5 in response to the test group detecting signals /TGA and /TGB which are both at the H level.

Though not shown, reset of the multibit test mode setting signal TE to the L level is performed by inputting the signals /RAS and /CAS at the CBR refresh timing or the signal /RAS at the ROR timing.

Figure 6:
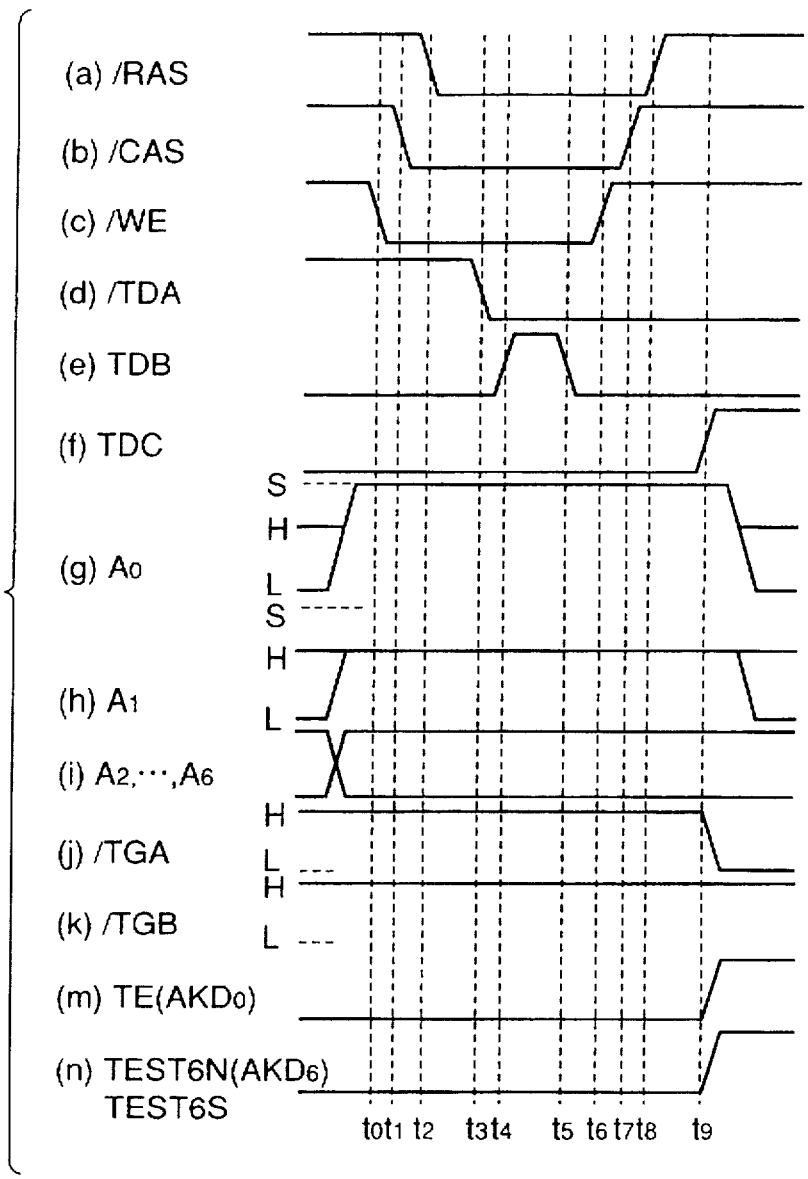
FIG. 6 is a timing chart representing the operation of the test mode setting circuit of the DRAM in accordance with the first embodiment of the present invention.

FIG. 6 is a timing chart representing the operation for setting both the special test mode (here, stress test mode) not standardized by the JEDEC and the multibit test mode. First, address signals $A_0$ and $A_1$ are set to the S level (super Vcc level) and H level as shown in (g) and (h) of FIG. 6, and address signals $A_2$, . . . . , $A_6$ are set to the H level, H level, L level, L level and H level of the normal level, as shown in (i) of FIG. 6. Then, row address strobe signal /RAS, column address strobe signal /CAS and write enable signal /WE are input along the WCBR timing as shown in (a), (b) and (c) of FIG. 6, then timing detection signals /TDA, TDB and TDC change as shown in (d), (e) and (f) of FIG. 6. More specifically, when the signals /WE, /CAS and /RAS are set to the L level at time points $t_0$, $t_1$, and $t_2$, respectively, the timing detection signal /TDA attains to the L level at time $t_3$, and timing detection signal TDB is kept at the H level from $t_4$ to $t_5$. State detection signals /TGA and /TGB are both at the H level.

When timing detecting signal TDC changes to the H level at time $t_9$ as shown in (f) of FIG. 6, the test group detection signal /TGA output from test group detection circuit 1612 attains to the L level as shown in (j) of FIG. 6. Address signals $A_2$ to $A_6$ are set to prescribed states, as will be described in greater detail later. The state detection signal /TGB is set to the H level at time $t_9$. When timing detection signal TDC rises to the H level at time $t_9$, test mode setting signals TE, TEST6N and TEST6S are set to the H level at time $t_9$ as shown (m) and (n) in FIG. 6 in accordance with the address signal $A_0$ at the S level and address signals $A_2$ to $A_6$ of the prescribed states, and hence multibit test and stress test are both designated.

In this manner, the multibit test mode in accordance with the JEDEC standard is set, and in addition, the special test mode and the multibit test mode can both be set by setting the address signal $A_6$ at the H level. When the special test mode is to be set, it is necessary to set one of the address signals $A_0$ and $A_1$ to the S level and the other to the H level. Therefore, when a high voltage is applied erroneously, these signals both attain to the S level, and hence erroneous setting of the special test mode can be prevented. Though not shown, the test mode is reset by an input along CBR refresh timing or the ROR timing.

FIG. 7 is a table showing correspondence between address keys and test modes showing which test mode setting signal is activated to the H level in accordance with the states (address keys) of the address signals ($A_0, \ldots, A_6$), when the signals are input along the WCBR timing. In the table, the reference character S represents the S level, H represents the H level, L represents L level and * represents H or L level. Here, the test mode setting signals TEST1 and TEST2 are adapted to be set to the H level by independent setting keys, since it is desired to simultaneously set a special test mode setting signal other than the test mode setting signals TEST1 and TEST2 to the H level simultaneously.

The multibit test mode in accordance with JEDEC standard is set by the normal WCBR condition. In the present invention, when one of the address signals $A_0$ and $A_1$ is set to the S level (super Vcc level), the other is to the normal H level and the address signal A6 to the H level, multibit test mode is designated under WCBR condition. By setting one of the address signals $A_0$ and $A_1$ to the S level and the other to the H level, a special test mode is designated based on address signals $A_2$ to $A_5$. Any combination of the address keys are arbitrarily available, and the above described combination of address keys is only an example.

Specific structure of each circuit will be described in detail.

Figure 8:
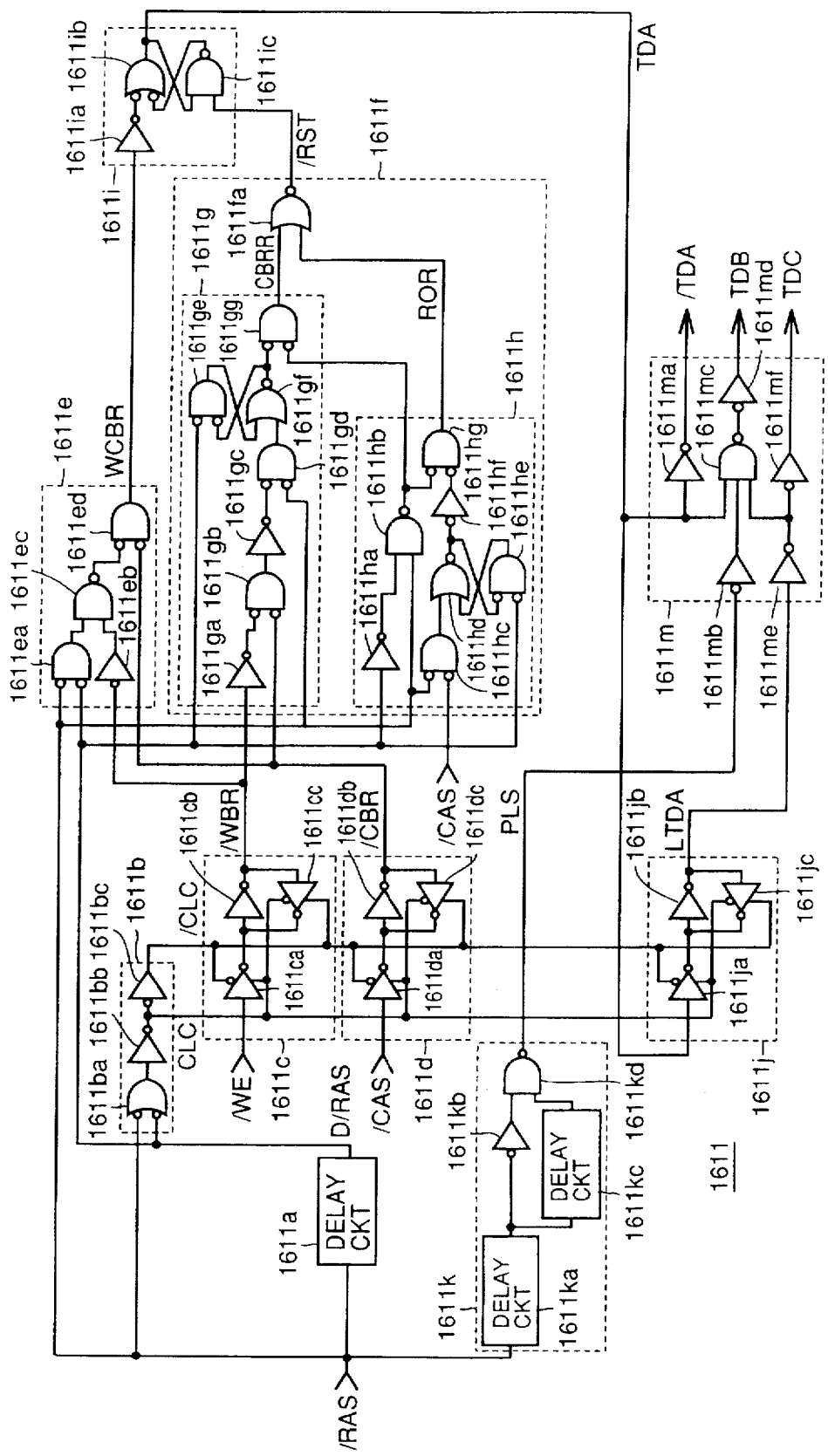
FIG. 8 is a schematic diagram of a timing detecting circuit in the test mode setting circuit of the DRAM in accordance with the first embodiment of the present invention.

FIG. 8 shows a specific structure of timing detecting circuit 1611 included in state detecting circuit 1610 shown in FIG. 4. Referring to FIG. 8, timing detecting circuit 1611 includes a delay circuit 1611*a* for outputting a delay signal D/RAS which is obtained from delaying row address strobe signal /RAS, a clocked inverter control circuit 1611*b* for outputting clock inverted control signals CLC and /CLC in accordance with delay signal D/RAS and row address strobe signal /RAS, and an WBR detecting circuit 1611*c* and CBR detecting circuit 1611*d* which are activated in response to clocked inverter control signals CLC and /CLC for latching signals /WE and /CAS for outputting WBR (/WE before /RAS) detection signal /WBR and CBR (/CAS before /RAS) detection signal /CBR, respectively.

The control signal CLC is kept at the L level from the fall of row address strobe signal /RAS to the L level to the rise of the delay signal D/RAS to the H level. The signal /CLC is an inverted version of control signal CLC. The clocked inverter control circuit 1611*b* includes an NAND circuit 1611*ba* receiving row address strobe signal /RAS and delay signal D/RAS, and cascaded two inverters 1611*bb* and 1611*bc* receiving an output signal from NAND circuit 1611*ba*. Control signal CLC is output from inverter 1611*bb* and complemental control signal /CLC is output from inverter 1611*bc*.

WBR detector 1611*c* includes a clocked inverter 1611*ca* which is activated in response to control signals CLC and /CLC for inverting the write enable signal /WE, an inverter 1611*cb* for inverting an output signal from clocked inverter 1611*ca*, and a clocked inverter 1611*cc* responsive to the control signals CLC and /CLC, activated complementarily to clocked inverter 1611*ca* for inverting the output signal of inverter 1611*cb* and feeding back the same to the input of inverter 1611*cb*. When clocked inverter 1611*cc* is activated, inverters 1611*cb* and 1611*cc* form a latch circuit. The detection signal WBR is output from inverter 1611*cb*.

Detection signal /WBR attains to the L level when row address strobe signal /RAS attains to the L level after the write enable signal /WE attains to the L level. More specifically, control signal CLC attains to the L level in response to the fall of row address strobe signal /RAS and attains to the H level in response to the rise of delay signal D/RAS. Clocked inverter 1611*ca* is activated when the control signal CLC is at the H level and operates as an inverter, and when the control signal CLC is L level, it is inactivated and set to an output high impedance state. More specifically, WBR detector 1611*c* is set to a through state when row address strobe signal /RAS and delay signal D/RAS are both at the H level, and it is set to the latch state in synchronization with the fall of row address strobe signal /RAS. Therefore, when WBR (write enable before RAS) condition (timing) is satisfied, WBR detection signal /WBR is set to the L level and latched.

Similar to WBR detector 1611*c*, CBR detector 1611*d* includes a clocked inverter 1611*da* which is activated when control signal CLC is at the H level for inverting the column address strobe signal /CAS, an inverter 1611*db* for inverting the output signal for clock inverter 1611*ba*, and a clocked inverter 1611*dc* which is activated when control signal CLC is at the L level for inverting the output signal from inverter 1611*db* and feeding back the inverted signal to the input of inverter 1611*db*. Inverters 1611*db* and 1611*dc* form a larch circuit when inverter 1611*dc* is activated. CBR detection signal /CBR is output from inverter 1611*db*. When column address strobe signal /CAS attains to the L level before the row address strobe signal /RAS, CBR detection signal /CBR is set to the L level and kept at the L level until the rise of signal D/RAS.

State detection circuit 1610 further includes a WCBR timing detector 1611*e* responsive to the signals /RAS, D/RAS, /WBR and /CBR for detecting the WCBR condition, and a reset timing detecting circuit 1611*f* responsive to the signals /RAS, D/RAS, /WBR, /CBR and /CAS for outputting a reset timing signal /RST for resetting the timing detection signal TDA.

WCBR timing detector 1611*e* includes an NOR circuit 1611*ea* receiving row address strobe signal /RAS and delay signal D/RAS, an inverter 1611*eb* receiving WBR detection signal /WBR, an NAND circuit 1611*ec* receiving an output signal from NOR circuit 1611*ea* and an output signal from inverter 1611*eb*, and an NOR circuit 1611*ed* receiving an output signal from NAND gate 1611*ec* and CBR detection signal /CBR for outputting WCBR detection signal WCBR.

When signals /RAS and D/RAS both attain to the L level, the output signal from NOR circuit 1611*ea* attains to the H level and NAND circuit 1611*ec* is enabled. When WBR detection signal /WBR is set to the L level, the output signal from inverter 1611*eb* attains to the H level and the output signal from NAND circuit 1611*ec* attains to the L level. When CBR detection signal /CBR is also at the L level, the WCBR detection signal WCBR from NOR circuit 1611*ed* attains to the H level. The WCBR detection signal WCBR is thus set to the H level when WCBR condition (write enable, CAS before RAS condition timing) is satisfied, and when the row address strobe signal /RAS attains to the H level, the WCBR detection signal WCBR is reset to the L level.

The reset timing detector 1611f includes a CBR refresh timing detecting circuit 1611g responsive to the signals /RAS, D/RAS, /WBR and /CBR for detecting the holding of the CBR refresh condition (CAS before RAS with WE high), a timing detection circuit 1611h responsive to the signals /RAS, D/RAS, and /CAS for detecting the holding of ROR condition (/RAS at L level with /CAS at H level), and an NOR circuit 1611fa receiving output signals from timing detecting circuits 1611g and 1611h.

CBR timing detecting circuit 1611g includes an inverter 1611ga receiving WBR detection signal /WBR, an NOR circuit 1611gh receiving an output signal from inverter 1611ga and CBR detection signal /CBR, an inverter 1611gc receiving an output signal from NOR circuit 1611gb, an NOR circuit 1611ga receiving an output signal from inverter 1611gc and address strobe signal /RAS, a two-input NOR circuit 1611ge receiving at its one input the delay signal D/RAS, a two-input NOR circuit 1611gf receiving at its one input an output signal from NOR circuit 1611gd, and an NOR circuit 1611gg receiving an output signal from NOR circuit 1611gf and an output signal from an NAND circuit 1611hb included in ROR timing detector 1611h.

NOR circuits 1611ge and 1611gf are cross coupled with each other to form an NOR type flipflop. The CBR detection signal CBRR is output from NOR circuit 1611gg.

When row address strobe signal /RAS, column address strobe signal /CAS and write enable signal /WE are input along the CBR refresh timing and as a result, WBR detection signal /WBR attains to the H level and CBR detection signal /CBR attains to the L level, the CBR refresh timing detection signal CBRR attains to and is kept at the H level for a prescribed time period, in response to the rise of the row address strobe signal /RAS to the H level. The prescribed time period is determined by the delay time of the delay circuit 1611a.

ROR timing detector 1611h includes an inverter 1611ha receiving delay signal D/RAS, an NAND circuit 1611hb receiving an output signal from inverter 1611ha and row address strobe signal /RAS, an NOR circuit 1611hc receiving signals /RAS and /CAS, a two-input NOR circuit 1611hd receiving at one input an output signal from NOR circuit 1611hc, an NOR circuit 1611he receiving at its one input the delay signal D/RAS, an inverter 1611hf receiving an output signal from NOR circuit 1611hd, and an NOR circuit 1611hg receiving an output signal from NOR circuit 1611hb and an output signal from inverter 1611hf.

ROR refresh timing detection signal ROR is output from NOR circuit 1611hg. NOR circuits 1611hb and 1611he form an NOR type flipflop, which flipflop is set by an output signal from NOR circuit 1611hc and reset by the delay circuit D/RAS. When signals /RAS and /CAS are input along the ROR timing, ROR refresh timing detection signal ROR is set to and kept at the H level for a prescribed time period (determined by the delay time of delay circuit 1611a) in response to the rise of row address strobe signal /RAS.

NOR circuit 1611fa sets the reset timing detection signal /RST to the L level, when at least one of the signals /CBRR and ROR is at the H level.

Timing detector 1611 further includes a set/reset circuit 1611i responsive to signals WCBR and /RST for outputting a state (timing) detection signal TDA, a pulse generating circuit 1611k responsive to a rise of row address strobe signal /RAS for outputting a one shot pulse, a latch circuit 1611j responsive to control signals CLC and /CLC for latching the state detection signal TDA and for outputting a latch timing detection signal LTDA, and a timing detection signal generator 1611m responsive to the signals TDA, PLS and LTDA for outputting state (timing) detection signals /TDA, TDB and TDC.

Set/reset circuit 1611i includes an inverter 1611ia receiving the signal WCBR, a 2-input NAND circuit 1611ib receiving at one input an output signal from inverter 1611ia, and a 2-input NAND circuit 1611ic receiving at its one input the signal /RST. NAND circuits 1611ib and 1611ic are cross coupled with each other to form an NAND type flipflop.

When row address strobe signal /RAS, column address strobe signal /CAS and write enable signal /WE are input along the WCBR timing, the WCBR timing detection signal WCBR attains to the H level and the reset timing detection signal /RST attains to the H level, then timing detection signal TDA is set to the H level. When row address strobe signal /RAS, column address strobe signal /CAS and write enable signal /WE are input along the CBR refresh timing or ROR timing and then the WCBR timing detection signal WCBR is at the L level and reset timing detection signal /RST is at the L level at the rise of the row address strobe signal /RAS to the H level, then, timing detection signal TDA is reset to the L level.

Latch circuit 1611j includes a clocked inverter 1611ja which is activated when control signal CLC is at the H level for inverting the signal TDA, an inverter 1611jb for inverting an output signal from clocked inverter 1611ja, a clocked inverter 1611jc which is activated when control signal CLC is at the L level for inverting the output signal from inverter 1611jb and for feeding it back to the input of inverter 1611jb. Inverter 1611jb and clocked inverter 1611jc form a latch when clocked inverter 1611jc is activated. When clocked inverter control signals CLC and /CLC are at the H level and L level, respectively, timing detection latch signal LTDA is set to the same logic as the timing detection signal TDA. When clocked inverter control signals CLC and /CLC attain to the L level and H level, respectively, the timing detection latch signal LTDA at that time is held.

Pulse generator 1611k includes a delay circuit 1611ka for providing a delay to row address strobe signal /RAS, an inverter 1611kb inverting an output signal from delay circuit 1611kc, a delay circuit 1611kc for further delaying the output signal from delay circuit 1611ka, and an NAND circuit 1611kd receiving an output signal from delay circuit 1611kc and an output signal from inverter 1611kb. The pulse signal PLS is set to and kept at the L level for a prescribed time period (determined by the delay time of the delay circuit 1611kc) after a prescribed time period (delay time of delay circuit 1611a) from the fall of the row address strobe signal /RAS.

Timing detection signal generator 1611m includes an inverter 1611mb receiving and inverting the pulse signal PLS, an inverter 1611ma receiving and inverting the timing detection signal TDA to generate the timing detection signal /TDA, an inverter 1611me receiving and inverting the latch timing detection signal LTDA, a 3-input NAND circuit 1611mc receiving the timing detection signal TDA and outputs of the inverters 1611mb and 1611me, an inverter 1611md receiving and inverting an output signal of NAND circuit 1611mc to generate the timing detection signal TDB, and an inverter 1611mf receiving and inverting an output signal of inverter 1611me to generate the timing detection signal TDC.

Timing detection signal TDB is rendered high when the signal TDA is at the H level and the signals PLS and LTDA are both at L level. The signal TDC is the same in logic as the signal LTDA.

Therefore, timing (state) detection signal /TDA is set to the L level when row address strobe signal /RAS, column address strobe signal /CAS and write enable signal /WE are input along the WCBR timing, and reset to the H level in response to the rise of row address strobe signal /RAS to the H level when the signals are input at the CBR refresh timing or ROR timing. Timing detection signal TDB attains to and is kept at the H level for a prescribed time period after the lapse of a prescribed time from the fall of row address strobe signal /RAS to the L level, when the row address strobe signal /RAS, column address strobe signal /CAS and write enable signal /WE are input along the WCBR timing. Timing detection signal TBC attains to the H level based on the rise of row address strobe signal /RAS to the H level when row address strobe signal /RAS, column address strobe signal /CAS and write enable signal /WE are input along the WCBR timing. It attains to the L level based on the rise of row address strobe signal /RAS to the H level, when the signals are input along the CBR refresh timing or the ROR timing. The operation of the timing detection circuit will be described with reference to waveforms of FIGS. 9 and 10.

Figure 9:
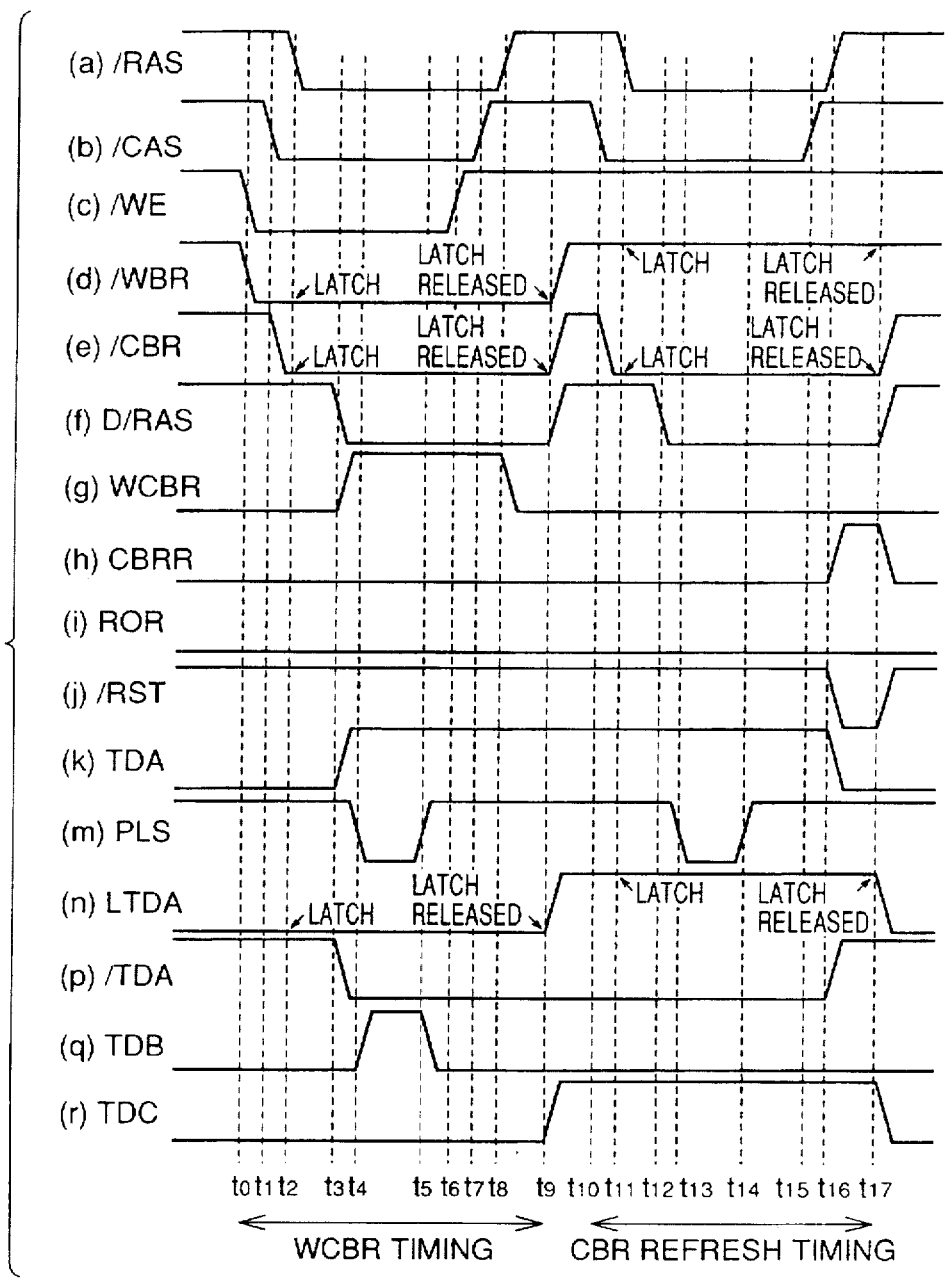
FIG. 9 is a timing chart representing the operation of the test mode setting circuit of the DRAM in accordance with the first embodiment of the present invention.

FIG. 9 is a timing chart representing an operation of the timing detection circuit 1611 shown in FIG. 8 when a test mode is set along the WCBR timing and the test mode is reset at the CBR refresh timing. First, prior to time $t_0$, timing detection signals /TDA, TDB and TDC are reset at the H level, L level and L level, as shown in (p), (q) and (r) of FIG. 9. When write enable signal /WE is set to the L level at time point $t_0$ as shown in (c) of FIG. 9, the WBR detection signal /WBR output from WBR detection circuit 1611c (FIG. 8) of timing detection circuit 1611 attains to the L level as shown in (d) of FIG. 9. When column address strobe signal /CAS is set to the L level at time $t_1$ as shown in (b) of FIG. 9, the CBR detection signal /CBR output from CBR detection circuit 1611d (FIG. 8) of timing detection circuit 1611 attains to the L level, as shown in (e) of FIG. 9. When row address strobe signal /RAS is set to the L level at time $t_2$ as shown in (a) of FIG. 9, control signal CLC attains to the L level, detecting circuits 1611c and 1611d are set to the latch state, and WBR detection signal /WBR and CBR detection signal /CBR are both latched and maintained at the L level.

However, at this time, the WCBR timing detection signal WCBR output from WCBR timing detection circuit 1611e is still at the L level as shown in (g) of FIG. 9, and the timing detection signal TDA output from set/reset circuit 1611i receiving the WCBR timing detection signal WCBR is also still reset at the L level. Therefore, the timing detection latch signal LTDA output from timing detection signal latch circuit 1611j which is set to the latch state by the fall of signal /RAS is latched and maintained at the L level as shown in (n) of FIG. 9. Therefore, the timing detection signal TDC output from timing detection signal generating circuit 1611f is kept at the L level as shown in FIG. 10(r).

Figure 10:
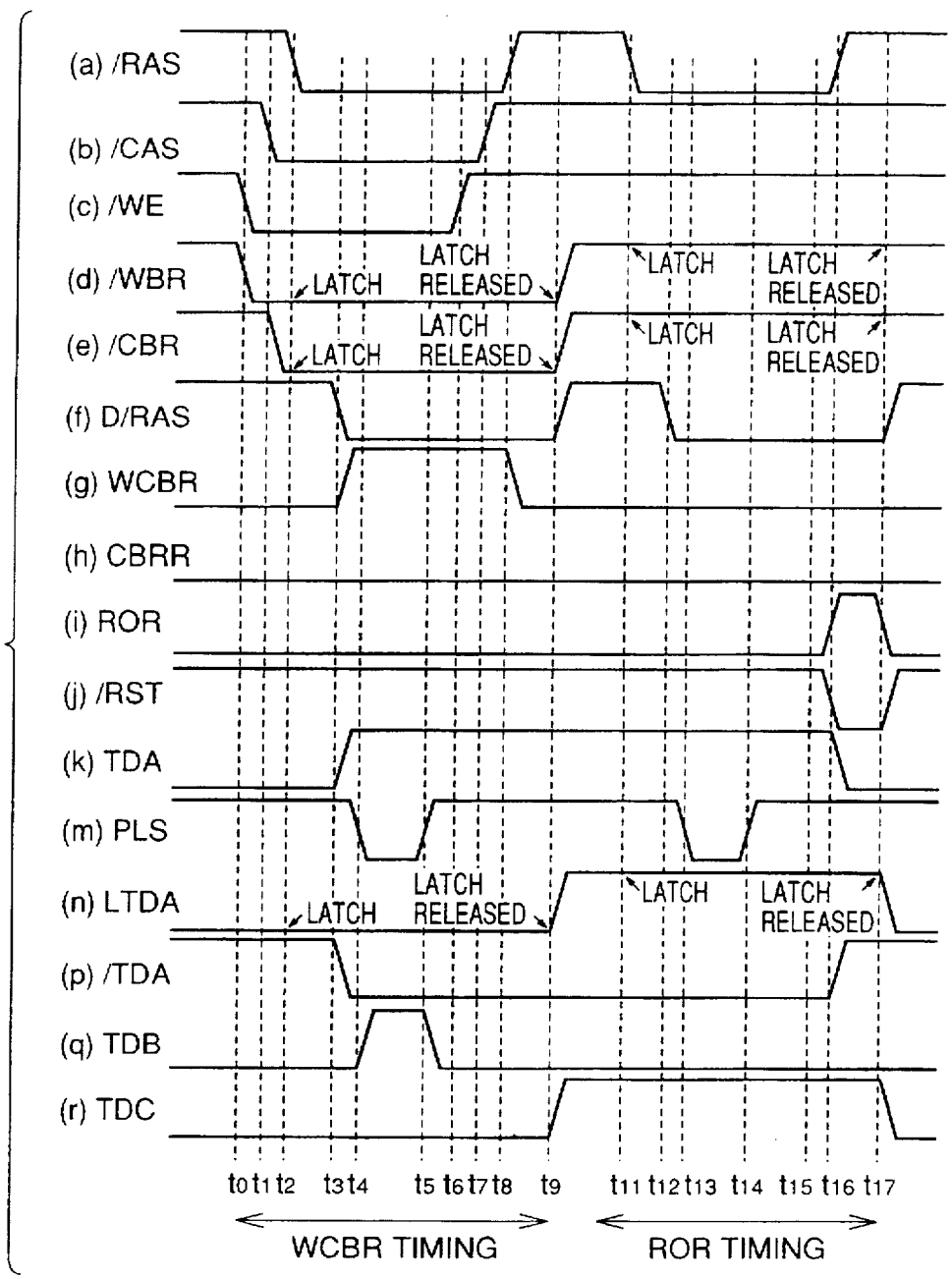
FIG. 10 is a timing chart representing the operation of the test mode setting circuit of the DRAM in accordance with the first embodiment of the present invention.

When the delay signal D/RAS of row address strobe signal /RAS falls to the L level at time $t_3$ as shown in (f) of FIG. 9, the WCBR timing detection signal WCBR output from WCBR timing detection circuit 1611e attains to the H level as shown in (g) of FIG. 9, set/reset circuit 1611i is set, and the time detection signal TDA is set to the H level as shown in (k) of FIG. 10. The timing detection signal /TDA which is the inverted version of timing detection signal TDA inverted by timing detection signal generating circuit 1611m attains to the L level as shown in (p) of FIG. 9. The pulse signal PLS output from pulse generating circuit 1611k attains to the L level as shown in (m) of FIG. 9 at time $t_4$ after the lapse of a prescribed time period from time point $t_2$ when the row address strobe signal /RAS changes to the L level, and it is kept at the L level until time point $t_5$. From $t_4$ to $t_5$, the timing detection signal TDB output from timing detection signal generating circuit 1611m is kept at the H level, as shown in (q) of FIG. 9.

When write enable signal /WE attains to the H level at time $t_6$ as shown in (c) of FIG. 9, column address strobe signal /CAS is set to the H level at time $t_7$ as shown in (b) of FIG. 9 and row address strobe signal /RAS is set to the H level at time $t_8$ as shown in (c) of FIG. 9, the WCBR timing detection signal WCBR output from WCBR timing detection circuit 1611e attains to the L level, as shown in (g) of FIG. 9. However, the timing detection signal TDA output from set/reset circuit 1611i receiving the WCBR timing detection signal WCBR is kept latched at the H level as shown in (k) of FIG. 9, as the reset timing detection signal /RST output from reset timing detection circuit 1611f is at H level as shown in (j) of FIG. 9, and hence timing detection signal /TDA is also kept at the L level as shown in (p) of FIG. 9.

Therefore, when the delay signal D/RAS of row address strobe signal /RAS attains to the H level at time $t_9$ as shown in (f) of FIG. 9, control signal CLC attains to the H level, the WBR detection signal /WBR output from WBR detection circuit 1611c changes to the H level as the latch state is released as shown in (d) of FIG. 9, and CBR detection signal /CBR output from CBR detection circuit 1611d changes to the H level as the latch state is released as shown in (e) of FIG. 9. The timing detection latch signal LTDA output from timing detection signal latch circuit 1611j changes to the H level as the latch state thereof is released as shown in (n) of FIG. 9, and timing detection signal TDC output from timing detection signal generating circuit 1611m receiving timing detection latch signal LTDA changes to the H level as shown in (r) of FIG. 9. In this manner, the test mode is set along the WCBR timing. Thereafter, a test operation is performed in accordance with the set test mode.

When column address strobe signal /CAS is set to the L level at time $t_{10}$ as shown in (b) of FIG. 9, the CBR detection signal CBR output from CBR detection circuit 1611d attains to the L level as shown in (e) of FIG. 9. When row address strobe signal /RAS is set to the L level at time $t_{11}$ as shown in FIG. 9(a), the WBR detection signal /WBR and CBR detection signal /CBR are both latched and kept at the H level and L level, respectively. Meanwhile, the timing detection signal TDA output from set/reset circuit 1611i at this time is latched at the H level as shown in (k) of FIG. 9, and the timing detection latch signal LTDA output from timing detection signal latch circuit 1611j is latched and kept at the H level as shown in (n) of FIG. 9. Therefore, the timing detection signal TDC output from timing detection signal generating circuit 1611m is kept at the H level as shown in (r) of FIG. 9. The signal TDB is kept at the L level by inverter 1611me and NAND circuit 1611mc, by the signal TDC which is at the H level.

In response to the fall of signal /RAS, the delay signal D/RAS of row address strobe signal /RAS attains to the L level at time $t_{12}$ as shown in (f) of FIG. 9, and pulse signal PLS is set to and kept at the L level from $t_{13}$ to $t_{14}$, as shown in (m) of FIG. 10. The pulse signal PLS is ignored by NAND circuit 1611mc and it has no influence to the signal TDB. When the column address strobe signal /CAS is set to the H level at time $t_{15}$ as shown in (b) of FIG. 9 and the row address strobe signal /RAS is set to the H level at time $t_{16}$ as shown in (a) of FIG. 9, the CBR refresh timing detection signal CBRR output from CBR refresh timing detecting circuit 1611g in reset timing detection circuit 1611f changes to the H level as shown in (h) of FIG. 9, and in response, the reset timing detection signal /RST output from reset timing detection circuit 1611f changes to the L level as shown in (j) of FIG. 9.

The timing detection signal TDA output from set/reset circuit 1611i receiving the reset timing detection signal /RST is reset to the L level as shown in (k) of FIG. 9, and the timing detection signal /TDA output from timing detection signal generating circuit 1611m changes to the L level as shown in (p) of FIG. 9. When the delay signal D/RAS of row address strobe signal /RAS changes to the H level at time $t_{17}$ as shown in (f) of FIG. 9, the CBR refresh timing detection signal CBRR output from CBR refresh timing detection circuit 1611g changes to the L level as shown in (h) of FIG. 9, and the reset timing detection signal /RST output from reset timing detection circuit 1611f changes to the H level.

The CBR detection signal /CBR output from CBR detection circuit 1611d changes to the H level, as the latch state thereof is released as shown in (e) of FIG. 9. The timing detection latch signal LTDA output from timing detection signal latch circuit 1611j changes to the L level which is the same in logic as the signal TDA, as the latch state thereof is released, as shown in (n) of FIG. 9. The timing detection signal TDC output from timing detection signal generating circuit 1611m receiving the timing detection latch signal LTDA changes to the L level as shown in (r) of FIG. 9. In this mode, the test mode is reset along the CBR refresh timing.

FIG. 10 is a timing chart representing an operation in which the test mode is set along the WCBR timing and the test mode is reset along ROR timing. The operation until the time point $t_9$ at which the test mode is set along the WCBR timing is the same as shown in the timing chart of FIG. 9. What is different from the timing chart of FIG. 9 after the time point $t_9$ is, (1) column address strobe signal /CAS is not set to the L level and hence CBR detection signal CBR does not attain to the L level, and (2) when the row address strobe signal /RAS is set to the H level, at time $t_{16}$, the CBR refresh timing detection signal CBRR output from CBR refresh timing detection circuit 1611g does not attain to the H level, but the ROR timing detection signal ROR output from ROR timing detection circuit 1611a attains to the H level as shown in (i) of FIG. 10. The reset timing detection signal /RST output from reset timing detection circuit 1611f changes to the L level, by the change of the signal ROR to the H level, as shown in FIG. 10 (j). In this manner, the test mode can be reset similarly no matter whether along the CBR refresh timing or ROR timing.

As described above, signal TDA is kept at the H level from the test mode set cycle to the test mode reset cycle, and the test mode is designated. The signal TDB is set to the H level in the form of a one-shot pulse in the test mode set cycle, and it is fixed at the L level in the test mode reset cycle. Therefore, the signal TDB has a function of discriminating the set cycle and reset cycle of the test mode. The signal TDC is set to the H level after the set cycle, and indicates that the test mode operation is actually possible.

Figure 11:
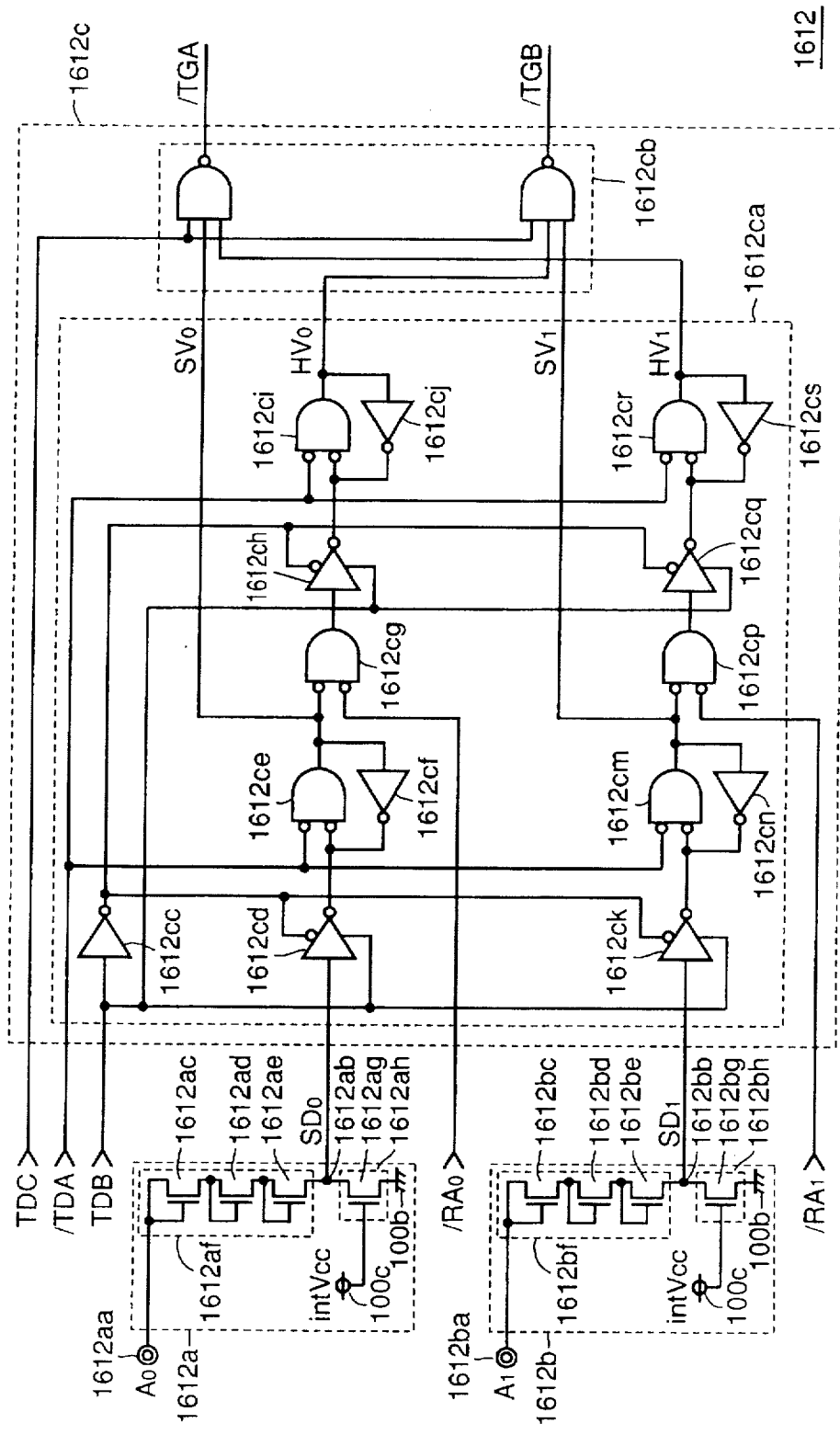
FIG. 11 is a schematic diagram of a test group detecting circuit in the test mode setting circuit of the DRAM in accordance with the first embodiment of the present invention.

FIG. 11 shows a specific structure of a test group detector 1612 included in state detector 1610. Referring to FIG. 11, test group detector 1612 includes a super H level detector 1612a for determining a voltage level of a signal applied to an address input terminal 1612aa, a super H level detector 1612b for identifying a voltage level of a signal applied to an address input terminal 1612ba, and a test group detection signal generator 1612c responsive to output signals $SD_0$ and $SD_1$ from super H level detectors 1612a and 1612b for outputting test group detection signals /TGA and /TGB.

Super H level detector 1612a includes a pull-up circuit 1612af coupled between the address input terminal 1612aa and an internal output node 1612ab, for generating a signal $SD_0$ at H level when the signal at the terminal 1612aa is at a super H level (higher than intVcc+3·Vth) higher than the external power supply potential extVcc, and a load circuit 1612ah coupled between the internal output node 1612ab and the ground node 100b, for pulling down the potential at the node 1612ab.

Pull-up circuit 1612af includes 3 diode-connected n channel MOS transistors 1612ac, 1612ad and 1612ae each having a threshold voltage of Vth and connected in series between the terminal 1612aa and the internal output node 1612ab.

Load circuit 1612ah includes an n channel MOS transistor 1612ag connected between the nodes 1612ab and 100b and having a gate connected to receive an internal power supply potential intVcc at the node 100c.

MOS transistor 1612ag is normally turned on to function as a load element, or a pull-down resistance.

When address signal $A_0$ is at intVcc+3·Vth (included in the super H level region), the super H level detection signal $SD_0$ attains to H level at intVcc (internal H level). At this time, in order to make current flowing from super H level detection signal output node 1612ab through load circuit 1612ah to ground potential node 100b to be as small as negligible as compared with the current supplied from address pin 1612aa through pull up circuit 1612af to the super H level detection signal output node 1612ab, the ratio W/L of the channel width W to the channel length L of MOS transistor 1612ag is made sufficiently smaller than the ratio of the channel width to the channel length of n channel MOS transistors 1612ac, 1612ad and 1612ae in the pull up circuit 1612af. The n channel MOS transistor 1612ag is set normally on, and hence the super H level detection circuit 1612a consumes current as current flows from address pin 1612aa to the ground potential node 100b when the address signal $A_0$ exceeds 3·Vth.

Super H level detector 1612b includes a pull-up circuit 1612bf coupled between the address input terminal 1612ba and an internal output node 1612bb, and a load circuit 1612bh coupled between the node 1612bb and the ground node 100b, similarly to the super H level detector 1612a. Pull-up circuit 1612bf includes 3 diode-connected n channel MOS transistors 1612bc to 1612be connected in series with each other between the terminal 1612ba and the internal output node 1612bb and each having a threshold voltage of Vth.

Load circuit 1612bh includes an n channel MOS transistor 1612bg connected between the nodes 100b and 1612bb and having a gate coupled to receive the internal power supply potential intVcc. The ratio of the gate (channel) width to the gate (channel) length is made sufficiently smaller than those of MOS transistors 1612bc–1612be, to reduce the current consumption, and to operate the MOS transistors 1612bc to 1612be in a diode mode for causing a 3·Vth voltage drop thereacross.

The signal /TGA attains to the L level when address signal $A_0$ is set to the super H level (hereinafter referred to as S level), $A_1$ is set to the normal H level. S level detection signals $SD_0$, $SD_1$ and row address signals /$RA_0$ and /$RA_1$ are set to the H, L, L and L levels, respectively, row address strobe signal /RAS, column address strobe signal /CAS and write enable signal /WE are input along the WCBR timing, timing detection signal TDB is kept at the H level for a prescribed time period, the signal /TDA attains to the L level and the signal TDC attains to the H level.

Test group detection signal /TGB attains to the L level when address signal $A_0$ is set to the H level, $A_1$ is set to the S level, S level detection signals $SD_0$, $SD_1$, row address signals /$RA_0$ and /$RA_1$ are set to the L, H, L and L levels, respectively, row address strobe signal /RAS, column address strobe signal /CAS and write enable signal /WE are input along the WCBR timing, timing detection signal TDB is set to and kept at the H level for a prescribed time period, the signal /TDA is set to the L level and the signal TDC is set to the H level.

The test group detecting signal generating circuit 1612c includes a test group detection assisting circuit 1612ca receiving super H level detection signals $SD_0$, $SD_1$ and row address signals /$RA_0$ and /$RA_1$ for outputting test group detection assisting signals $SV_0$, $HV_0$, $SV_1$ and $HV_1$ in accordance with the address signals $A_0$ and $A_1$, and a test group detection signal control circuit 1612cb receiving test group detection assisting signals $SV_0$, $HV_0$, $SV_1$, $HV_1$ and a timing detection signal TDC for outputting test group detection signals /TGA and /TGB.

Test group detection assisting circuit 1612ca includes an inverter 1612cc receiving the signal TDA, a clocked inverter 1612cd which is activated when the signal TDA is at the H level for inverting the signal $SD_0$, an NOR circuit 1612ce receiving the output signal from clocked inverter 1612cd and the signal /TDA, an inverter 1612cf inverting the output signal from NOR circuit 1612ce for feeding it back to the output of clocked inverter 1612cd, an NOR circuit 1612cg receiving an output signal from NOR circuit 1612ce and the row address signal $RA_0$, a clocked inverter 1612ch which is activated when the signal TDB is at the H level for inverting the output signal from NOR circuit 1612cg, an NOR circuit 1612ci receiving the signal /TDA and an output signal from clocked inverter 1612ch, and an inverter 1612cj for feeding back the output signal of NOR circuit 1612ci to the output of clocked inverter 1612ch. The signal $SV_0$ is output from NOR circuit 1612ce, and the signal $HV_0$ is output from NOR circuit 1612ci.

The assisting circuit 1612ca further includes a clocked inverter 1612ck which is activated when the signal TDB is at the H level for inverting the signal $SD_1$, an NOR circuit 1612cm receiving the output signal from clocked inverter 1612ck and the signal /TDA, an inverter 1612cn for feeding back the output signal from NOR circuit 1612cm to the output of clocked inverter 1612ck, an NOR circuit 1612cp receiving the output signal from NOR circuit 1612cm and the row address signal /RA1, a clocked inverter 1612cg which is activated when the signal TDB is at the H level for inverting the output signal from NOR circuit 1612cp, an NOR circuit 1612cr receiving the output signal from clocked inverter 1612cq and the signal /TDA, and an inverter 1612cs for inverting the output signal from NOR circuit 1612cr and feeding it back to the output of clocked inverter 1612cq.

The signal $SV_1$ is output from NOR circuit 1612cm, and the signal $HV_1$ is output from NOR circuit 1612cr.

When address signals $A_0$ and $A_1$ are set to the S level and H level respectively, and when the row address strobe signal /RAS, column address strobe signal /CAS and write enable signal /WE are input along the WCBR timing, the test group detection assisting signals $SV_0$, $HV_0$, $HV_1$ and $HV_1$ are set to the H, L, L and H levels, respectively. When the address signals $A_0$ and $A_1$ are at the H and S levels, respectively and WCBR condition is satisfied, the test group detection assisting signals $SV_0$, $HV_0$, $HV_1$, and $HV_1$ are set to the L, H, H, and L levels, respectively.

Test group detection signal control circuit 1612b includes a 3-input NAND circuit 1612ct receiving the signals TDC, $SV_0$ and $SV_1$ for outputting the group detection signal /TGA, and a 3-input NAND circuit 1612cu receiving the signals TDC, $HV_0$ and $SV_1$ for outputting a test group detection signal /TGB.

When test group detection assisting signals $SV_0$, $HV_0$, $SV_1$, and $HV_1$ attain to H, L, L and H levels, respectively, indicating that the address signals $A_0$ and $A_1$ are at the S level and the H level respectively and that the row address strobe signal /RAS, the column address strobe signals /CAS and the write enable signal /WE are input along the WCBR timing and when the timing detection signal TDC is at the H level, then the test group detection signals /TGA and /TGB attain to the L level and the H level, respectively, showing that the address signals $A_0$ and $A_1$ are at the S level and the H level, respectively, and that the row address strobe signal /RAS, the column address strobe signal /CAS and the write enable signal /WE are input along the WCBR timing.

When the test group detection assisting signals $SV_0$, $HV_0$, $SV_1$ and $HV_1$ attain to the L, H, H and L levels, respectively, indicating that the address signals $A_0$ and $A_1$ are at the H level and S level, respectively, and that the row address strobe signal /RAS, the column address strobe signal /CAS and the write enable signal /WE are input along the WCBR timing and the timing detection signal TDC is at the H level, then the test group detection signals /TGA and /TGB attain to the H and L levels, respectively indicating that the address signals $A_0$ and $A_1$ are at the H level and L level, respectively and that the row address strobe signal /RAS, the column address strobe signal /CAS and the write enable signal /WE are input along the WCBR timing. Namely, when a special test mode is designated, one of the signals /TGA and /TGB is set to the L level at the transition timing of the signal TDC to the H level (see FIG. 7). The signals /TGA and /TGB designate a group in which the test mode to be executed is included.

Figure 12:
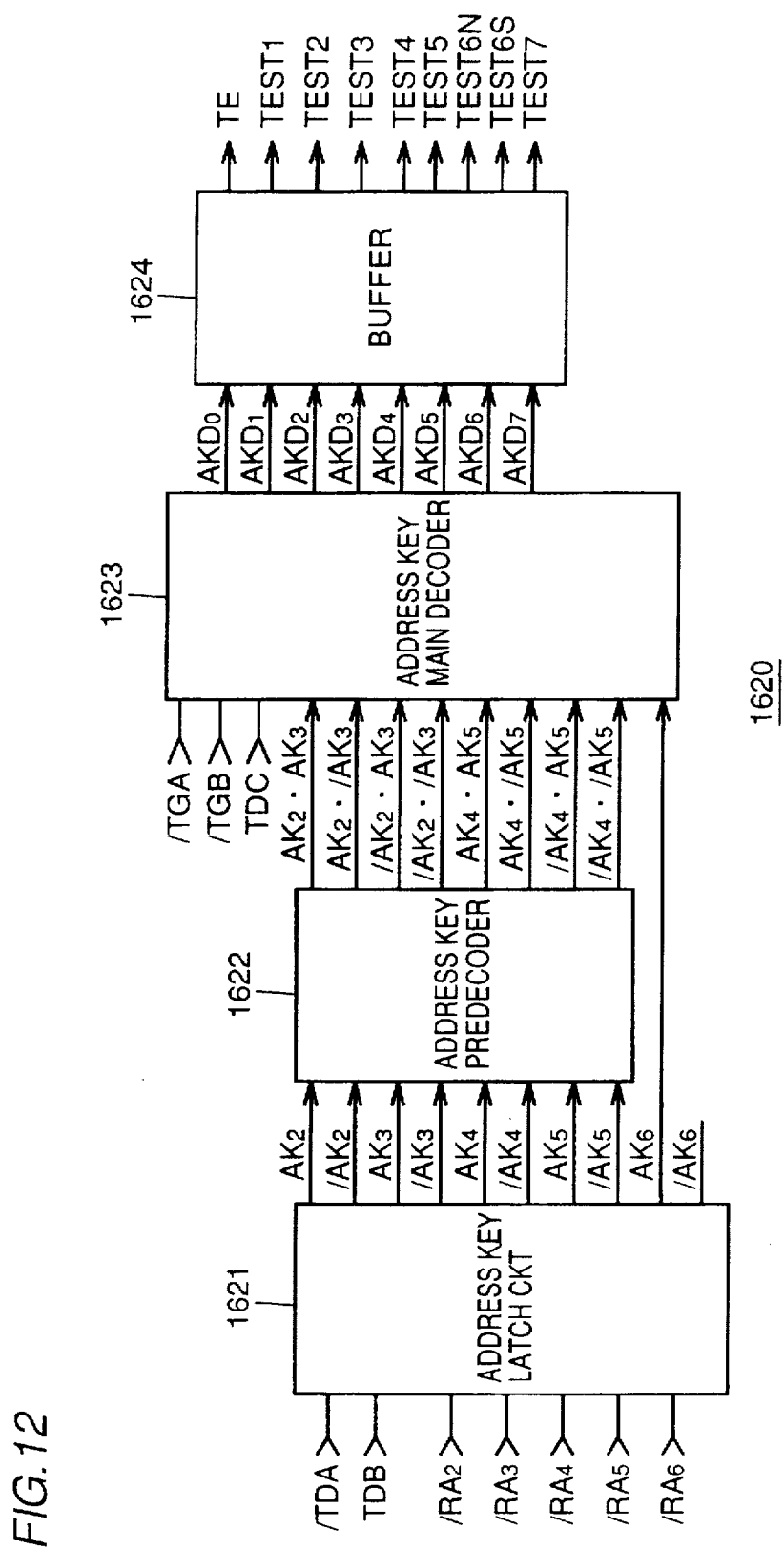
FIG. 12 is a block diagram of a test mode setting signal generating circuit in the test mode setting circuit of the DRAM in accordance with the first embodiment of the present invention.

FIG. 12 is a schematic block diagram showing a structure of the test mode setting signal generating circuit 1620 shown in FIG. 4. Referring to FIG. 12, the test mode setting circuit 1620 includes an address key latch circuit 1621 responsive to the signals /TDA and TDB for taking and latching row address signals /$RA_2$ to /$RA_6$ during the test mode operation for outputting complementary address key signals $AK_2$, /$AK_2$ to $AK_6$ and /$AK_6$, an address predecoder 1622 for predecoding address key signal $AK_2$, /$AK_2$ to $AK_5$, $AK_5$ for outputting predecoded address key signals, an address key main decoder 1623 which is activated in response to the signal TDC for decoding the predecoded address key signals and the address key $AK_6$ in accordance with signals /TGA and /TGB for outputting decoded address key signals $AKD_0$–$AKD_7$, and a buffer 1624 for buffering the decoded address key signals $AKD_0$ to $AKD_7$ for outputting test mode setting signals TE, TEST1 to TEST5, TEST6S, TEST6N and TEST7.

Address key latch circuit 1621 takes row address signals /$RA_2$,...,/$RA_6$ and outputs address key signals $AK_2$,..., $AK_6$ having logics opposite to the row address signals /$RA_2$, ..., /$RA_6$ and address key signals /$AK_2$,..../$AK_6$ having the same logic as the row address signals (/$RA_2$–/$RA_6$), while the row address strobe signal /RAS, column address strobe signal /CAS and the write enable signal /WE are input along the WCBR and responsively the timing detection signal /TDA is at the L level and the timing detection signal TDB is kept at the H level for a prescribed time period.

The address key latch circuit 1612 holds the address key signals $AK_2, \ldots, AK_6, /AK_2, \ldots /AK_6$ when the timing detection signal TDB attains to the L level and when the row address strobe signal /RAS, column address strobe signal /CAS and the write enable signal /WE are input along the CBR refresh timing or the ROR reset timing and as a result the timing detection signal TDA rises to the H level.

The address key predecoder 1622 receives address key signals $AK_2, \ldots, AK_6, /AK_2, \ldots AK_6$ and outputs logical products thereof, that is, address key predecoded signals $AK_2 \cdot AK_3$, $AK_2 \cdot /AK_3$, $/AK_2 \cdot AK_3$, $/AK_2 \cdot /AK_3$, $AK_4 \cdot AK_5$, $AK_4 \cdot /AK_5$, $/AK_4 \cdot AK_5$ and $/AK_4 \cdot /AK_5$.

Figure 13:
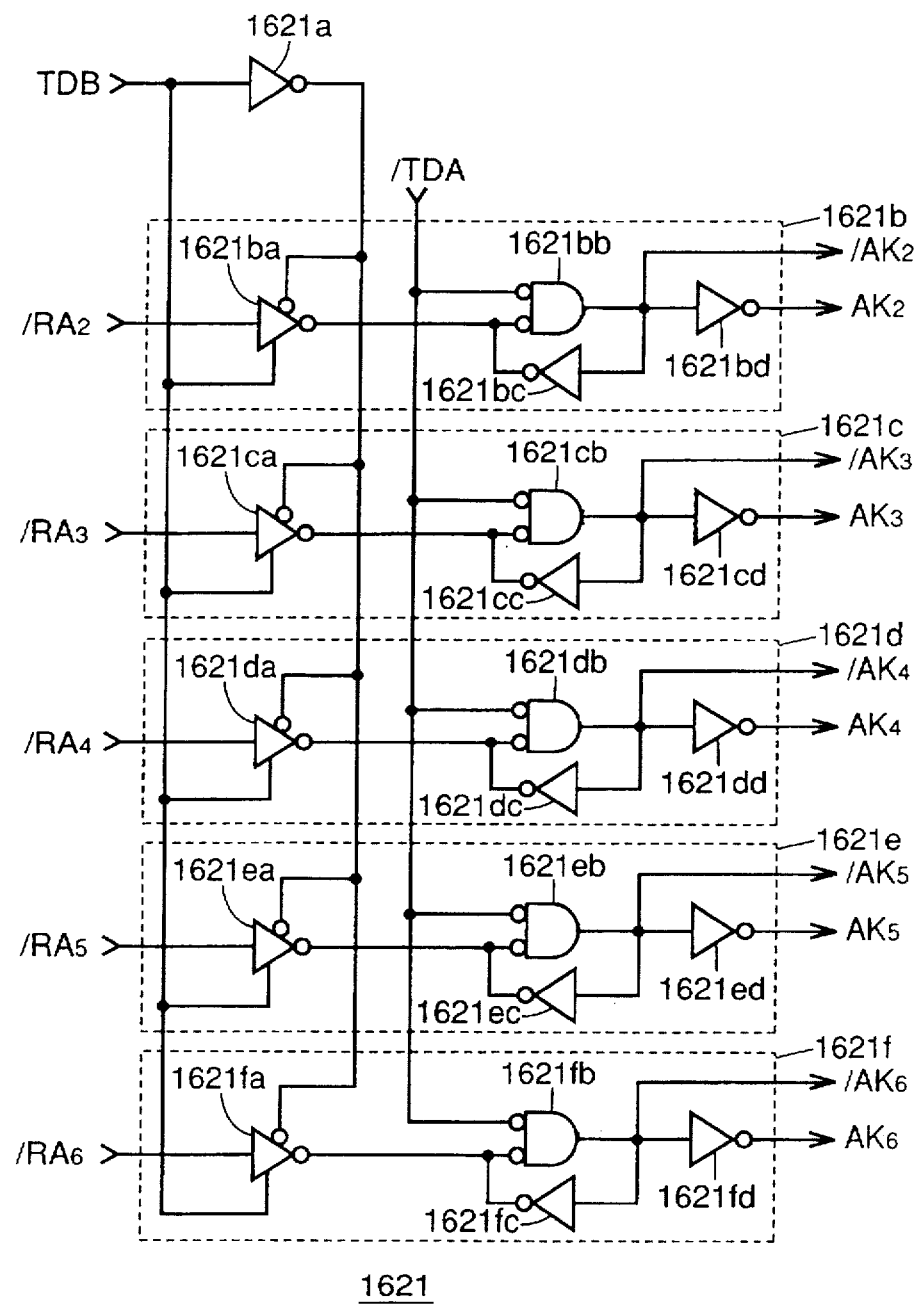
FIG. 13 is a schematic diagram of an address key latch circuit in the test mode setting signal generating circuit of the DRAM in accordance with the first embodiment of the present invention.

FIG. 13 shows a specific circuit diagram of the address key latch circuit shown in FIG. 12. The address key latch circuit 1621 includes partial latch circuits 1621b to 1621f having the same structure with each other, provided corresponding to row address signals /RA$_0$ to /RA$_6$, set to the latched state when the signal TDB is at the L level and enabled when the signal /TDA is at the L level for outputting the taken row address signals /RA$_2$ to /RA$_6$ and address key signals $AK_2$, /AK$_2$ to $AK_6$, /AK$_6$.

The partial latch circuit 1621b includes a clocked inverter 1621ba activated to invert the row address signal /RA$_0$ when the signal TDB is at H level, and deactivated to be brought into an output high impedance state when the signal TDB is at L level, an NOR circuit 1621bb receiving an output of clocked inverter 1621ba and the signal /TDA to generate the address key signal /AK$_2$, an inverter 1621bc inverting the signal /AK$_2$ for feedback to the output of clocked inverter 1621ba, and an inverter 1621bd for inverting the address key signal to generate the address key signal AK$_2$. NOR circuit 1621bb and inverter 1621bc constitute a latch. NOR circuit 1621bb is enabled to invert the output of clocked inverter 1621ba when the signal /TDA is at L level, and is disabled to force the signal /AK$_2$ to L level when the signal /TDA is at H level.

The partial latch circuits 1621c–1621f each having the same construction as that of the partial latch circuit 1621b, and like components bear the like reference characters except the first suffix indicating a corresponding partial latch circuit.

In the test mode setting cycle according to WCBR condition, row address signals /RA$_2$–/RA$_6$ are taken in and latched in response to the signal TDB. In the test mode resetting cycle according to CBR refreshing condition or ROR refreshing condition, the address key signals AK$_2$·/ AK$_2$–AK$_6$, /AK$_6$ are reset in response to the signal /TDA being reset to H level.

Figure 14:
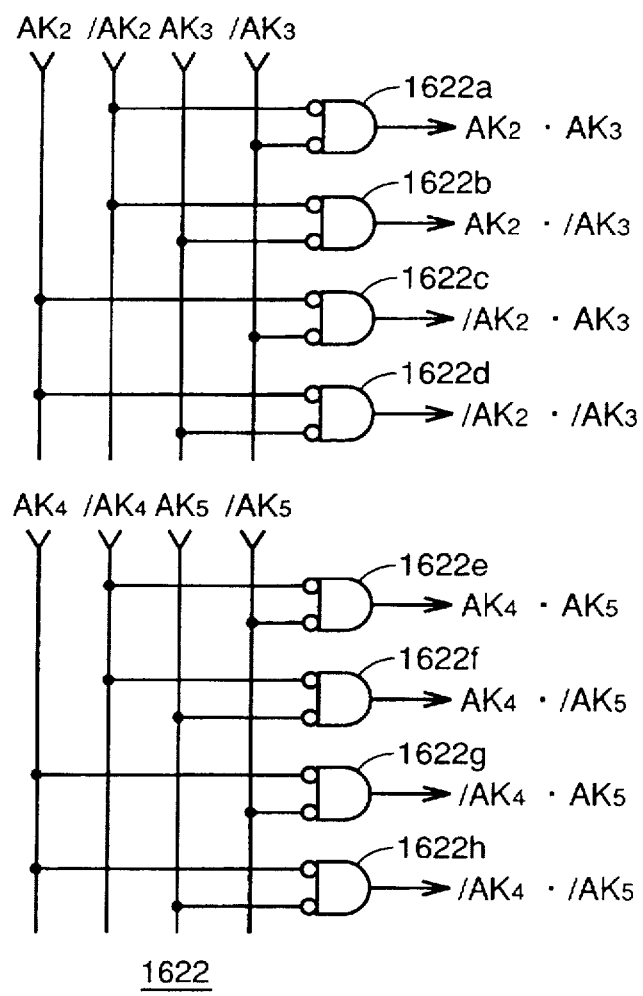
FIG. 14 is a schematic diagram of an address key predecoder in the test mode setting signal generating circuit of the DRAM in accordance with the first embodiment of the present invention.

FIG. 14 is a specific diagram showing address key predecoder 1622. The address key predecoder 1622 includes 2-input NOR circuits 1622a, 1622b, 1622c, 1622d, 1622e, 1622f, 1622g and 1622h each receiving preallotted address key signals. In address key latch circuit 1621, by latching two phase address key signals AK$_i$ and /AK$_i$, it becomes possible to output one address key predecode signal by one NOR circuit.

Figure 15:
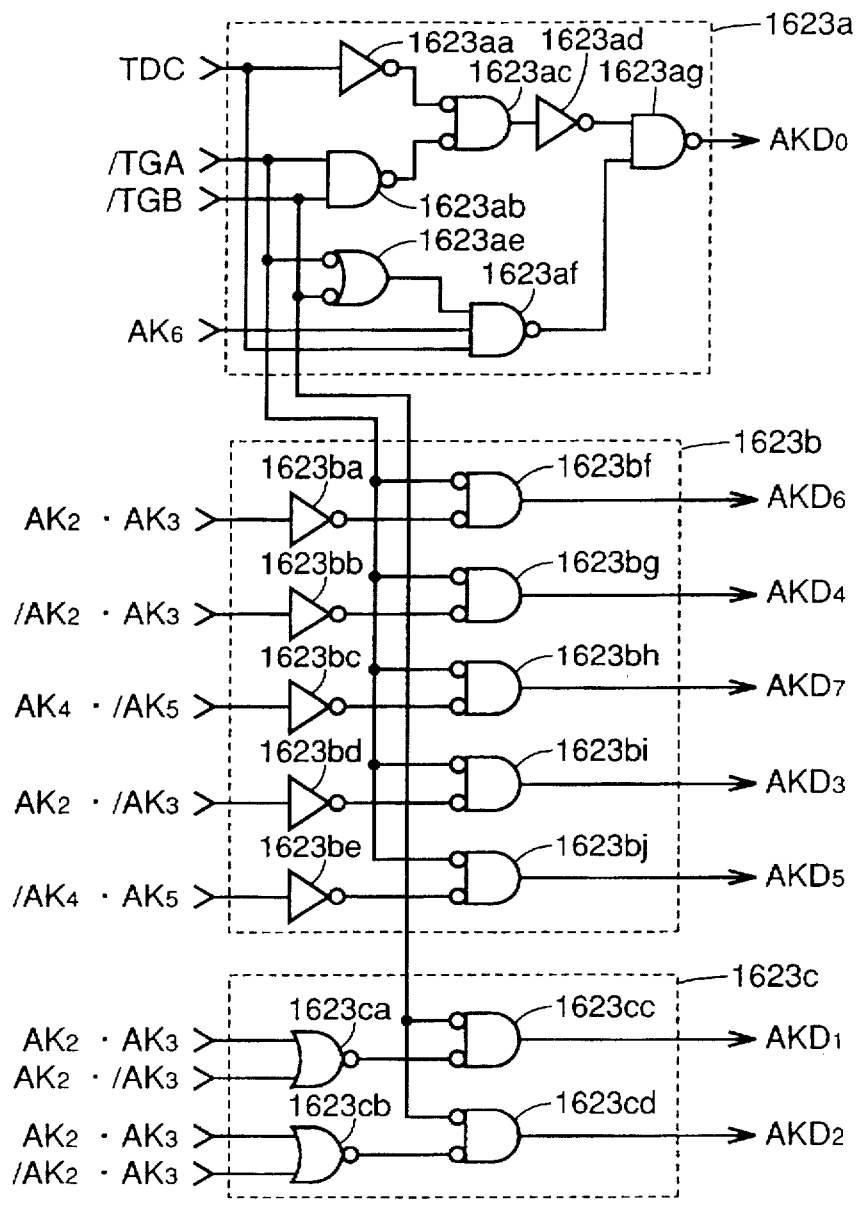
FIG. 15 is a schematic diagram of an address key main decoder in the test mode setting signal generating circuit of the DRAM in accordance with the first embodiment of the present invention.

FIG. 15 is a diagram showing a specific arrangement of address key main decoder 1623. Address key main decoder 1623 includes a partial decoder 1623a receiving timing detection signal TDC, test group detection signals /TGA and /TGB, and address key signal AK$_6$ for outputting an address key decoded signal AKD$_0$, a partial decoder 1623b receiving address key predecoded signals $AK_2 \cdot AK_3$, $/AK_2 \cdot AK_3$, $AK_4 \cdot /$ $AK_5$, $AK_2 \cdot /AK_3$, $/AK_4 \cdot AK_5$ and test group detecting signal /TGA for outputting address key decoded signals AKD$_6$, AKD$_4$, AKD$_7$, AKD$_3$ and AKD$_5$ corresponding to the address key predecoded signals $AK_2 \cdot AK3$, $/AK_2 \cdot AK_3$, $AK_4 \cdot /$ $AK_5$, $AK_2 \cdot /AK_3$, $/AK_4 \cdot AK_5$, and a partial decoder 1623c receiving address key predecoded signals $AK_2 \cdot AK_3$, $AK_2 \cdot /$ $AK_3$, $/AK_2 \cdot AK_3$ and test group detection signal /TGB for outputting address key decode signals AKD$_1$ and AKD$_2$.

Partial decoder 1623b is enabled when the test group detection signal /TGA is activated at L level, and partial decoder 1623c is enabled when the test group detection signal /TGB is activated at L level.

Partial decoder 1623a includes an inverter 1623aa receiving and inverting the timing detection signal TDC, NAND circuit 1623ab receiving the test group detection signals /TGB and /TGB, NOR circuit 1623ac receiving the output signals of inverter 1623aa and NAND circuit 1623ab, an inverter 1623ad receiving and inverting the output signal of NOR circuit 1623ac, an NAND circuit 1623ae receiving the signals /TGA and /TGB, a three-input NAND circuit 1623af receiving the signals AK$_6$ and TDC and the output of NAND circuit 1623al, and NAND circuit 1623ag receiving the output signals of inverter 1623ad and 1623af to generate the decoded address key signal AKD$_0$.

The address key decoded signal AKD$_0$ attains to H level (1) when the row address strobe signal /RAS, column address strobe signal /CAS and the write enable signal /WE are input along the WCBR timing under the condition other than the condition that one of the address signals A$_0$ and A$_1$ is at the S level and the other at the H level, that is, the JEDEC standard multibit test mode set timing, and the test group detection signals /TGA, /TGB both attain to the H level and the timing detecting signal TDC is set to the H level, and (2) when one of the address signals A$_0$ and A$_1$ is set to the S level and the other to the H level, the row address strobe signal /RAS, column address strobe signal /CAS and the write enable signal /WE are input along the WCBR timing, that is, the special test mode set timing, the address signal A$_6$ at the H level is applied at this time and one of the test group detection signals /TGA and /TGB is set to the L level, the address key signal AK$_6$ is set to the H level and the timing detection signal TDC is set to the H level.

Partial decoder 1623b includes inverters 1624ba–1623be provided corresponding to predecoded signals, respectively, and NOR circuits 1623bf to 1623bj provided corresponding to the inverters 1623ba–1623be, respectively. The signal /TGA is commonly applied to each of the NOR circuits 1623bf to 1623bj. Decoded address key signals AKD$_6$, AKD$_4$, AKD$_7$, AKD$_3$ and AKD$_5$ are output from NOR circuits 163bf to 163bj, respectively. Partial decoder 1623b is enabled when the test group detection signal /TGA is set to the L level. More specifically, when the address signals A$_0$ and A$_1$ are set to the S level and the H level, respectively, and row address strobe signal /RAS, the column address strobe signal /CAS and the write enable signal /WE are input along the WCBR timing (special test mode set timing) and the test group detection signal /TGA is set to the L level accordingly, then, one of the address key decoded signals AKD$_6$, AKD$_4$, AKD$_7$, AKD$_3$ and AKD$_5$, which corresponds to the address key predecoded signal which attains to the H level in response to the address signals A$_2, \ldots, A_5$ among the five address key predecoded signals $AK_2 \cdot AK_3$, $/AK_2 \cdot AK_3$, $AK_4 \cdot /$ $AK_5$, $AK_2 \cdot /AK_3$, $/AK_4 \cdot AK_5$, attains to the H level.

Partial predecoder 1623c includes an NOR circuit 1623ca receiving the predecoded signals $AK_2 \cdot AK_3$ and $AK_2 \cdot /AK_3$, an NOR circuit 1623cb receiving the predecoded signals $AK_2 \cdot AK_3$ and $/AK_2 \cdot AK_3$, an NOR circuit 1623cc receiving an output signal of NOR circuit 1623ca and the signal /TGB, and an NOR circuit 1623cd receiving an output signal of NOR circuit 1623cb and the signal /TGB. NOR circuits 1623cc and 1623cd generate the decoded address key signals $AKD_1$ and $AKD_2$, respectively.

When the address signals $A_0$ and $A_1$ are set to the H level and the L level, respectively, and the row address strobe signal /RAS, the column address strobe signal /CAS and the write enable signal /WE are input along the WCBR timing (special test mode set timing) and the test group detection signal /TGB is set to the L level as a result, and if the address signals $A_2$ and $A_3$ applied at this time are both at the H level and the address key predecoded signals $AK_2 \cdot AK_3$, $AK_2 \cdot / AK_3$, $/AK_2 \cdot AK_3$, $/AK_2 \cdot AK_3$ are at the H, L and L levels, respectively, the address key decoded signals $AKD_1$ and $AKD_2$ are both set to the H level. When the address signals $A_2$ and $A_3$ are at the H level and the L level and hence address key predecoded signals $AK_2 \cdot AK_3$, $AK_2 \cdot /AK_3$, $/AK_2 \cdot AK_3$ are at the L, H and L levels, respectively, the address key decoded signals $AKD_1$ and $AKD_2$ are set to the H level and L level, respectively.

When the address signals $A_2$ and $A_3$ are at the L and H levels, respectively and the address key predecoded signals $AK_2 \cdot AK_3$, $AK_2 \cdot /AK_3$, $/AK_2 \cdot AK_3$ are at the L level, L level, H level, respectively as a result, the address key decoded signals $AKD_1$ and $AKD_2$ are set to the L level and H level, respectively.

When the address signals $A_2$ and $A_3$ are both at the L level and the address key predecoded signals $AK_2 \cdot AK_3$, $AK_2 \cdot / AK_3$, $/AK_2 \cdot AK_3$ are all at the L level, the address key decoded signals $AKD_1$ and $AKD_2$ are both set to the L level.

Figure 16:
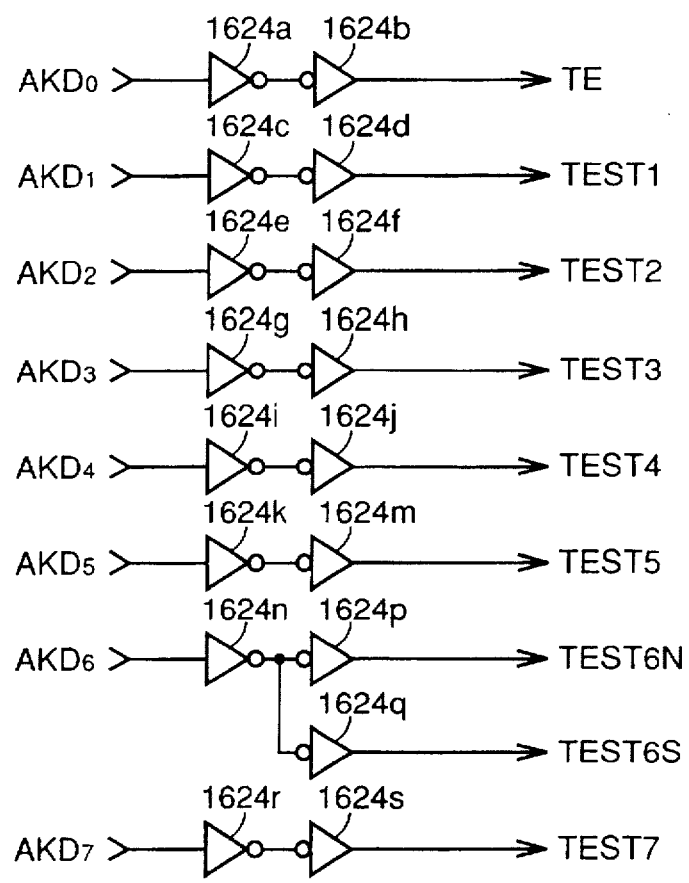
FIG. 16 is a schematic diagram of a buffer in the test mode setting signal generating circuit of the DRAM in accordance with the first embodiment of the present invention.

FIG. 16 is diagram showing a specific circuit of buffer 1624. Buffer 1624 includes an inverter 1624a receiving the signal $AKD_0$, an inverter 1624b having larger current drivability than inverter 1624a, an inverter 1624c receiving the signal $AKD_1$, an inverter 1624d having larger current drivability than inverter 1624c, an inverter 1624e receiving signal $ATD_2$, an inverter 1624f having larger current drivability than inverter 1624e, an inverter 1624g receiving signal $AKD_3$, an inverter 1624h having larger current drivability than inverter 1624g, an inverter 1624i receiving signal $AKD_4$, an inverter 1624j having larger current drivability than inverter 1624i, an inverter 1624j receiving signal $AKD_5$, an inverter 1624m having larger current drivability than inverter 1624k, an inverter 1624n receiving signal $AKD_6$, inverters 1624p and 1624q having larger current drivability than inverter 1624n, an inverter 1624r receiving signal $AKD_7$ and an inverter 1624s having larger current drivability than inverter 1624r. As the current drivability of the inverters is increased progressively to the later stages, lines for transmitting test mode setting signals TE, TEST1, TEST2, TEST3, TEST4, TEST5, TEST6N, TEST6S and TEST7 can be charged and discharged quickly.

Figure 17:
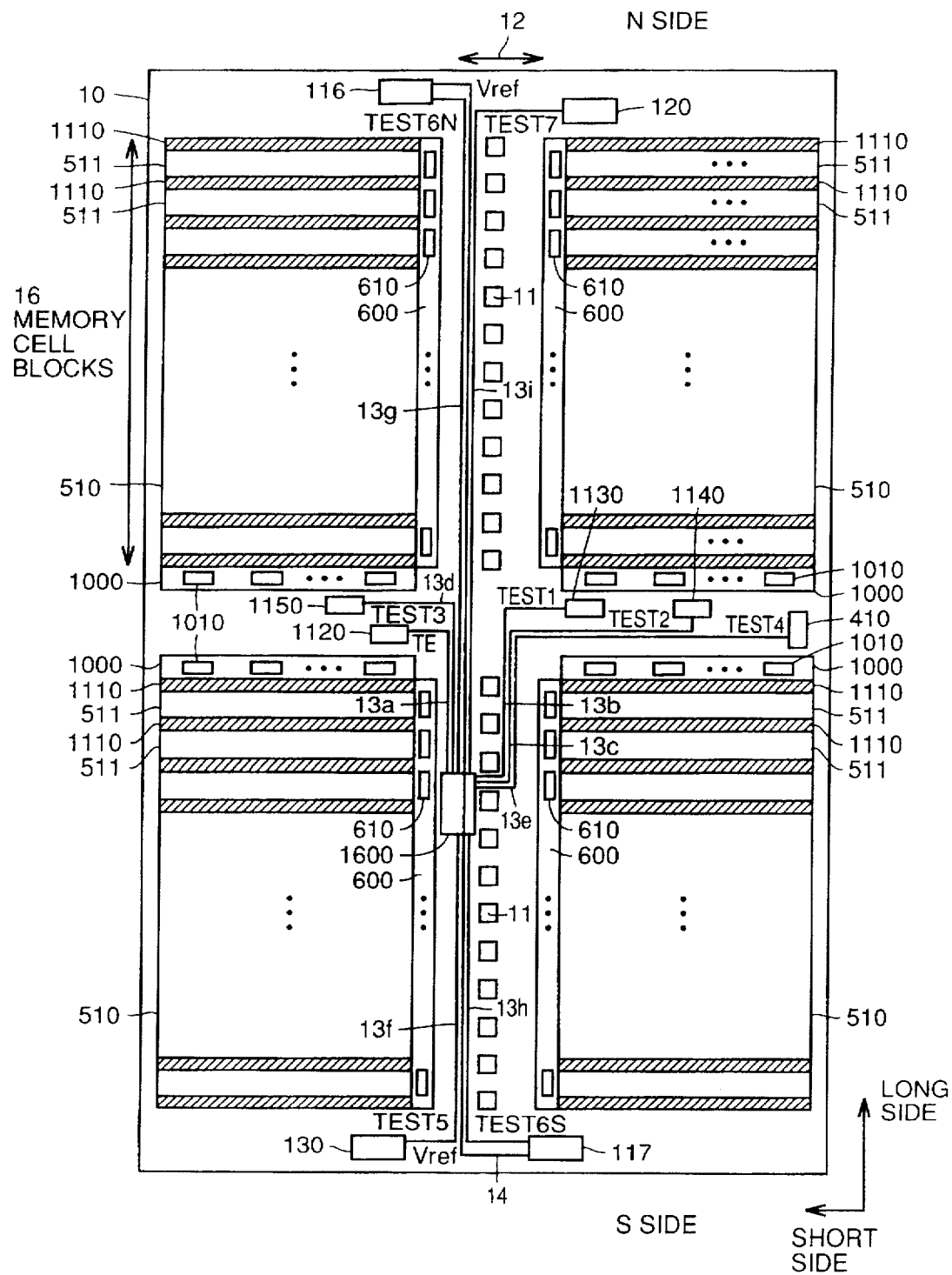
FIG. 17 is a simplified plan view of a semiconductor chip on which the DRAM in accordance with the first embodiment of the present invention is formed.

FIG. 17 is a plan view showing the schematic layout of the DRAM on a semiconductor chip. Referring to the FIG. 17, a plurality of pads, for example 24 pads 11 are arranged in a chip central band 12 along the longer side direction, which band extends along the longer side direction and positioned at the central portion of the shorter side of semiconductor chip 10.

Address signals $A_i$ and control signals such as row address strobe signal ext/RAS are input through the pads 11 to semiconductor chip 10, and data Dr is also input and output through the pads 11.

From a test mode setting circuit 1600 provided at the central band 12 of chip 10 to the corresponding test circuits, arranged along the central band 12 are test mode setting signal line 13a transmitting multibit test mode setting signal TE, test mode setting signal line 13b transmitting test mode setting signal TEST1, test mode setting signal line 13c transmitting test mode setting signal TEST2, test mode setting signal line 13d transmitting test mode setting signal TEST3, test mode setting signal line 13e transmitting test mode setting signal TEST4, test mode setting signal line 13f transmitting test mode setting signal TEST5, test mode setting signal line 13g transmitting test mode setting signal TEST6N, test mode setting signal line 13h transmitting test mode setting signal TEST6S and test mode setting signal line 13i transmitting test mode setting signal TEST7.

A reference potential line 14 transmits a reference potential Vref output from internal circuitry 117 including reference potential generating circuit 111, regulator 114 and stress mode circuit 115 shown in FIG. 3 arranged on the S (South) side of the semiconductor chip 10 to internal circuitry 116 arranged on the N (North) side of the semiconductor chip 10 including regulator 112 and stress mode circuit 113.

In a portion on the S side with respect to the test mode setting circuit 1600, reference potential line 14 is provided adjacent to, parallel to and sandwiched between test mode setting signal lines 13f and 13h. In a portion on the N side with respect to the test mode setting circuit 1600, the reference potential line 14 is provided adjacent to, parallel to and sandwiched between test mode setting signal lines 13g and 13i. In this manner, since the test mode setting signal lines which have their potentials fixed at the L level in normal mode are provided near the reference potential line 14, the test mode setting signal lines function as shield lines, preventing introduction of noise to the reference potential line 14, enabling stable transmission of reference potential Vref in a normal use. This is also true when the test mode setting signal lines are fixed at the H level in a normal use. The stress mode operation is performed before the marketing of the device by a maker, and such stress mode is not used by a user.

A boosted potential generating circuit 120 is provided on the N side of semiconductor chip 10, and receives test mode setting signal TEST7 from test mode setting circuit 1600 through test mode setting signal line 13i. When test mode setting signal TEST7 attains to the H level, boosted potential generating circuit 170 lowers the boost level of the boosted potential Vpp output therefrom, relative to the internal power supply potential intVcc (for example, when the potential is Vpp=intVcc+2·BST in normal operation, it is lowered to intVcc+BST when TEST=H). Cell plate potential generating circuit 130 is provided on the S side of semiconductor chip 10, and receives test mode setting signal TEST5 from test mode setting circuit 1600 through test mode setting circuit 1600 through test mode setting signal line 13f. When test mode setting signal TEST5 attains to the H level, the circuit 130 boosts the cell plate potential Vcp from normal (½) intVcc to intVcc.

An internal circuit 410 included in row predecoder 400 at the central portion in the longer side direction of the chip 10 receives test mode setting signal TEST4 through test mode setting signal line 13e. When the test mode setting signal TEST4 attains to the H level, the circuit 410 sets a larger number of block selection signals BSj than in the normal operation for selecting larger number of memory cell blocks 511 to raise word lines (disturb test mode) than in the normal operation.

Further, in the peripheral circuit region at the central portion in the shorter side direction of the chip 10, there are provided a multibit test circuit 1120 receiving test mode setting signal TEST4 through test mode setting signal line 13e to set data selection signals DSn for selecting 4 bits from column decoder 100 all to the selected state for writing same data to the selected 128 bits of memory cells simultaneously, determine whether 128 bits of data are the same or not and to output the result of determination to pad 11 when the test mode setting signal TEST4 attains to the H level, and internal circuits 1130, 1140 and 1150 receiving test mode setting signals TEST1, TEST2 and TEST3 through test mode setting signal lines 13b, 13c and 13d for performing respective designated test operations when the test mode setting signals TEST1, TEST2 and TEST3 attain to the H level.

Two memory mats 510 are provided on either side of the chip central band 12, that is, a total of four memory mats 510 are provided. Each memory mat 510 is divided into 16 memory cell blocks 511 by 17 sense amplifier blocks 1110. A row decoder 600 includes row decoder blocks 610 provided corresponding to respective memory cell blocks 511 and provided along the longer side direction of the chip central band 12 of each of the memory mats 510. Column decoder 100 includes a plurality of column decoder blocks 1010 provided corresponding to respective memory mats 510, and provided one for each column block including 128 pairs of bit lines (not shown).

Figure 18:
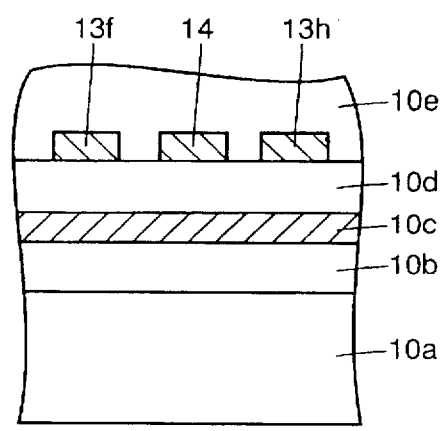
FIG. 18 illustrates a simplified cross section including a test mode setting signal line of the DRAM in accordance with the first embodiment of the present invention.

FIG. 18 is a schematic cross sectional view of a portion where the test mode setting signal lines 13f and 13h and reference potential line 14 are arranged in parallel with each other. Referring to FIG. 18, on a semiconductor substrate 10a, an insulation layer 10a, a first level metal layer 10c, and an interlevel insulation film 10d are stacked sequentially in this order. The first level metal layer 10c is formed of aluminum layer or tungsten layer, for example. Test mode setting signal lines 13f and 13h and the reference potential line 14 are formed at a second level metal (Al or W, for example) layer on the insulation layer 10d. The lines 13f, 14 and 13h are covered with an insulation layer 10e. The reference potential line 14 is interposed between the test mode setting signal lines 13f and 13h at the same level interconnection layer. The lines 13f and 13h absorb a noise to prevent the noise from being transferred to the reference potential line 14, and serve as shield lines.

As described above, in the first embodiment, the multibit test mode standardized by the JEDEC can be set, in addition, the multibit test mode can be set simultaneously with a special test mode, and hence time necessary for the special test can be reduced.

Further, it is necessary to set one of the address signals $A_0$ and $A_1$ to the S level and the other to the H level to set the special test mode. Therefore, even when a high voltage is applied erroneously, then the address signals $A_0$ and $A_1$ both attain to the S level, and therefore erroneous setting of the special test mode can be avoided.

What is necessary for the above-described operation is only the super H level detection circuits 1612a and 1621b having load circuits 1621ah and 1621bh which are normally conductive for the address signals $A_0$ and $A_1$, and these are not provided for address signals $A_2, \ldots, A_6$. Setting of a special test mode can be done simply by the address keys of address signals $A_2, \ldots, A_6$. Therefore, power consumption can be reduced and increase in circuit area can be suppressed.

Further, since the timing detection signal TDC attains to the H level after the test group detection assisting signals $SV_0$, $HV_0$, $SV_1$ and $HV_1$ are established and the test group detection signals /TGA, /TGB attain to the L level in response thereto, erroneous setting can be prevented.

Further, the test mode setting signal is held by latching the address key signals and not by the latching at a buffer 1624 at a later stage which is required to drive a high load, the latch circuit can be provided by a small logic gate having smaller current drivability, that is, one having smaller size, and hence the area of the test mode setting circuit 1600 can be made smaller.

Second Embodiment

A DRAM in accordance with a second embodiment of the present invention will be described with reference to FIGS. 19 to 24. The DRAM of the second embodiment differs from the DRAM of the first embodiment in that the test mode setting signal generating circuit 1620 of the test mode setting circuit 1600 has a different structure, and the layout of components on the chip differs due to the structural difference. Only the differences will be described in the following.

Figure 19:
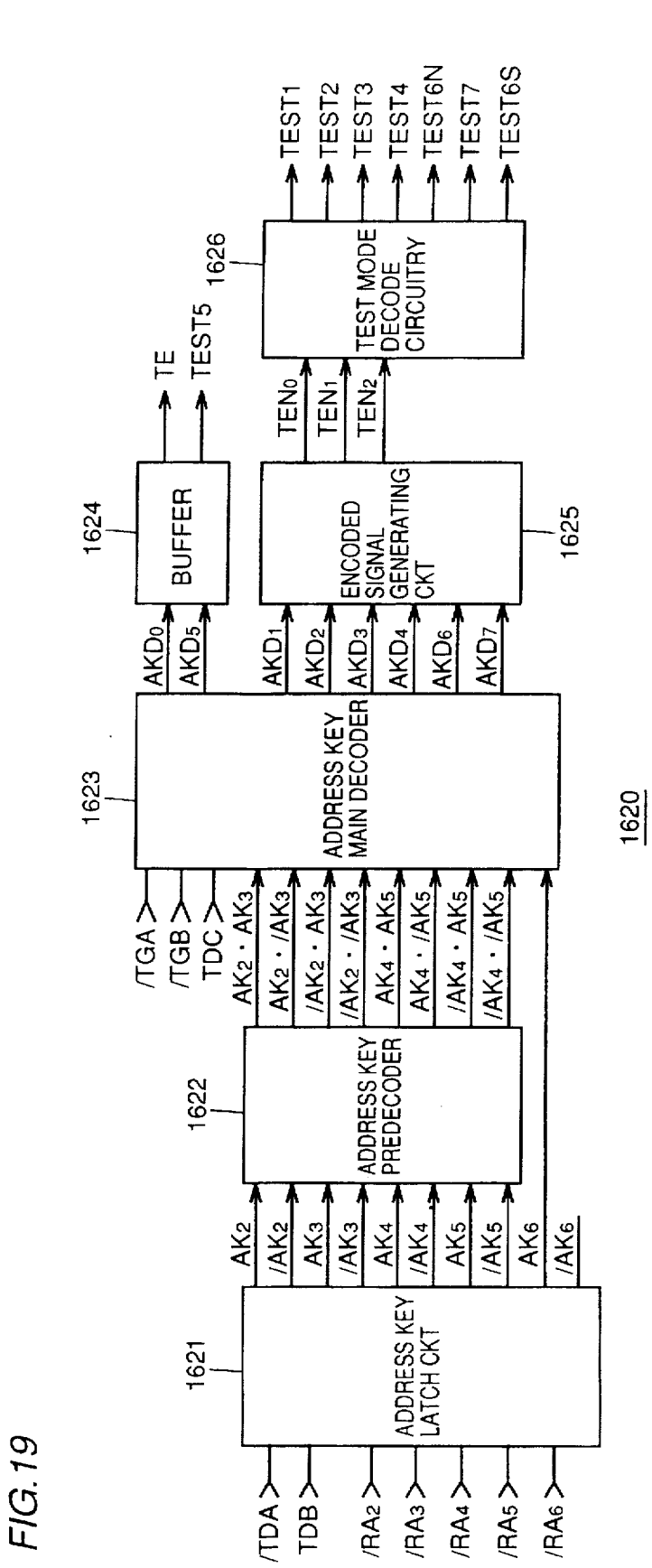
FIG. 19 is a block diagram of the test mode setting signal generating circuit in the test mode setting circuit of the DRAM in accordance with a second embodiment of the present invention.

FIG. 19 is a block diagram showing a test mode setting signal generating circuit 1620 in the test mode setting circuit 1600 of the DRAM in accordance with the second embodiment. Test mode setting signal generating circuit 1620 differs from the test mode setting signal generating circuit 1620 of the first embodiment shown in FIG. 12 in that buffer 1624 has a different structure (FIG. 20), that an encoded signal generating circuit 1625 (FIG. 21) receiving six address key decoded signals $AKD_1$, $AKD_2$, $AKD_3$, $AKD_4$, $AKD_6$ and $AKD_7$ for generating a smaller number of three test mode encoded signals $TEN_0$, $TEN_1$ and $TEN_2$ in accordance with the address key decoded signals $AKD_1$, $AKD_2$, $AKD_3$, $AKD_4$, $AKD_6$ and $AKD_7$ is provided, and that test mode decode circuitry 1626 (FIG. 22) is provided which receives three test mode encoded signals $TEN_0$, $TEN_1$ and $TEN_2$ for outputting a larger number of seven test mode setting signals TEST1, TEST2, TEST3, TEST4, TEST6N, TEST7 and TEST6S. Only the differences will be described in the following.

Figure 20:
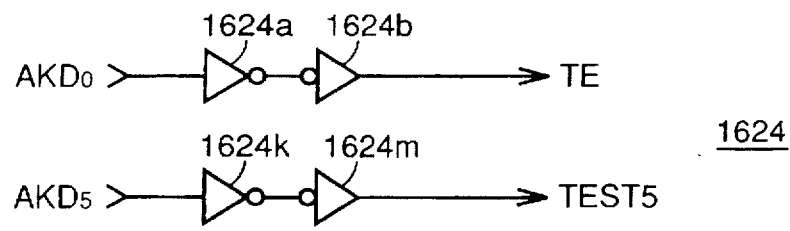
FIG. 20 is a schematic diagram of a buffer in the test mode setting signal generating circuit of the DRAM in accordance with the second embodiment of the present invention.

FIG. 20 is a diagram showing a schematic structure of buffer 1624 in the test mode setting circuit 1600 of the DRAM in the second embodiment. The buffer 1624 differs from the buffer 1624 in accordance with the first embodiment shown in FIG. 16 in that inverters 1624a and 1624b receiving address key decoded signal $AKD_0$ for outputting a multibit test mode setting signal TE, and inverters 1624k and 1624m receiving address key decoded signal $AKD_5$ for outputting test mode setting signal TEST5 are provided only, and inverters for the other decoded address key signals are excluded.

Figure 21:
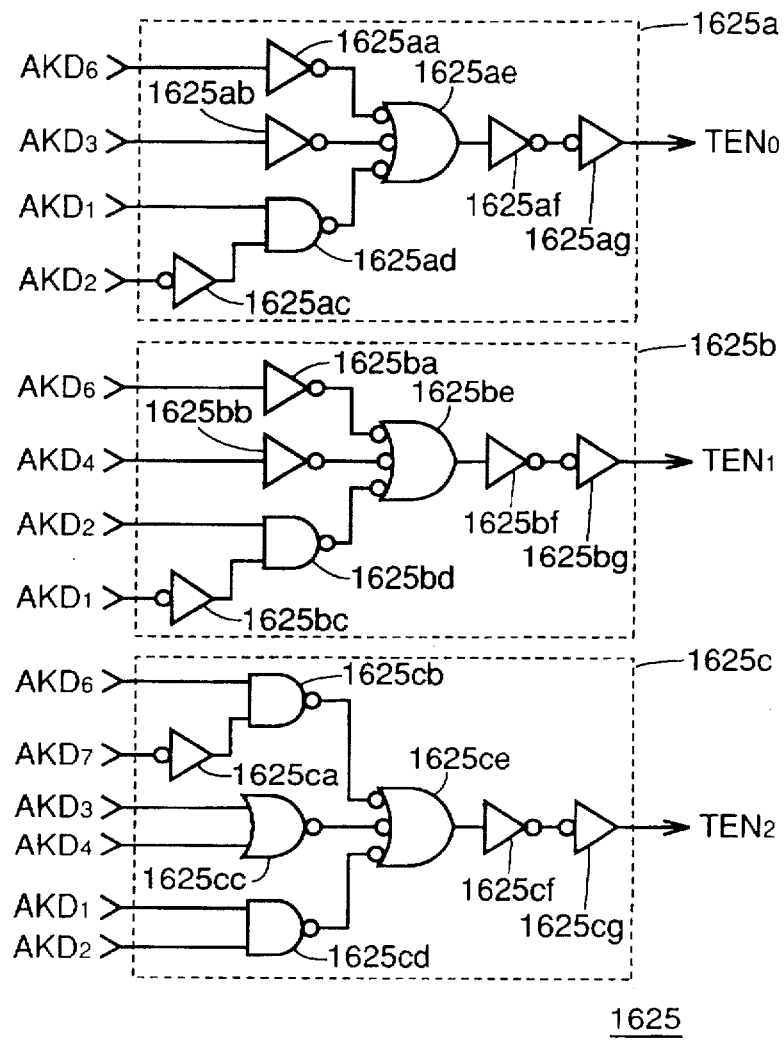
FIG. 21 is a schematic diagram of an encoded signal generating circuit in the test mode setting signal generating circuit of the DRAM in accordance with the second embodiment of the present invention.

FIG. 21 is a diagram schematically showing an encoded signal generating circuit 1625 in the test mode setting circuit 1600 in the DRAM in accordance with the second embodiment. The encoded signal generating circuit 1625 includes a partial encoder 1625a receiving address key decoded signals $AKD_6$, $AKD_3$, $AKD_1$ and $AKD_2$ for outputting test mode encoded signal $TEN_0$ which attains to the H level when the address key decoded signal $AKD_6$ is at the H level, when address key decode signal $AKD_3$ is at the H level or when the address key decoded signals $AKD_1$ and $AKD_2$ are at the H and L levels, respectively; a partial encoder 1625b receiving address key decoded signals $AKD_6$, $AKD_4$, $AKD_2$ and $AKD_1$ for outputting a test mode encoded signal $TEN_1$ which attains to the H level when address key decoded signal $AKD_6$ is at H level, when address key decoded signal $AKD_4$ is at the H level, or when the address key decoded signals $AKD_2$ and $AKD_1$ are at the H and L levels, respectively; and a partial encoder 1625c receiving address key decoded signals $AKD_6$, $AKD_7$, $AKD_3$, $AKD_4$, $AKD_1$ and $AKD_2$ for outputting a test mode encoded signal $TEN_2$ which attains to the H level when the address key decoded signals $AKD_6$ and $AKD_7$ are at the H and L levels, respectively, when at least one of address key decoded signals $AKD_3$ and $AKD_4$ is at the H level, or when the address key decoded signals $AKD_1$ and $AKD_2$ are both at the H level.

Partial encode circuit 1625a includes an inverter 1625aa receiving the decoded address key signal $AKD_6$, an inverter 1625ab receiving the decoded address key signal $AKD_3$, an inverter 1625ac receiving the decoded address key signal $AKD_2$, an NAND circuit 1625ad receiving the decoded address signal $AKD_1$ and an output signal of inverter 1625ac, a three-input NAND circuit 1625ae receiving output signals of inverters 1625aa, 1625ab and NAND circuit 1625ad, and cascaded two inverters 1625af and 1625ag receiving an output of NAND circuit 1625ae. Inverter 1625ag generates the encoded test mode signal $TEN_0$.

Partial encode circuits 1625b and 1625c each have the same configuration as the partial encode circuit 1625a, and corresponding components are allotted with same reference characters except the first suffix indicating a corresponding partial encode circuit.

Figure 22:
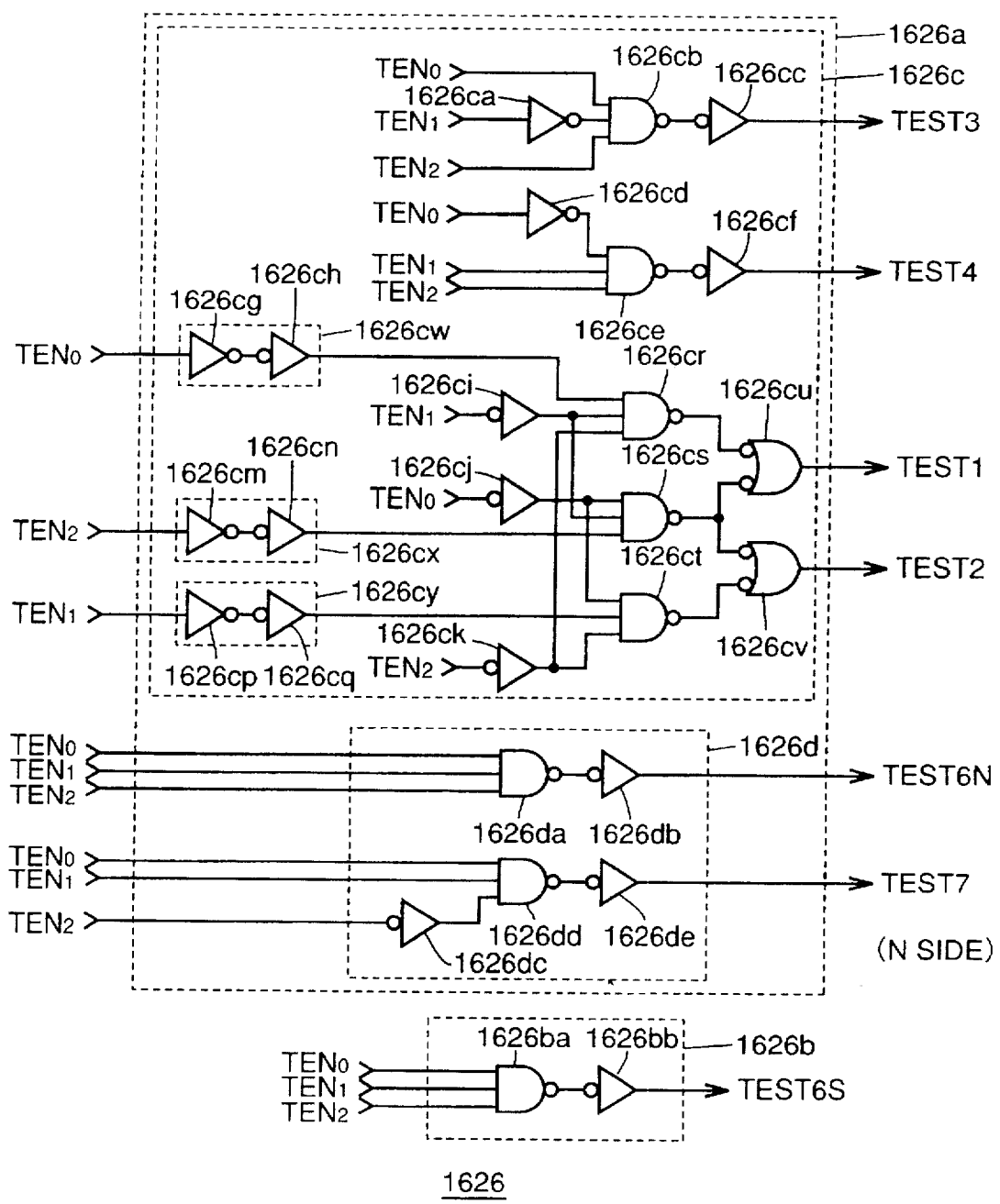
FIG. 22 is a schematic diagram of test mode decode circuitry of the test mode setting signal generating circuit of the DRAM in accordance with the second embodiment of the present invention.

FIG. 22 is a schematic diagram showing test mode decode circuitry 1626 of test mode setting circuit 1600 in the DRAM in accordance with the second embodiment. Test mode decode circuitry 1626 includes a test mode decode circuit 1626a receiving and decoding three test mode encoded signals $TEN_0$, $TEN_1$ and $TEN_2$ for outputting six test mode setting signals TEST3, TEST4, TEST1, TEST2, TEST6N and TEST7, arranged on N side of the semiconductor chip relative to encode signal generating circuit 1625, and a test mode decode circuit 1626b receiving test mode encoded signals $TEN_0$, $TEN_1$ and $TEN_2$ for outputting a test mode setting signal TEST6S which attains to the H level when the test mode encoded signals $TEN_0$, $TEN_1$ and $TEN_2$ are all at the H level.

Test mode decode circuit 1626b includes an NAND circuit 1626ba receiving signals $TEN_0$, $TEN_1$ and $TEN_2$ and an inverter 1626b receiving an output signal of NAND circuit 1626ba, and functions as a 3-input AND circuit.

The test mode decode circuit 1626a includes a local test mode decode circuit 1626c receiving and decoding the encoded test mode signals $TEN_0$–$TEN_2$ to generate the test mode setting signals TEST1–TEST4, and a local test mode decode circuit 1626d receiving and decoding the encoded test mode signals $TEN_0$–$TEN_2$ to generate the test mode setting signals TEST6N and TEST7.

Local test mode decode circuit 1626c includes an inverter receiving and inverting the signal $TEN_1$, an NAND circuit receiving an output signal of inverter 1626ca and the signals $TEN_0$ and $TEN_2$, an inverter 1626cc receiving and inverting an output signal of NAND circuit 1626cb to generate the test mode setting signal TEST3, an inverter 1626cd receiving and inverting the signal $TEN_0$, and an AND gate formed of an NAND circuit 1626ce and an inverter 1626cf and receiving an output signal of inverter 1626cd and the signals $TEN_1$ and $TEN_2$ to generate the test mode setting signal TEST4.

Test mode setting signal TEST3 is made high when the signals $TEN_0$ and $TEN_2$ are both at H level and the signal $TEN_1$ is at L level. Test mode setting signal TEST4 is made high when the signal $TEN_0$ is at L level and the signals $TEN_1$ and $TEN_2$ are both at H level.

Local test mode decode circuit 1626c further includes a delay circuit 1626cw delaying the signal $TEN_0$, a delay circuit 1626cx delaying the signal $TEN_1$, a delay circuit 1626cy delaying the signal $TEN_2$, inverters 1626ci, 1626cj and 1626ck receiving and inverting the signals $TEN_1$, $TEN_0$ and $TEN_2$ respectively, an NAND circuit 1626cr receiving the output signals of delay circuits 1626cw and inverters 1626ci and 1626ck, an NAND circuit 1626cs receiving the output signals of inverters 1626ci and 1626cj and delay circuit 1626cx, an NAND circuit 1626ct receiving the output signals of delay circuit 1626cy and inverters 1626cj and 1626ck, an NAND circuit 1626cu receiving the output signals of NAND circuits 1626cr and 1626cs to generate the signal TEST1, and an NAND circuit 1626cv receiving the output signals of NAND circuits 1626cs and 1626ct to generate the signal TEST2.

Delay circuit 1626cw includes cascaded inverters 1626cg and 1626ch, delay circuit 1626cx includes cascaded inverters 1626cm and 1626cn, and delay circuit 1626cy includes cascaded inverters 1626cp and 1626cq. Delay circuits 1626cw, 1626cx and 1626cy are provided to prevent generation of a whisker-like pulse from NAND circuits 1626cr, 1626cs and 1626ct due to clock skew on the encoded test mode signals $TEN_0$–$TEN_2$.

Signals TEST1 and TEST2 are made high and low respectively when the signals $TEN_0$, $TEN_1$ and $TEN_2$ are at H, L, and L levels respectively, and are made low and high respectively when the signals $TEN_0$, $TEN_1$ and $TEN_2$ are at L, H, and L levels, respectively, and are both made high when the signals $TEN_0$, $TEN_1$ and $TEN_2$ are at L, L, and H levels respectively.

Signal TEST3 is made high when the signals $TEN_0$, $TEN_1$ and $TEN_2$ are at H, L, and H levels, respectively.

Signal TEST4 is made high when the signals $TEN_0$, $TEN_1$ and $TEN_2$ are at L, H, and H levels, respectively.

Local test mode decode circuit 1626d includes an NAND circuit 1626da receiving the signals $TEN_0$–$TEN_2$, an inverter 1626db receiving an output signal of NAND circuit 1626da, an inverter 1626dc receiving and inverting the signal $TEN_2$, an NAND circuit 1626dd receiving an output signal of inverter 1626dc and the signals $TEN_0$ and $TEN_1$, and an inverter 1626de receiving and inverting an output signal of NAND circuit 1626dd to generate the signal TEST7. Inverter 1626db generates the signal TEST6N.

Test mode setting signal TEST6N is made high only when the signals $TEN_0$–$TEN_2$ are all at H levels.

Test mode setting signal TEST7 is made high when the signals $TEN_0$ and $TEN_1$ are both at H levels, and the signal $TEN_2$ is at L level.

Figure 23:
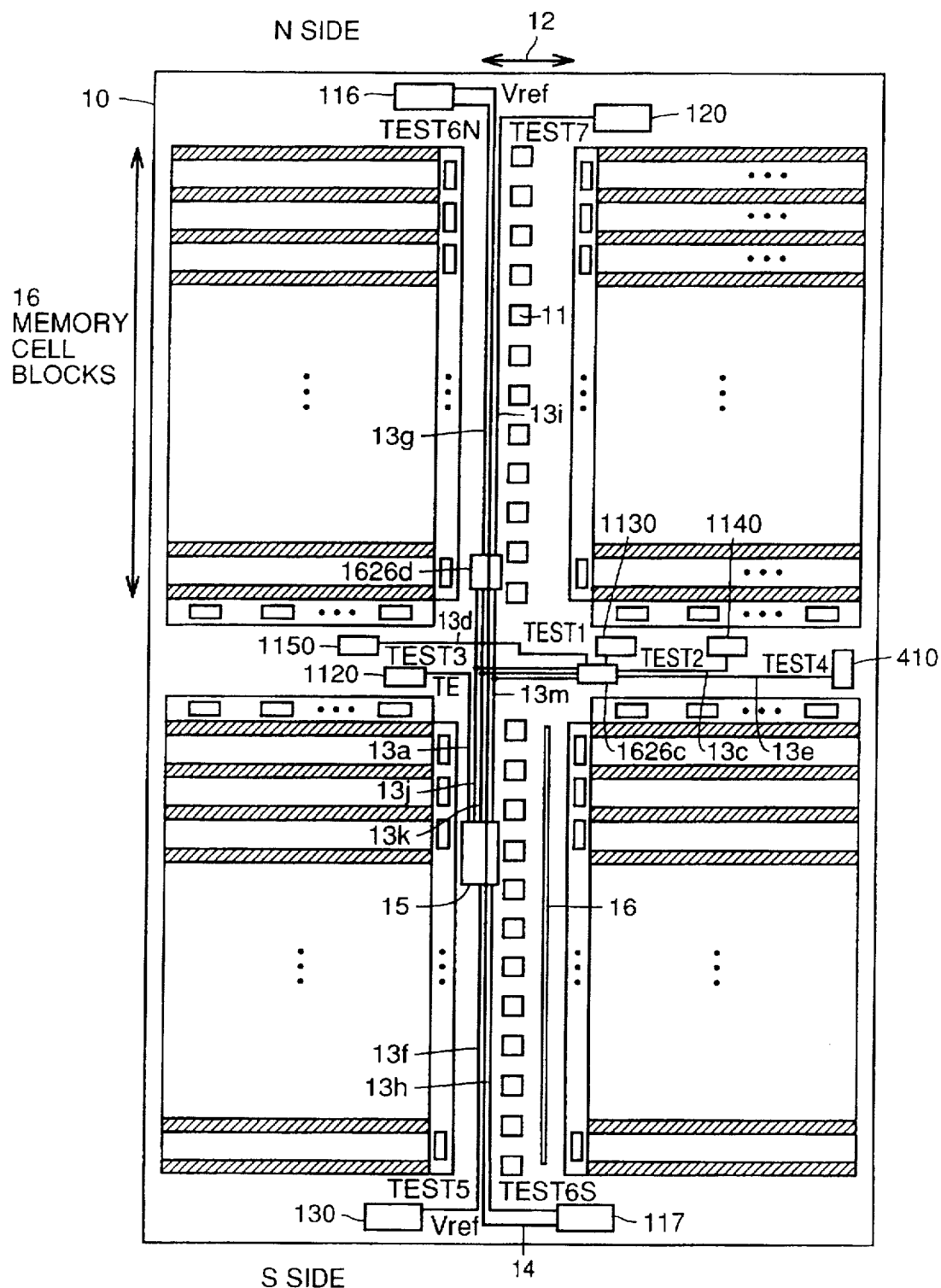
FIG. 23 is a simplified plan view of a semiconductor chip on which the DRAM in accordance with the second embodiment of the present invention is formed.

FIG. 23 is a plan view schematically showing a layout of the semiconductor chip of the DRAM in accordance with the second embodiment. Referring to FIG. 23, a test circuit 15 has a state detecting circuit 1610 in test mode setting circuit 1600, an address key latch circuit 1621 in test mode setting signal generating circuit 1620, an address key predecoder 1622, an address key main decoder 1623, a buffer 1624 and an encoded signal generating circuit 1625, as well as test mode decoding circuit 1626b in test mode decode circuitry 1626 of test mode setting signal generating circuit 1620. Three encoded signal lines 13j, 13k and 13m transmitting test mode encoded signals $TEN_0$, $TEN_1$ and $TEN_2$ output from encoded signal generating circuit 1625 of test circuit 15 are arranged at the central band 12 to extend from test circuit 15 to the N side of semiconductor chip 10.

These encoded signal lines 13j, 13k and 13m are coupled to local test mode decoder 1626d arranged at central band area 12 at N side portion from a center of the chip long side, and to the local test mode decoder 1626c arranged at a center portion in the long and short side directions of the chip 10.

The local test mode decode circuit 1626c and 1626d receive test mode encoded signals $TEN_0$, $TEN_1$ and $TEN_2$ from encoded signal lines 13j, 13k and 13m, and output test mode setting signals TEST1, TEST2, TEST3, TEST4 and test mode setting signals TEST6N and TEST7 in accordance with the test mode encoded signals, to internal circuits 1130, 1140, 1150, 410 and internal circuits 116 and 120, which are provided on the N side of semiconductor chip 10 relative to the test circuit 15 having the encoded signal generating circuit 1625.

The encoded signal lines 13j, 13k and 13m do not extend to the S side of semiconductor chip 10 relative to test circuit 15. The test mode setting signal TEST6S to be output to the internal circuit 117 on the S side is generated by decoding the test mode encoded signals $TEN_0$, $TEN_1$ and $TEN_2$ separately by test mode decode circuit 1626b (see FIG. 22) of test circuit 15, in order to set test mode setting signals TEST6N and TEST6S to the H level at the same timing, so that the internal circuitry 116 on the N side and the internal circuitry 117 on the S side can operate in the stress test mode operation at the same timing.

As for the reference potential line 14 for transmitting the reference potential Vref output from internal circuitry 117 provided on the S side of semiconductor chip 10 to the internal circuitry 116 provided on the N side of semiconductor chip 10, on the S side relative to test circuit 15, it is adjacent to, parallel to and sandwiched by test mode setting signal line 13f and 13h which are formed by the same second level metal layer (for example an aluminum layer or tungsten layer) as the reference potential line 14. At the central portion between test circuit 15 and local test mode decode circuit 1626d where various signal lines such as row address signals and column address signals (not shown) are arranged, it is adjacent to, parallel to and sandwiched by encoded signal lines 13k and 13m which are formed by the second level metal layer (for example, Al or W layer), that is, the same layer as the reference potential line 14.

Further, on the N side relative to local test mode decode circuit 1626d, the reference potential line 14 is arranged adjacent to, parallel to and sandwiched by test mode setting signal lines 13g and 13i formed by the second level metal layer (for example, Al or W layer), which is the same layer as the reference potential line 14. Therefore, the reference potential line 14 is shielded by the test mode clock lines (test mode setting signal lines and encoded signal lines) which are fixed at the L level in normal operation. Therefore, noises are prevented from being introduced to the reference potential line 14. The same is true even when the test mode clock lines are fixed at the H level in the normal operation.

Further, the test mode setting signals are transmitted in encoded form, by three encoded signal lines 13j, 13k and 13m which are smaller in number than the test mode setting signals TEST1, TEST2, TEST3, TEST4, TEST6N and TEST7. In the DRAM in accordance with the first embodiment shown in FIG. 17, there are seven test mode setting signal lines 13a, 13b, 13c, 13d, 13e, 13g and 13i extending to the N side of semiconductor chip 10 from test mode setting circuit 1600. Meanwhile, there are only four lines, that is, encoded signal lines 13j, 13k and 13m as well as test mode setting signal line 13a extending from the test circuit 15 to the N side of the semiconductor chip 10 in the DRAM in accordance with the second embodiment. Therefore, the area necessary for extending the lines can be reduced. Specially in the structure in which pads 11 are arranged at the central band 12 of semiconductor chip 10 as in the second embodiment, a large area of the chip central band 12 is occupied by pads 11 and by various lines such as lines for transmitting output data to the pads 11 and for transmitting address signals received from the pads 11. Therefore, reduction in number of lines realized by encoding the test mode setting signals has significant effect.

Further, regardless of the positions of the pads 11 (central arrangement, peripheral arrangement), generally in a DRAM, lines for transmitting row address predecoded signals and column address predecoded signals extending laterally and longitudinally on the semiconductor chip 10 cross with each other near the center of the semiconductor chip 10. Therefore, there is a very little margin to additionally arrange extra lines. Thus, even when the test mode setting signals are to be transmitted through the central portion of the chip, reduction in number of lines realized by encoding the test mode setting signals has a significant effect.

As the number of lines extending to the N side of the semiconductor chip 19 from test circuit 15 is reduced as the test mode setting signals are transmitted in an encoded form, it becomes possible to make wider and thicker the power supply lines 16 such as external power supply potential line transmitting the external power supply potential extVcc, internal power supply potential line transmitting internal power supply potential intVcc and the ground potential line transmitting the ground potential GND, and hence the resistance value of power supply lines 16 can be reduced and the voltage drop thereon can also be reduced. Therefore, stable power supply potentials (including ground potential) can be transmitted to various portions of the semiconductor chip 10.

Further, when the test mode setting signals TEST1, TEST2, TEST3, TEST4 are decoded near the center of the semiconductor chip 10 by local test mode decode circuit 1626c, it is not very advantageous to transmit the remaining two test mode setting signals TEST6N and TEST7 to the N side of semiconductor chip 10 by using three encoded signal lines 13j, 13k and 13m in terms of the number of signal lines. Thus, local test mode decode circuit 1626d is provided nearer to the local test mode decode circuit 1626c than to the internal circuits 116 and 120 corresponding to the test mode setting signals TEST6N and TEST7.

FIG. 24 is a decode table indicating which of the test mode setting signals TEST1, TEST2, TEST3, TEST4, TEST6N and TEST7 is activated to the H level in accordance with the states of test mode encoded signals. When test mode encoded signals $TEN_0$, $TEN_1$ and $TEN_2$ are at the L level, L level and L level, none of the test modes is activated; when these are at L, L and H levels, test mode setting signals TEST1 and TEST2 are set to the H level; when these are at L, H and L levels, test mode setting signal TEST2 is set to the H level; when these are L, H and H levels, test mode setting signal TEST4 is set to the H level; when these are at H, L and L levels, test mode setting signal TEST1 is set to the H level; when these are H, L and H levels, test mode setting signal TEST3 is set to the H level; when these are H, H and L levels, test mode setting signal TEST7 is set to the H level; and when these are at the H, H and H levels, test mode setting signal TEST6N is set to the H level.

In this manner, generally, by using n test mode encoded signals, $2^n-1$ combinations of test mode setting signals which are activated can be designated, except one combination in which none of the test mode setting signals is activated. Further, as the test mode setting signal, such as the multibit test mode setting signal TE, which is activated together with various test mode setting signals is not encoded but used independently, the structures of encoded signal generating circuit 1625 and test mode decode circuitry 1626 are not so complicated.

In the first embodiment, there are the following modes as shown in FIG. 7. When address signals $A_0$, $A_1$, $A_2$, $A_3$, $A_4$, and $A_5$ are at S, H, L, H, H and L levels, respectively, test mode setting signals TEST4 and TEST7 are both activated to the H level. When address signals $A_0$, $A_1$, $A_2$, $A_3$, $A_4$, and $A_5$ are at the S, H, H, L, H and L levels, test mode setting signals TEST3 and TEST7 are both activated to the H level. When address signals $A_0$, $A_1$, $A_2$, $A_3$, $A_4$, and $A_5$ are at S, H, H, H, H and L levels, test mode setting signals TEST6N and TEST7 are both activated to the H level. However, since these three modes are not used, the test modes are compressed, so as to enable setting of 7 available test modes by three encoded signa lines 13j, 13k and 13m. However, the compressed test mode setting signals are only those which are transmitted through the central portion of semiconductor chip 10 where other signal lines are concentrated. Therefore, it does not extremely limit the combinations of test mode setting signals which are activated simultaneously.

As described above, in the DRAM in accordance with the second embodiment, similar effects as in the DRAM of the first embodiment can be obtained. Further, since six test mode setting signals TEST1, TEST2, TEST3, TEST4, TEST6N and TEST7 are turned into three test mode encoded signals $TEN_0$, $TEN_1$ and $TEN_2$ which are smaller in number than the test mode setting signals and transmitted through a smaller number of encoded signal lines 13j, 13k and 13m to internal circuitry 1130, 1140, 1150, 410, 116 and 120, the test mode setting signals TEST1, TEST2, TEST3, TEST4, TEST6N and TEST7 can be transmitted with smaller area for lines.

Further, since test mode setting signals TEST1, TEST2, TEST3, TEST4, TEST6N and TEST7 can be transmitted in smaller line occupation area as the signals are encoded, larger number of test modes can be set even in a semiconductor chip 10 which has only a small area for providing lines at the central band 12 where a plurality of pads 11 are arranged.

Further, since test mode setting signals TEST1, TEST2, TEST3, TEST4, TEST6N and TEST7 can be transmitted in smaller line occupation area as the signals are encoded, it is possible to transmit test mode setting signals TEST1, TEST2, TEST3, TEST4, TEST6N and TEST7 through the central portion of semiconductor chip 10 where various signal lines are concentrated.

Further, as the number of lines for transmitting test mode setting signals TEST1, TEST2, TEST3, TEST4, TEST6N and TEST7 can be reduced by encoding them, it becomes possible to make wider and thicker or to increase power supply line 16 in number for reinforcement thereof, and hence stable power supply potentials (including ground potential) can be supplied to various portions of the semiconductor chip.

Further, the test mode setting signals transmitted by the encoded signal lines extending through the central portion of semiconductor chip 10 where various signal lines are concentrated are only the test mode setting signals TEST1, TEST2, TEST3, TEST4, TEST6N and TEST7, the combination of test mode setting signals which are activated simultaneously are not much limited.

Since the multibit test mode setting signal which is activated together with another test mode setting signal is not encoded, it is not necessary to provide a combination of encoded signals for activating the multibit test mode setting signal simultaneously with the other test mode setting signal, and hence a larger number of test mode setting signals can be transmitted through a limited number of encoded signal lines.

Further, encoded signal lines 13j, 13k, and 13m are not directly input to the internal circuitry 1130, 1140, 1150, 410, 116, 120 but input as decoded test mode setting signals TEST1, TEST2, TEST3, TEST4, TEST6N and TEST7 corresponding to the internal circuits 1130, 1140, 1150, 410, 116 and 120 by test mode decode circuit 1626a, and input to internal circuits 1130, 1140, 1150, 410, 116, 120. Therefore, extra area occupied by encoded signal lines near the internal circuits 1130, 1140, 1150, 410, 116 and 120 can be prevented, the internal circuits 1130, 1140, 1150, 410, 116 and 120 themselves do not need to have decoding circuitry, and hence increase in area of occupation can be avoided.

The test mode setting signals TEST1, TEST2, TEST3 and TEST4 are obtained through the decoding by local test mode decode circuit 1626c near the center of semiconductor chip 10. When the remaining two test mode setting signals TEST6 and TEST7 are to be transmitted to N side of semiconductor chip 10, these setting signals are transmitted not through the three encoded signal lines 13j, 13k and 13m, but local test mode decode circuit 1626d is provided at a position nearer to the local test mode decode circuit 1626c than to the internal circuits 116 and 120 corresponding to the test mode setting signals TEST6N and TEST7, and it decodes the encoded signals to generate test mode setting signals TEST6N and TEST7, which are transmitted through two test mode setting signal lines 13g and 13i. Therefore, increase in line area can be suppressed.

Third Embodiment

The DRAM in accordance with a third embodiment of the present invention will be described with reference to FIGS. 25 and 26. The DRAM of the third embodiment differs from the DRAM of the second embodiment in that the test mode decode circuitry 1626 in test mode setting signal generating circuit 1620 of test mode setting circuit 1600 has a different structure, the layout is different because of the structural difference, and the layout of internal circuitry 410 receiving the test mode setting signal TEST4 is changed. Only the differences will be described in the following.

Figure 25:
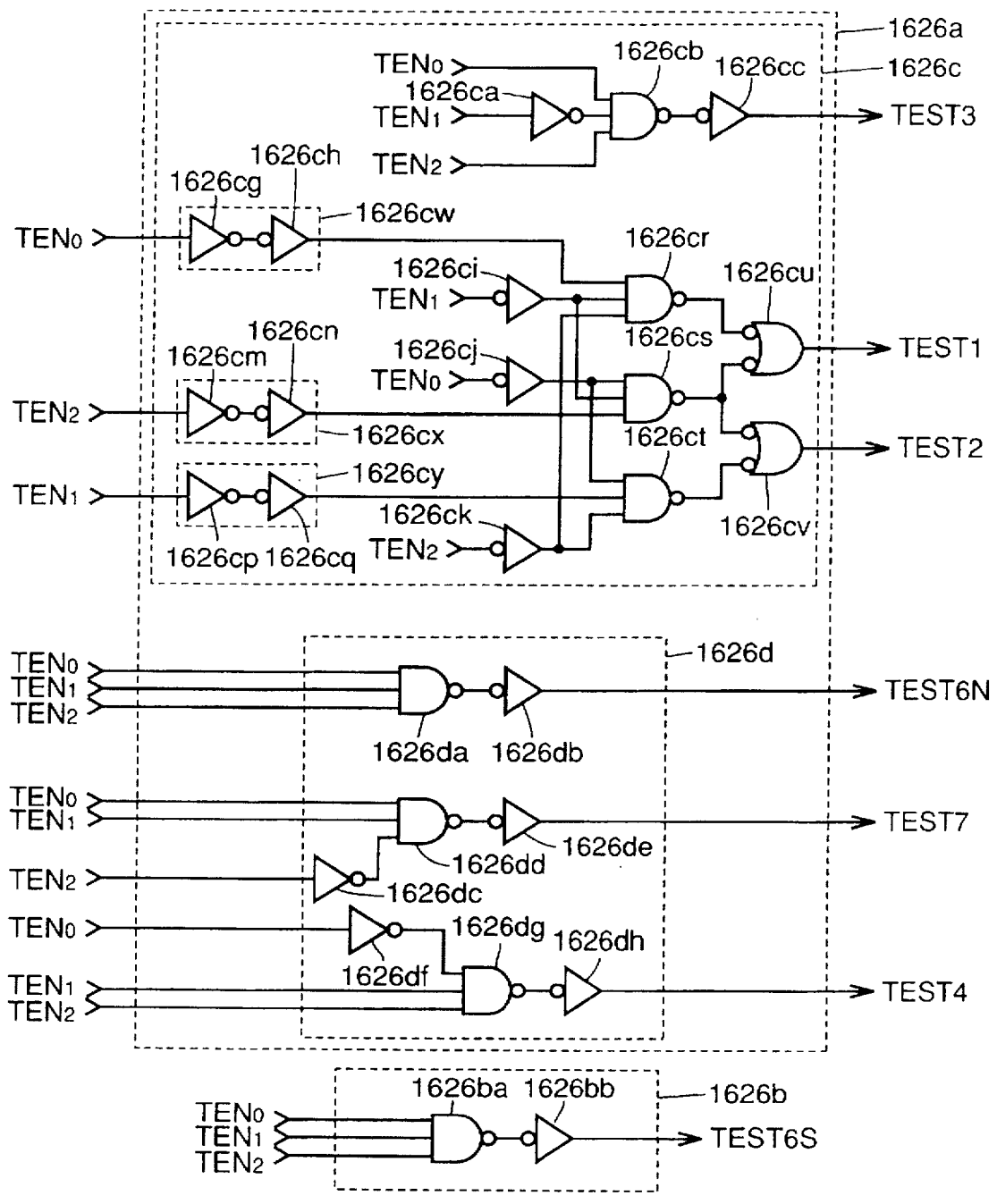
FIG. 25 is a schematic diagram of test mode decode circuitry in the test mode setting signal generating circuit of the DRAM in accordance with a third embodiment of the present invention.

FIG. 25 is a schematic diagram showing a test mode decode circuitry 1626 in test mode setting signal generating circuit 1620 of test mode setting circuit 1600 of the DRAM in accordance with the third embodiment. Test mode decode circuitry 1626 differs from test mode decode circuitry 1626 of the second embodiment shown in FIG. 22 in that inverter 1626cd, NAND circuit 1626ce and inverter 1626cf for generating test mode setting signal TEST4 in local test mode decode circuit 1626c of test mode decode circuit 1626a are eliminated, and that inverter 1626df, NAND circuit 1626dg and inverter 1626dh for generating test mode setting signal TEST4 in accordance with the signals $TEN_0$, TEN, and $TEN_2$ are newly provided in local test mode decode circuit 1626d of test mode decode circuit 1626a.

Figure 26:
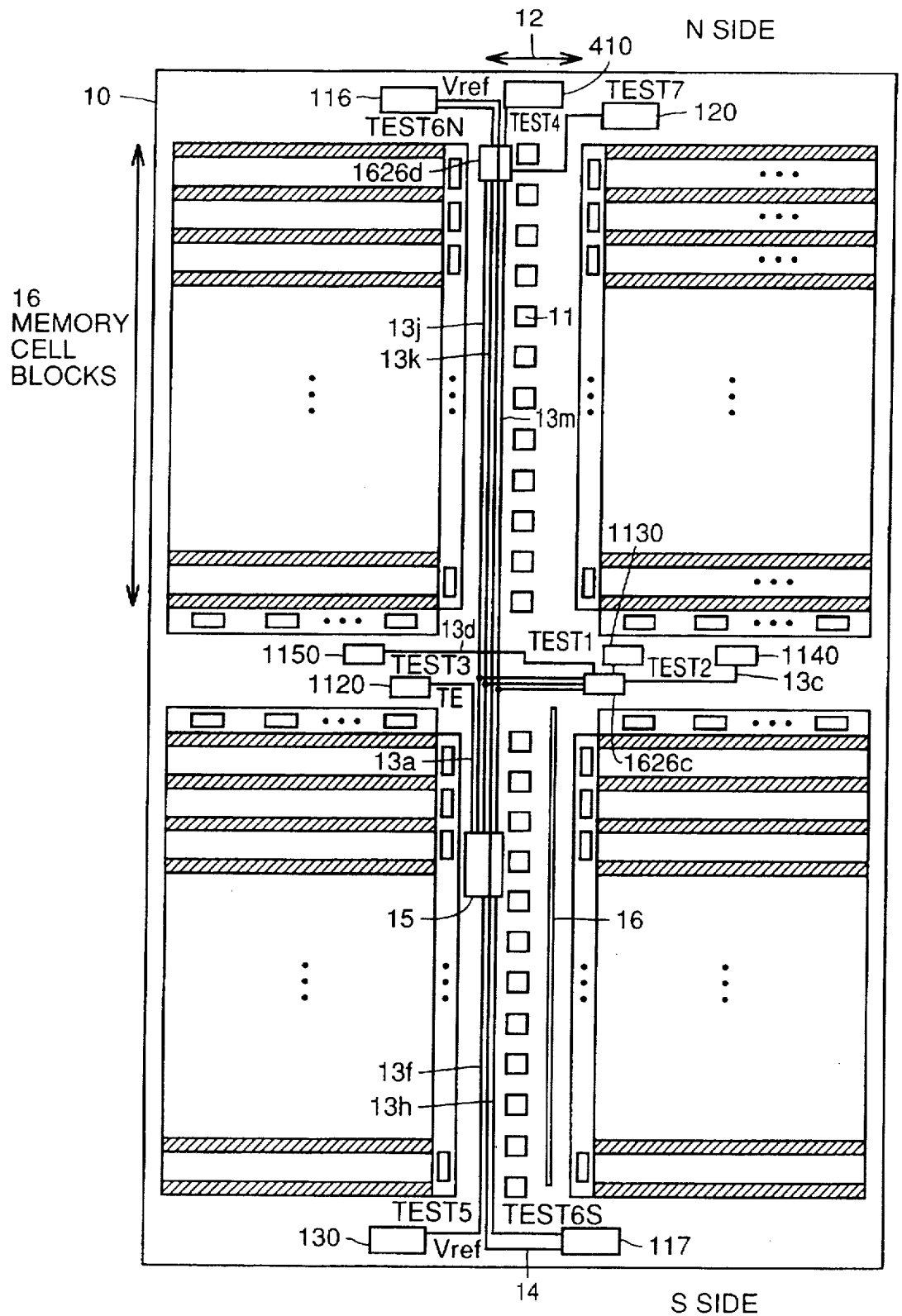
FIG. 26 is a simplified plan view of a semiconductor chip on which the DRAM in accordance with the third embodiment of the present invention is formed.

FIG. 26 is a schematic plan view showing the layout on the semiconductor chip of the DRAM in accordance with the third embodiment. Referring to FIG. 26, it differs from the plan view of the DRAM in accordance with the second embodiment shown in FIG. 23 in (1) that internal circuitry 410 receiving test mode setting signal TEST4 is moved to an end portion on the N side of semiconductor chip 10, (2) that, accordingly, the local test mode decode circuit 1626c having different circuit structure does not output test mode setting signal TEST4 but the local test mode decode circuit 1626d having different circuit structure output the test mode setting signal TEST4, and (3) that the local test mode decode circuit 1626d is provided at a portion near the N side end. When three test mode encoded signals TEN$_0$, TEN$_1$ and TEN$_2$ are decoded by local test mode decode circuit 1626c near the center of semiconductor chip 10 and three test mode setting signals TEST1, TEST2 and TEST3 are provided, the three test mode setting signals TEST4, TEST6N and TEST7 must still be transmitted on the N side of semiconductor chip 10 to the internal circuits 410, 116 and 120. The number of setting signals transmitted on the N side is not smaller than the number of three encoded signal lines 13j, 13k and 13m (equal in the present embodiment). Therefore, the remaining test mode setting signals TEST4, TEST6N and TEST7 are transmitted in encoded form through encoded signal lines 13j, 13k and 13m near to the N side internal circuits 410, 116 and 120 of the semiconductor chip. For this purpose, the local test mode decode circuit 1626d is provided nearer to the internal circuitry 410, 116 and 120 than to the local test mode decode circuit 1626c.

As described above, the similar effects as in the DRAMs of the first and second embodiments can be obtained in the DRAM in accordance with the third embodiment.

Further in the DRAM in accordance with the third embodiment, even when the test mode setting signals TEST1, TEST2, TEST3 and TEST4 are decoded near the center of semiconductor chip 10 by local test mode decode circuit 1626c, remaining three test mode setting signals TEST4, TEST6N and TEST7 are transmitted to the N side of the semiconductor chip through three encoded signal lines 13j, 13k and 13m, and local test mode decode circuit 1626d is provided at a position nearer to the internal circuit 410, 116 and 120 corresponding to test mode setting signals TEST4, TEST6N and TEST7 than to the local test mode decode circuit 1626c, whereby increase in line area can be suppressed.

Fourth Embodiment

The DRAM in accordance with a fourth embodiment of the present invention will be described with reference to FIGS. 27 and 28. The DRAM of the fourth embodiment differs from the DRAM of the third embodiment in that (1) the test mode decode circuitry 1626 in test mode setting signal generating circuit 1620 of test mode setting circuit 1600 has a different structure, (2) layout on the chip is different because of the structural difference and (3) the position of internal circuit 1150 receiving the test mode setting signal TEST3 on the layout is different. The differences will be described.

Figure 27:
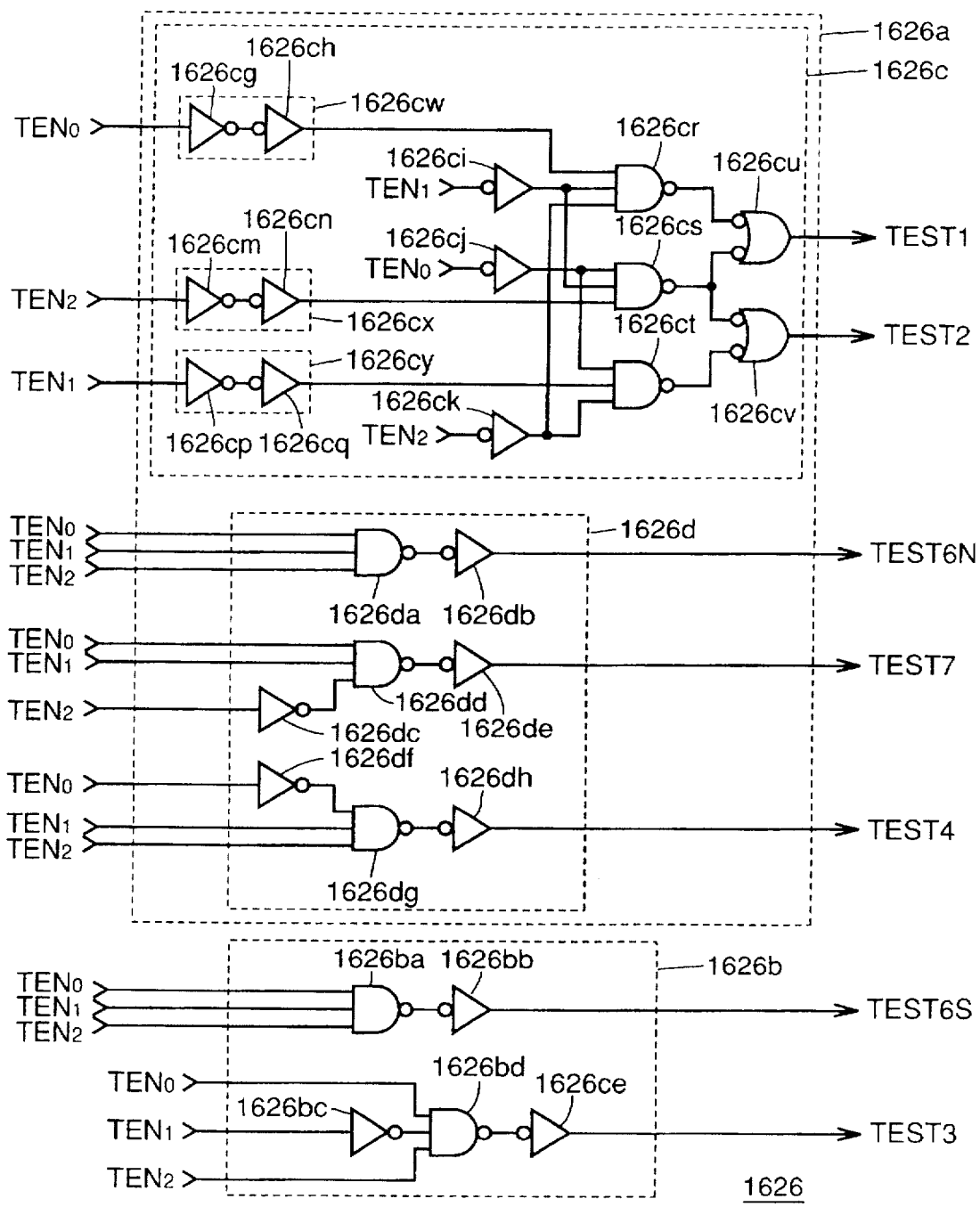
FIG. 27 is a schematic diagram of test mode decode circuitry in the test mode setting signal generating circuit of the DRAM in accordance with a fourth embodiment of the present invention.

FIG. 27 is a diagram schematically showing the structure test mode decode circuitry 1626 in test mode setting signal generating circuit 1620 of test mode setting circuit 1600 of the DRAM in accordance with the fourth embodiment. The test mode decode circuitry 1626 differs from the test mode decode circuitry 1626 of the third embodiment shown in FIG. 25 in that inverter 1626ca, NAND circuit 1626cb and inverter 1626cc generating test mode setting signal TEST3 in local test mode decode circuit 1626c of test mode decode circuit 1626a are eliminated, and that inverter 1626bc, NAND circuit 1626bd and inverter 1626be for generating test mode setting signal TEST3 are provided in local test mode decode circuit 1626b. Namely, test mode setting signal TEST3 is generated from local test mode decode circuit 1626b.

Figure 28:
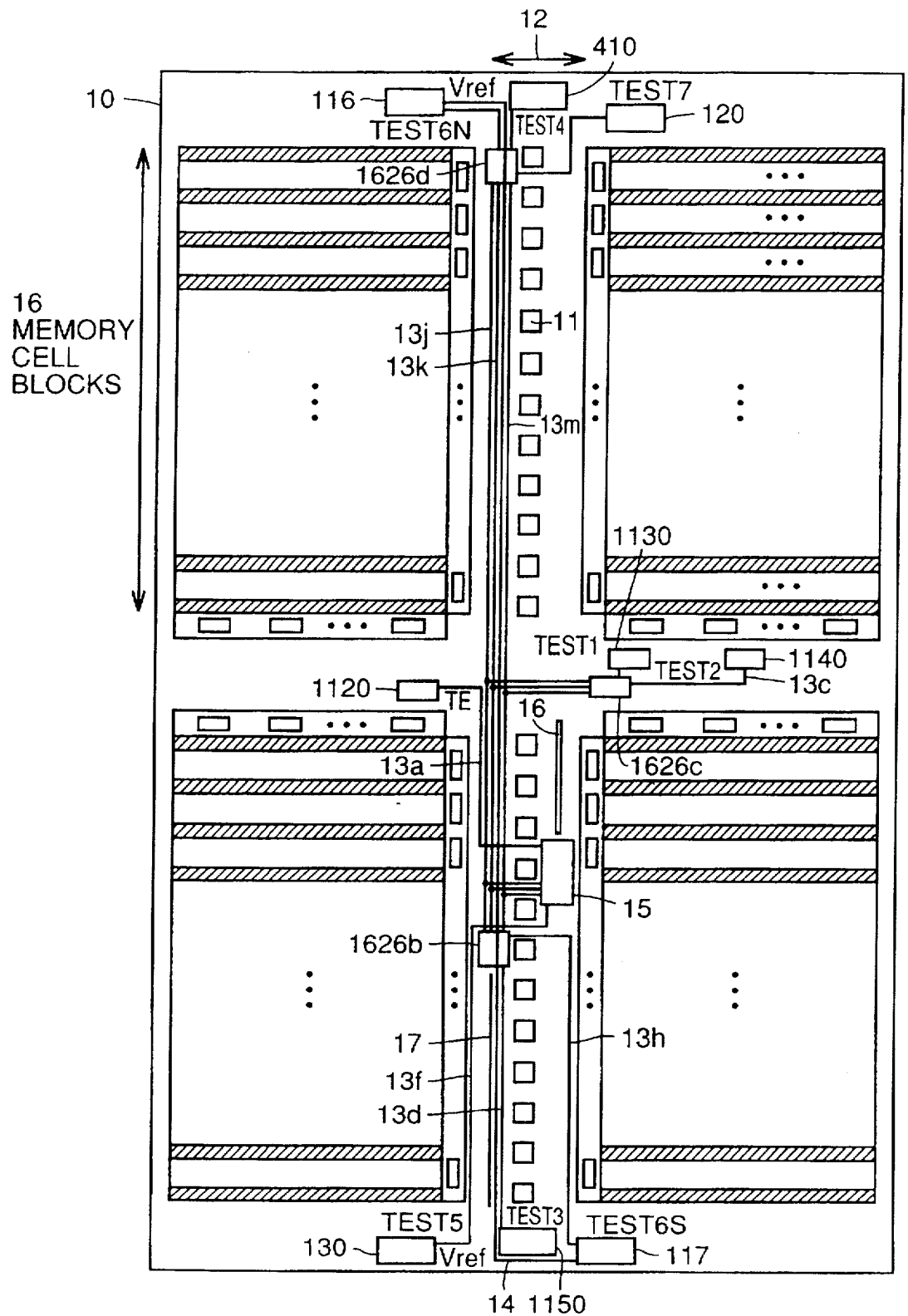
FIG. 28 is a simplified plan view of a semiconductor chip on which the DRAM in accordance with the fourth embodiment of the present invention is formed.
Figure 29:
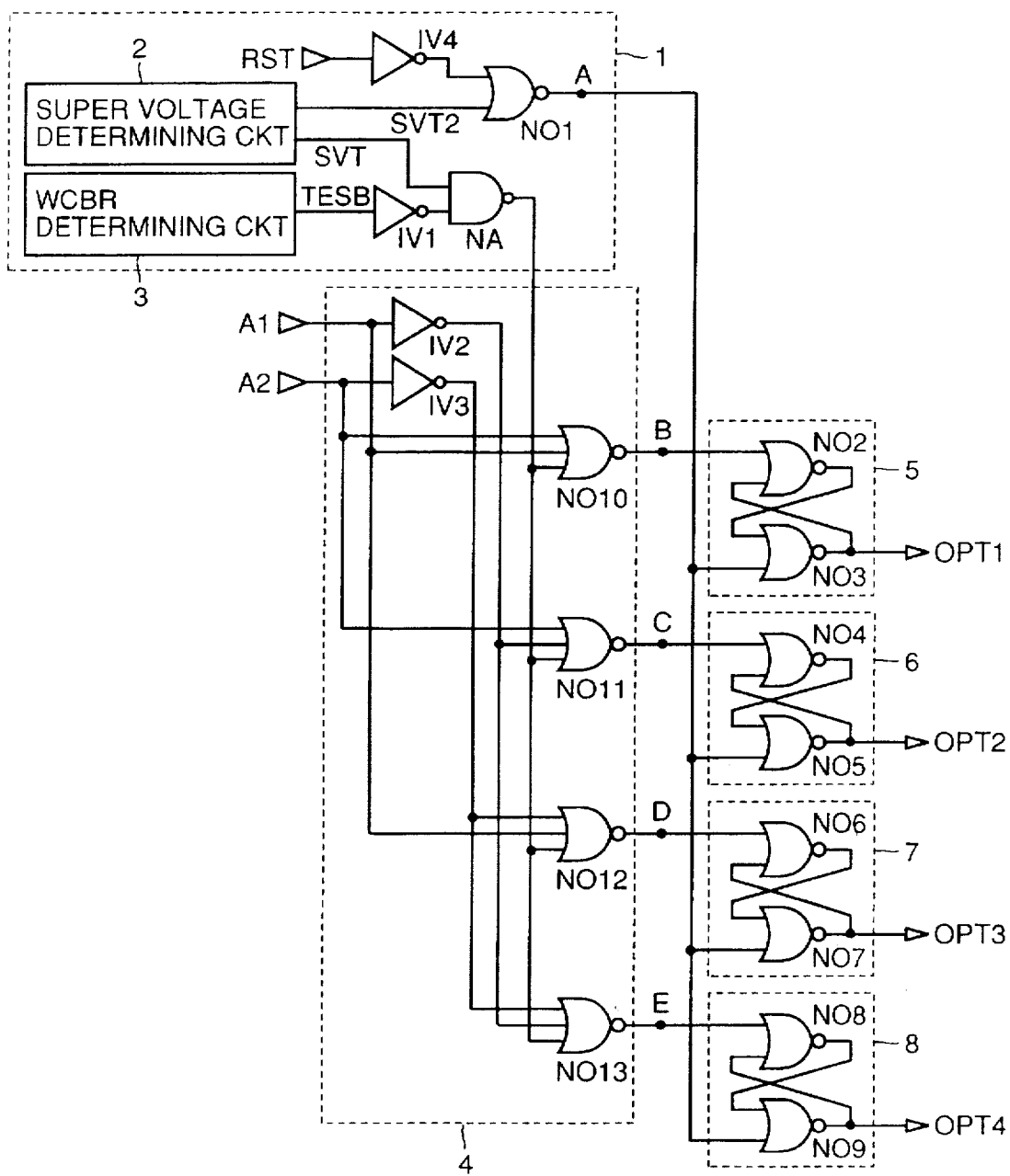
FIG. 29 is a schematic diagram of a conventional test mode setting circuit.

FIG. 28 is a plan view showing a schematic layout on the semiconductor chip of the DRAM in accordance with the fourth embodiment. Referring to FIG. 28, it differs from the plan view of the DRAM in accordance with the third embodiment shown in FIG. 26 in (1) that the test circuit 15 is moved to the right side of the FIG. 28 of central band 12, (2) that the test mode decode circuit 1626b is not included in test circuit 15 but a test mode decode circuit 1626b having different circuit structure is provided separate from test circuit 15, (3) that internal circuitry 1150 receiving test mode setting circuit TEST3 is moved to an end portion on the S side of semiconductor chip 10, (4) that the local test mode decode circuit 1626c which comes to have different circuit structure accordingly, does not output the test mode setting signal TEST3 but local test mode decode circuit 1626b which comes to have different circuit structure and separated from test circuit 15 outputs the test mode setting signal TEST3, and (5) that in the S side portion of test mode decode circuit 1626b, the reference potential line 14 transmitting the reference potential Vref is not adjacent to, parallel to and sandwiched by test mode setting signal lines 13f and 13h as shown in FIG. 26, but adjacent to, parallel to and sandwiched by test mode setting signal line 13d and power supply line 17 transmitting internal power supply potential intVcc or the ground potential GND and shielded thereby. The local test mode decode circuit 1626b is arranged on the S side portion with respect to the test circuit 15.

Where two test mode setting signals TEST3 and TEST6S are to be transmitted to internal circuits 1150 and 117 arranged on the S side of semiconductor chip 10, when these signals are encoded and transmitted through three encoded signal lines 13j, 13k and 13m, the area of lines would be increased. Therefore, the test mode decode circuit 1626b is provided at a portion nearer to the test circuit including encode signal generating circuit 1625 than to the internal circuits 1150 and 117, to decode the signals earlier, and the test mode setting signals TEST3 and TEST6S are transmitted through two test mode setting signal lines 13b and 13h.

As described above, similar effects as in the DRAM of the third embodiment can be obtained by the DRAM in accordance with the fourth embodiment. Further, since the test mode decode circuit 1626b is provided nearer to the test circuit 15 than to internal circuits 1150 and 117, increase in area occupied by the lines for transmitting test mode setting signals TEST3 and TEST6S can be suppressed.

Though the row decoder is arranged at the central band in the first to fourth embodiments, the object of the present invention can be attained even when it is arranged opposite to the central band. Though test mode setting circuit is arranged beside the pad, it may be arranged between the pads.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   state detecting circuit receiving a first input signal of at least one signal, for outputting a state detection signal of at least 1 signal in accordance with a state of the first input signal; and
   a test mode setting signal generating circuit receiving said state detection signal and a second input signal of at least one signal, (i) for outputting (a) a first test mode setting signal which is set to an activated level to set a multibit test when the state detection signal indicates that the first input signal is at a first state, and (b) a second test mode setting signal which is set to an activated level in response to said second input signal of at least one signal when said state detection signal indicates that the first input signal is at a second state different from said first state, and (ii) for setting said first test mode setting signal and said second test mode setting signal both concurrently to an activated level when said state detection signal indicates that the first input signal is at said second state and the second input signal is at a third state.

2. The semiconductor device according to claim 1, wherein said first input signal includes a first signal, a second signal and a plurality of control signals; and said state detection circuit includes means for setting said state detection signal to a state indicating that said first input signal is at said second state, when said plurality of control signals are input along a prescribed timing, said first signal is at a super H level higher than a normally used H level and said second signal is at the normally used H level.

3. The semiconductor device according to claim 2, wherein said state detecting circuit includes a super H level detecting circuit having a pull up circuit connected between a first signal node receiving said first signal and a super H level detection signal output node at which a super H level detection signal is output, for applying an H level potential to said super H level detection signal output node when said first signal is at the super H level, and a state detection signal generating circuit for outputting a state detection signal in accordance with said control signals, said super H level detection signal and said second signal; and said second input signal includes a plurality of signals having normally used H level and L level.

4. The semiconductor device according to claim 1, wherein said first input signal includes a plurality of control signals and auxiliary signals; and said state detecting circuit includes a timing detecting circuit for outputting a timing detection signal which is set to an active level when said plurality of control signals are input along a timing along which said first input signal is determined to be at the second state, a detection assisting circuit for outputting a detection assisting signal in accordance with said assisting signal, and a state detection signal control circuit receiving said timing detection signal and said detection assisting signal for outputting a state detection signal such that said state detection signal is set to a state indicating that the first input signal is at the second state when said detection assisting signal indicates that said first input signal is at said second state and said timing detection signal is at the active level.

5. A semiconductor device, comprising:

an encoded signal generating circuit provided on a semiconductor chip for outputting a plurality of test mode encoded signals in accordance with a state of an input signal of at least one signal input to the semiconductor chip;

a plurality of encoded signal lines provided on said semiconductor chip and transmitting corresponding test mode encoded signals from said encoded signal generating circuit, at least a part of which extends in a first direction;

a test mode decode circuit provided on a side of said first direction relative to said encoded signal generating circuit on said semiconductor chip and, receiving test mode encoded signals through said plurality of encoded signal lines, for outputting a plurality of test mode setting signals in accordance with said test mode encoded signals, which are the same as or larger in number than the test mode encoded signals; and a plurality of internal circuits provided on the side of said first direction relative to said encoded signal generating circuit on said semiconductor chip, receiving corresponding test mode setting signals from said test mode decode circuit for performing prescribed test operations in accordance with received test mode setting signals.

6. The semiconductor device according to claim 5, further comprising:

a plurality of pads arranged along a direction of one side of a semiconductor chip in a chip central band positioned at a central portion along another side adjacent to said another side of the semiconductor chip and extending in a direction of the one side; wherein said encoded signal lines are provided on said chip central band.

7. The semiconductor device according to claim 5, wherein said input signal includes first and second input signals, and wherein said semiconductor device further comprises:

a state detecting circuit receiving said first input signal and outputting a state detecting signal in accordance with a state of the first input signal; and an input decoder receiving said state detection signal, (1) for outputting a multibit test mode setting signal which is set to an active level when the state detection signal indicates that said first input signal is at a first state, (2) for applying an input decode signal in accordance with said second input signal to the encode signal generating circuit to set at least one of test mode setting signals output from said test mode decode circuit when said state detection signal indicates that said first input signal is at a second state different from said first state, and (3) for setting said multibit test mode setting signal to an active level and setting at least one of the test mode setting signals output from said test mode decode circuit to the active level by applying an input decode signal in accordance with the second input signal to said encode signal generating circuit, when said state detection signal indicates that said first input signal is at said second state and said second input signal is at a third state.

8. The semiconductor device according to claim 5, further comprising:

an input decoder outputting a first test mode setting signal and an input decode signal in accordance with said input signal of at least one signal, applying the input decode signal to said encoded signal generating circuit, for activating said first test mode setting signal and at least one of test mode setting signals output from said test mode decode circuit when said input signal is at a prescribed state.

9. The semiconductor device according to claim 5, wherein said test mode decode circuit includes a first local test mode decode circuit receiving test mode encoded signals from a plurality of encoded signal lines for outputting a test mode setting signal in accordance with the test mode encoded signals; and a second local test mode decode circuit receiving the test mode encoded signals from said plurality of encoded signal lines, outputting test mode setting signals smaller in number than said encoded signal lines in accordance with the test mode encoded signals, provided nearer to said first local test mode decode circuit relative to an internal circuit corresponding to the test mode setting signals.

10. The semiconductor device according to claim 5, wherein said test mode decode circuit includes a first local test mode decode circuit receiving test mode encoded signals from a plurality of encoded signal lines, for outputting a test mode setting signal in accordance with the test mode encoded signals, and a second local test mode decode circuit receiving test mode encoded signals from said plurality of encoded signals lines for outputting test mode setting signals larger in number than said encoded signal lines in accordance with the test mode encoded signals, provided nearer to an internal circuit corresponding to the test mode setting signal than to said first local test mode decode circuit.

11. A semiconductor device, comprising:

a test mode clock generating circuit receiving an input signal and outputting a test mode clock in accordance with the input signal;

at least one test mode clock line for transmitting said test mode clock; and a signal line formed in a same level of interconnection line as said test mode clock line, at least a part of which is provided adjacent to and parallel to said test mode clock line.

12. The semiconductor device according to claim 11, wherein said at least one test mode clock line includes a plurality of test mode clock lines, and at least a part of said signal line is provided adjacent to, parallel to and sandwiched by the test mode clock lines.

13. A semiconductor memory device including a memory array having a plurality of memory cells and operable in a multibit test mode in which a plurality of memory cells are tested, comprising:

test mode setting circuit coupled to receive a multi-signal external signal and responsive to a first predetermined combination of states of signals of said multi-signal external signal for generating a first test mode setting signal instructing said multibit test mode, and responsive to a second predetermined combination of states of signals of said multi-signal external signal for generating said first test mode setting signal and a second test mode setting signal, instructing a test mode other than said multibit test mode, at a same time.

14. The semiconductor memory device according to claim 13, wherein said test mode setting circuit includes a timing detector responsive to a first set of signals of said multi-signal external signal for detecting that said first set of signals is applied along a predetermined timing relationship, a test group detector responsive to a second set of signals of said multi-signal external signal in predetermined states and to said timing detector detecting that said first set of signals is applied along the predetermined timing relationship for generating a test group designating signal designating a test other than the multibit test in accordance with said second set of signals, and test mode setting signal generator coupled to receive said test group designating signal and a third set of signals of said multi-signal external signal and coupled to be responsive to said timing detector for generating said first and second test mode setting signals in accordance with said third set of signals and said test group designating signal and responsive to said timing detector detecting that said first set of signals is applied along the predetermined timing relationship.

15. The semiconductor memory device according to claim 14, wherein said test group detector includes level detecting means coupled to receive said second set of signals for detecting that a first signal of said second set of signals is at a normal high level and a second signal of said second set of signals is at a super high level higher in potential than said normal high level, and means activated responsive to said timing detector detecting that said first set of signals is applied along the predetermined timing relationship for generating said test group designating signal in accordance with said first signal at said normal high level and said second signal at said super high level detected by said level detecting means.

16. The semiconductor memory device according to claim 14, wherein said test mode setting signal generator includes latch circuit responsive to said timing detector detecting that said first set of signals is applied along said predetermined relationship for latching said third set of signals, predecoder coupled to said latch circuit for predecoding at least a part of said third set of signals latched by said latch circuit to generate a multibit predecode signal, and decoder/buffer responsive to said timing detector detecting that said first set of signals is applied along the predetermined relationship for being activated to decode the multibit predecode signal to generate said second test mode setting signal.

17. The semiconductor memory device according to claim 16, wherein said predecoder includes a predecode/buffer coupled to receive a predetermined signal of said third set of signals and activated responsive to said timing detector for buffering the predetermined signal to generate said first test mode setting signal.

18. The semiconductor memory device according to claim 16, wherein decoder/buffer comprises, a decoder coupled to said predecoder for decoding the predecoded signal received from said predecoder to output decode signals, an encode signal generator coupled to said decoder for encoding the decoded signals received from said decoder to generate an encoded signal, local decoder coupled to receive said encoded signal for generating said second test mode setting signal.

19. The semiconductor memory device according to claim 13, wherein a line for transmitting said second test mode signal line is arranged in parallel and adjacent to a reference potential line transmitting a reference potential.

20. The semiconductor memory device according to claim 18, wherein a line for transmitting said encoded signal is arranged adjacent to and parallel to a reference potential line transmitting a reference potential.

* * * * *